United States Patent
Beckman

(10) Patent No.: US 12,181,351 B2
(45) Date of Patent: Dec. 31, 2024

(54) THERMOPILE ASSEMBLY PROVIDING A MASSIVE ELECTRICAL SERIES OF WIRE THERMOCOUPLE ELEMENTS

(71) Applicant: Arthur Beckman, Washington, DC (US)

(72) Inventor: Arthur Beckman, Washington, DC (US)

( * ) Notice: Subject to any disclaimer, the term of this patent is extended or adjusted under 35 U.S.C. 154(b) by 626 days.

(21) Appl. No.: 16/790,366

(22) Filed: Feb. 13, 2020

(65) Prior Publication Data

US 2020/0256742 A1    Aug. 13, 2020

Related U.S. Application Data

(63) Continuation-in-part of application No. 16/288,081, filed on Feb. 27, 2019.
(Continued)

(51) Int. Cl.
*G01K 7/02* (2021.01)
*G01J 5/12* (2006.01)
(Continued)

(52) U.S. Cl.
CPC .................. *G01K 7/02* (2013.01); *G01J 5/12* (2013.01); *H10N 10/01* (2023.02); *H10N 10/81* (2023.02); *H10N 10/85* (2023.02); *H10N 10/854* (2023.02)

(58) Field of Classification Search
None
See application file for complete search history.

(56) References Cited

U.S. PATENT DOCUMENTS

| 548,038 A | 10/1895 | Cox |
| 813,682 A | 2/1906 | Wilderman et al. |
(Continued)

FOREIGN PATENT DOCUMENTS

| CN | 104788081 A | 7/2015 |
| EP | 3 179 526 | 6/2017 |
(Continued)

OTHER PUBLICATIONS

Author Unknown, "Aluminum Oxide, Al2O3 Ceramic Properties" accessed at https://accuratus.com/alumox.html on Apr. 8, 2022, and archived to at least Mar. 7, 2016. (Year: 2016).*
(Continued)

*Primary Examiner* — Eli S Mekhlin
(74) *Attorney, Agent, or Firm* — Aldo Noto, Esq.; RIMON PC

(57) ABSTRACT

Devices and methods are provided for the low-cost manufacturing of thermoelectric power-generation devices (thermopiles) using stable, common materials that can function at very high temperatures. An improved geometry for thermocouple elements in the assembly provides for incorporating a large number of thermocouples. The geometry includes holes and cross-channels in an electrically-insulative device body comprising a material such as a ceramic or glass whereby wires may be deposited and the device heated to sinter or melt deposited junction-forming materials connecting the wires to form a thermopile. These device geometries and manufacturing procedures enable the low-cost production of thermopiles comprised of a massive number of thermocouple elements, from hundreds to hundreds of thousands or more, for electrical power generation using common, standard metallic thermocouple materials and common, widely used electrical insulation materials.

20 Claims, 34 Drawing Sheets

Related U.S. Application Data

(60) Provisional application No. 62/805,285, filed on Feb. 13, 2019, provisional application No. 62/767,720, filed on Nov. 15, 2018, provisional application No. 62/646,582, filed on Mar. 22, 2018, provisional application No. 62/636,253, filed on Feb. 28, 2018.

(51) Int. Cl.
*H10N 10/01* (2023.01)
*H10N 10/81* (2023.01)
*H10N 10/85* (2023.01)
*H10N 10/854* (2023.01)

(56) References Cited

U.S. PATENT DOCUMENTS

| | | |
|---|---|---|
| 1,526,641 A | 2/1925 | Mulvaney et al. |
| 1,715,316 A | 5/1929 | Thwing |
| 1,848,655 A | 3/1932 | Petrik |
| 2,289,152 A | 7/1942 | Telkes |
| 2,317,168 A | 4/1943 | Ball |
| 2,330,018 A | 9/1943 | van Wert |
| 2,490,196 A | 12/1949 | Beach |
| 2,526,492 A | 10/1950 | Liston et al. |
| 2,538,642 A | 1/1951 | Gardiner et al. |
| 2,677,712 A | 5/1954 | Biggle |
| 2,728,693 A | 12/1955 | Cado |
| 2,744,011 A | 5/1956 | Samuel et al. |
| 2,768,133 A | 10/1956 | Lundbye |
| 2,790,021 A | 4/1957 | Fritts et al. |
| 2,877,283 A | 3/1959 | Justi |
| 2,952,980 A | 9/1960 | Douglas |
| 2,972,653 A | 2/1961 | Fritts et al. |
| 2,997,514 A | 8/1961 | Roeder |
| 3,000,092 A | 9/1961 | Scuro |
| 3,036,139 A | 5/1962 | Feduska et al. |
| 3,054,840 A | 9/1962 | Alsing |
| 3,069,752 A | 12/1962 | Sherning |
| 3,071,463 A | 1/1963 | Hausner et al. |
| 3,082,277 A | 3/1963 | Lane et al. |
| 3,086,068 A | 4/1963 | Charland et al. |
| 3,129,117 A | 4/1964 | Harding et al. |
| 3,137,593 A | 6/1964 | Birkholz |
| 3,165,426 A | 1/1965 | Beckman |
| 3,201,504 A | 8/1965 | Stevens |
| 3,248,777 A | 5/1966 | Stoll |
| 3,256,699 A | 6/1966 | Henderson |
| 3,264,714 A | 8/1966 | Baer |
| 3,269,871 A | 8/1966 | Kilp et al. |
| 3,335,043 A | 8/1967 | Joerren et al. |
| 3,357,866 A | 12/1967 | Belofsky |
| 3,359,097 A | 12/1967 | Beaver |
| 3,382,109 A | 5/1968 | Kendall et al. |
| 3,388,008 A | 6/1968 | Campana et al. |
| 3,470,033 A | 9/1969 | Oesterhelt et al. |
| 3,502,466 A | 3/1970 | Vickery |
| 3,547,706 A | 12/1970 | McGrew |
| 3,607,446 A | 9/1971 | Sugarman et al. |
| 3,653,976 A | 4/1972 | Miller |
| 3,661,653 A | 5/1972 | Purdy et al. |
| 3,671,327 A | 6/1972 | Gay |
| 3,738,873 A | 6/1973 | Cathey |
| 3,775,218 A | 11/1973 | Hare |
| 3,783,155 A | 1/1974 | Frock |
| 3,787,958 A | 1/1974 | Freedman et al. |
| 3,842,489 A | 10/1974 | Bustard |
| 3,874,935 A | 4/1975 | Goslee et al. |
| 3,879,838 A | 4/1975 | Miller |
| 3,885,992 A | 5/1975 | Wilcox |
| 3,900,603 A | 8/1975 | Rittmayer et al. |
| 3,923,551 A | 12/1975 | Purdy |
| 3,923,552 A | 12/1975 | Parris |
| 3,951,692 A | 4/1976 | Hittman et al. |
| 3,955,419 A | 5/1976 | Barton et al. |
| 3,971,657 A | 7/1976 | Daver |
| 3,981,750 A | 9/1976 | Purdy |
| 3,984,258 A | 10/1976 | Goslee |
| 3,992,229 A | 11/1976 | Hall, Jr. |
| 4,001,045 A | 1/1977 | Smith |
| 4,006,039 A | 2/1977 | Purdy |
| 4,032,363 A | 6/1977 | Raag |
| 4,054,478 A | 10/1977 | Linnon |
| 4,073,665 A | 2/1978 | Barr |
| 4,092,177 A | 5/1978 | Ray |
| 4,161,111 A | 7/1979 | Hampl |
| 4,162,369 A | 7/1979 | Brown |
| 4,211,889 A | 7/1980 | Kortier et al. |
| 4,251,290 A | 2/1981 | Gomez |
| 4,251,291 A | 2/1981 | Gomez |
| 4,253,515 A | 5/1981 | Swiatosz |
| 4,324,945 A | 4/1982 | Sivyer |
| 4,343,960 A | 8/1982 | Eguchi et al. |
| 4,368,416 A | 1/1983 | James |
| 4,376,227 A | 3/1983 | Hilborn |
| 4,419,652 A | 12/1983 | Balmforth et al. |
| 4,440,717 A | 4/1984 | Bevliacqua et al. |
| 4,444,991 A | 4/1984 | Beale |
| 4,460,802 A | 7/1984 | Benedict et al. |
| 4,463,214 A | 7/1984 | Lowther |
| 4,465,894 A | 8/1984 | Reyes |
| 4,493,939 A | 1/1985 | Blaske et al. |
| 4,520,305 A | 5/1985 | Cauchy |
| 4,569,822 A | 2/1986 | Brown |
| 4,611,089 A | 9/1986 | Elsner |
| 4,639,542 A | 1/1987 | Bass et al. |
| 4,640,977 A | 2/1987 | Shakun |
| 4,651,019 A | 3/1987 | Gilbert et al. |
| 4,681,981 A | 7/1987 | Brotz |
| 4,687,879 A | 8/1987 | Hendricks |
| 4,717,788 A | 1/1988 | Rauch, Sr. et al. |
| 4,734,139 A | 3/1988 | Shakun et al. |
| 4,963,195 A | 10/1990 | Kodato et al. |
| 5,022,928 A | 6/1991 | Buist |
| 5,033,866 A | 7/1991 | Kehl et al. |
| 5,065,085 A | 11/1991 | Aspden et al. |
| 5,102,470 A | 4/1992 | Kodato et al. |
| 5,103,286 A | 4/1992 | Ohta et al. |
| 5,156,688 A | 10/1992 | Buhler et al. |
| 5,180,226 A | 1/1993 | Moslehi |
| 5,228,923 A | 7/1993 | Hed |
| 5,262,122 A | 11/1993 | Wiech |
| 5,275,001 A | 1/1994 | Yokotani et al. |
| 5,275,670 A | 1/1994 | Smialek et al. |
| 5,286,304 A | 2/1994 | Macris et al. |
| 5,288,336 A | 2/1994 | Strachan et al. |
| 5,313,831 A | 5/1994 | Beckman |
| 5,328,775 A | 7/1994 | Hoshino et al. |
| 5,393,350 A | 2/1995 | Schroeder |
| 5,411,600 A | 5/1995 | Rimai et al. |
| 5,434,744 A | 7/1995 | Fritz et al. |
| 5,464,485 A | 11/1995 | Hall, Jr. |
| 5,554,819 A | 9/1996 | Baghai-Kermani |
| 5,563,368 A | 10/1996 | Yamaguchi |
| 5,597,976 A | 1/1997 | Schroeder |
| 5,696,348 A | 12/1997 | Kawamura et al. |
| 5,722,249 A | 3/1998 | Miller, Jr. |
| 5,734,122 A | 3/1998 | Aspden et al. |
| 5,747,418 A | 5/1998 | Metzger et al. |
| 5,793,119 A | 8/1998 | Zinke |
| 5,824,947 A | 10/1998 | Macris |
| 5,909,004 A | 6/1999 | Hedengren et al. |
| 5,997,803 A | 12/1999 | Hall |
| 6,025,554 A | 2/2000 | Macris |
| 6,029,620 A | 2/2000 | Zinke |
| 6,046,398 A | 4/2000 | Foote et al. |
| 6,093,338 A | 7/2000 | Tani et al. |
| 6,100,463 A | 8/2000 | Ladd et al. |
| 6,297,441 B1 | 10/2001 | Macris |
| 6,300,554 B1 | 10/2001 | Du et al. |
| 6,326,541 B1 | 12/2001 | Goheen |
| 6,348,650 B1 | 2/2002 | Endo et al. |
| 6,388,185 B1 | 5/2002 | Fleurial et al. |
| 6,502,405 B1 | 1/2003 | Van Winkle |
| 6,511,860 B1 | 1/2003 | Boer et al. |

(56) References Cited

U.S. PATENT DOCUMENTS

| | | |
|---|---|---|
| 6,581,388 B2 | 6/2003 | Novotny |
| 6,762,484 B2 | 7/2004 | Span |
| 6,787,691 B2 | 9/2004 | Fleurial et al. |
| 6,942,728 B2 | 9/2005 | Caillat et al. |
| 6,951,989 B2 | 10/2005 | Nufer et al. |
| 7,018,200 B2 | 3/2006 | Querejeta et al. |
| 7,166,796 B2 | 1/2007 | Nicoloau |
| 7,222,489 B2 | 5/2007 | Pastorino |
| 7,312,690 B1 | 12/2007 | Geer |
| 7,439,629 B2 | 10/2008 | Fouti-Makaya |
| 7,556,869 B2 | 7/2009 | Fukushima et al. |
| 7,626,114 B2 | 12/2009 | Stark |
| 7,642,115 B2 | 1/2010 | Eriksen et al. |
| 7,709,766 B2 | 5/2010 | Gambino et al. |
| 7,723,606 B2 | 5/2010 | Fiorini et al. |
| 7,838,760 B2 | 11/2010 | Venkatasubramanian et al. |
| 7,842,922 B2 | 11/2010 | Leneke et al. |
| 7,851,691 B2 | 12/2010 | DeSteese et al. |
| 7,871,847 B2 | 1/2011 | Moczygemba |
| 7,875,791 B2 | 1/2011 | Leonov et al. |
| 8,174,245 B2 | 5/2012 | Carver |
| 8,307,663 B2 | 11/2012 | Akei et al. |
| 8,388,883 B2 | 3/2013 | Stefan et al. |
| 8,487,177 B2 | 7/2013 | Pingree |
| 8,546,680 B2 | 10/2013 | Hsu |
| 8,561,416 B2 | 10/2013 | He et al. |
| 8,581,089 B2 | 11/2013 | Teunissen et al. |
| 8,633,371 B2 | 1/2014 | McCullough |
| 8,841,540 B2 | 9/2014 | Moczygemba et al. |
| 8,853,814 B2 | 10/2014 | Xu et al. |
| 8,921,683 B2 | 12/2014 | Hu |
| 8,921,792 B2 | 12/2014 | Quad et al. |
| 8,975,503 B2 | 3/2015 | Mitchell et al. |
| 9,028,137 B2 | 5/2015 | Sjölund et al. |
| 9,065,017 B2 | 6/2015 | Reifenberg et al. |
| 9,080,965 B2 | 7/2015 | Elliott |
| 9,112,107 B2 | 8/2015 | Bisges |
| 9,190,596 B2 | 11/2015 | Xu et al. |
| 9,209,376 B2 | 12/2015 | Azzouz et al. |
| 9,214,618 B2 | 12/2015 | Arnold et al. |
| 9,281,461 B2 | 3/2016 | Olsen et al. |
| 9,299,906 B2 | 3/2016 | Simonin |
| 9,343,646 B2 | 5/2016 | Bartl et al. |
| 9,349,934 B2 | 5/2016 | Gille et al. |
| 9,353,445 B2 | 5/2016 | Petkie |
| 9,407,163 B2 | 8/2016 | Nakatsu et al. |
| 9,423,161 B2 | 8/2016 | Ludwig |
| 9,461,232 B2 | 10/2016 | Kono et al. |
| 9,494,471 B2 | 11/2016 | Greenfield et al. |
| 9,515,244 B2 | 12/2016 | Narducci et al. |
| 9,530,952 B2 | 12/2016 | Stenner et al. |
| 9,540,960 B2 | 1/2017 | Chauvin |
| 9,543,492 B2 | 1/2017 | Gotsmann et al. |
| 9,543,493 B2 | 1/2017 | Carberry |
| 9,553,249 B2 | 1/2017 | Busse |
| 9,564,570 B2 | 2/2017 | Limbeck et al. |
| 9,577,173 B2 | 2/2017 | Porod et al. |
| 9,601,678 B2 | 3/2017 | Cho |
| 9,601,679 B2 | 3/2017 | Tohei et al. |
| 9,606,008 B2 | 3/2017 | Liversage |
| 9,608,188 B2 | 3/2017 | Reifenberg et al. |
| 9,660,168 B2 | 5/2017 | Hall et al. |
| 9,680,080 B2 | 6/2017 | Pal |
| 9,705,062 B2 | 6/2017 | Salvador et al. |
| 9,722,165 B2 | 8/2017 | Carr |
| 9,728,704 B2 | 8/2017 | Himmer |
| 9,735,334 B1 | 8/2017 | Kwak et al. |
| 9,755,130 B2 | 9/2017 | Kruiskamp |
| 9,767,934 B2 | 9/2017 | Hyde et al. |
| 9,759,613 B2 | 10/2017 | Kimura et al. |
| 9,786,829 B2 | 10/2017 | Grande et al. |
| 9,793,460 B2 | 10/2017 | Toyoda et al. |
| 9,793,462 B2 | 10/2017 | Kaibe et al. |
| 9,837,593 B2 | 12/2017 | Sawa |
| 9,851,258 B2 | 12/2017 | Pei et al. |
| 9,853,086 B2 | 12/2017 | Edwards et al. |
| 9,865,794 B2 | 1/2018 | Jovovic et al. |
| 9,882,111 B2 | 1/2018 | Cauchon et al. |
| 9,887,341 B2 | 2/2018 | Watanabe et al. |
| 9,891,024 B2 | 2/2018 | Sjölund et al. |
| 9,917,239 B2 | 3/2018 | Kouma et al. |
| 9,920,930 B2 | 3/2018 | Heil et al. |
| 9,929,331 B2 | 3/2018 | Otey et al. |
| 9,941,457 B2 | 4/2018 | Kusada et al. |
| 9,954,155 B2 | 4/2018 | Park et al. |
| 9,927,303 B2 | 5/2018 | Yoshida et al. |
| 9,964,454 B2 | 5/2018 | Danley |
| 9,991,436 B2 | 6/2018 | Kirihara et al. |
| 10,003,003 B2 | 6/2018 | Suda et al. |
| 10,006,815 B2 | 6/2018 | Hedayat |
| 10,026,886 B2 | 7/2018 | Moczygemba |
| 10,054,341 B2 | 8/2018 | Otey et al. |
| 10,062,826 B2 | 8/2018 | Casey |
| 10,103,312 B2 | 10/2018 | Suto et al. |
| 10,115,882 B2 | 10/2018 | Hayashi |
| 10,139,286 B2 | 11/2018 | Noli |
| 10,147,859 B2 | 12/2018 | Fujimoto et al. |
| 10,158,058 B2 | 12/2018 | Uchiyama et al. |
| 10,158,060 B2 | 12/2018 | Hazama et al. |
| 10,170,677 B2 | 1/2019 | Kanno et al. |
| 2002/0024154 A1* | 2/2002 | Hara .............. H01L 23/38 |
| | | 257/712 |
| 2007/0119495 A1 | 5/2007 | Sumrall |
| 2007/0151591 A1 | 7/2007 | Jeffryes |
| 2009/0205694 A1 | 8/2009 | Huettner et al. |
| 2011/0020164 A1 | 1/2011 | Stefan et al. |
| 2011/0067742 A1 | 3/2011 | Bell et al. |
| 2011/0083713 A1* | 4/2011 | Narducci .............. H01L 35/32 |
| | | 136/230 |
| 2011/0114146 A1 | 5/2011 | Scullin |
| 2011/0277803 A1 | 11/2011 | Grande et al. |
| 2013/0081666 A1* | 4/2013 | Yoon .............. H10N 10/17 |
| | | 136/205 |
| 2013/0284228 A1* | 10/2013 | Toyoda .............. H01L 35/04 |
| | | 438/54 |
| 2013/0305479 A1 | 11/2013 | Kim et al. |
| 2014/0026934 A1 | 1/2014 | Xu et al. |
| 2014/0182644 A1 | 7/2014 | Aguirre |
| 2015/0047685 A1 | 2/2015 | Stenner et al. |
| 2015/0188019 A1 | 7/2015 | Corrado |
| 2016/0035956 A1 | 2/2016 | Carroll et al. |
| 2017/0062690 A1 | 3/2017 | Lorimer et al. |
| 2017/0098748 A1 | 4/2017 | Steutermann |
| 2017/0158563 A1 | 6/2017 | Gruenbichler et al. |
| 2018/0366629 A1 | 12/2018 | Ghoshal et al. |

FOREIGN PATENT DOCUMENTS

| | | |
|---|---|---|
| JP | 2001032003 A | 6/1999 |
| WO | WO 2017/223278 | 12/2017 |

OTHER PUBLICATIONS

PCT/US2019/019919—ISR & Written Opinion mailed May 7, 2019.
PCT/US2020/18151—ISR & Written Opinion mailed May 18, 2020.
PCT/US2019/019919—International Preliminary Report on Patentability and Writtern Opinion of the ISA issued Sep. 1, 2020.
II-VI Marlow. ND. Thermoelectric generator modules (TEG). https://www.marlow.com/products/power-generators/thermoelectric-generator-teg-modules. Jan. 8, 2018.
3Dceram. ND. http://3dceram.com/en/. Feb. 6, 2018.
3Ders. 2017. Optomec improves copper ink performance for Aerosol Jet 3D printed Electronics. http://www.3ders.org/articles/20170503-optomec-improves-copper-ink-performance-for-aerosol-jet-3d-printed-electronics.html. Feb. 14, 2018.
3D Digital. 2017. 2017 3D Printer Catalog. http://3ddigitalcorp.com/wp-content/uploads/2017/04/Optix-3D-Printers-Catalogue-2017.pdf. Jan. 6, 2019.
3Diligent. ND. About 3Diligent. https://www.3diligent.com/about/. Feb. 14, 2018.

(56) References Cited

OTHER PUBLICATIONS

3Diligent. ND. Binder Jetting. http://www.3diligent.com/binder-jetting-service/. Feb. 8, 2018.
3Dpandoras. ND. The first full color 3d printer of powder tech. http://3dpandoras.com/. Feb. 27, 2018.
3dprint.com. 2017. Comparison of Metal 3D Printing—Part Three: Inkjet. Sep. 18. https://3dprint.com/188092/inkjet-metal-3d-printing/. Feb. 8, 2018.
3Dprinterbay. Wanhao Duplicator 8 Mark I, Large format LCD SLA 3D Printer. https://www.3dprintersbay.com/wanhao-duplicator-8-sla-3d-printer?gclid=EAlaIQobChMIjIL97oKH3wlVz1qGCh084Q-IEAkYCCABEgJwUPD_BwE. Dec. 4, 2018.
3dprintpulse.com. 3D-Printed Wonder Ceramics Are Flawless and Super-Strong. Jan. 5. https://www.3dprintpulse.com/ceramic/. Mar. 1, 2018.
3D Systems, Inc. ND. ProX DMP 300. https://www.3dsystems.com/3d-printers/prox-dmp-300. Apr. 4, 2018.
3D Systems, Inc. ND. 3D Systems' Selective Laser Sintering (SLS) 3D Nylon Printers. https://www.3dsystems.com/resources/information-guides/selective-laser-sintering/sls. Feb. 6, 2018.
3D Systems, Inc. 2018. Direct Metal Solutions. https://www.3dsystems.com/sites/default/files/2018-11/3d-systems-dmp-brochure-a5-us-2018-11-07-web.pdf. Apr. 13, 2018.
3D Systems, Inc.. ND. FabPro™ 1000. https://na-shop.3dsystems.com/fabpro-1000/?_ga=2.129512460.1472631524.1544665283-700989223.1544665283&_gac=1.141828614.1544665283.EAlaIQobCh%E2%80%A6. Dec. 12, 2018.
Abbott Furnace Company. ND. Sintering fundamentals. https://www.abbottfurnaceco.com/sintering-fundamentals/. Apr. 10, 2018.
Abdelaziz, E.A., Saidur, R. and Mekhilef, S. 2011. A review on energy saving strategies in industrial sector. Renewable and sustainable energy reviews, 15(1), pp. 150-168. Amsterdam, Netherlands.
Abrams, M. 3D printing for mass production. 2015. ASME Web site. Feb. 2015. http://www.asme.org/engineering-topics/articles/manufacturing-processing/3d-printing-for-mass-production. Jan. 1, 2018.
Adapt Automation, Inc. ND. Single and Multiple Pin Insertion Machine https://adaptautomation.com/machine-archives/single-multiple-pin-insertion-machine/. Jan. 20, 2019.
Adorni, N., Azzoni, A., Germani, G., Lurnachi, A., Marelli, A. and Misani, G., 1968. Test element for critical heat flux, pressure drop, and density measurements: 19 clustered rods, maximum design power 5.5 MW (No. CISE-R--267). Centro Informazioni Studi Esperienze. Milan, Italy.
Aerosint. ND. http:/aerosint.com/home/. Feb. 5, 2018.
Afolabi, M.A. and Ali, M.H., 2016. Design of Thermoelectric Generator from Aluminum and Copper Elements. IOSR Journal of Mechanical and Civil Engineering (IOSR-JMCE) e-ISSN: 2278-1684,p-ISSN: 2320-334X. https://www.researchgate.net/publication/309358070_Design_Of_Thermoelectric_Generator_from_Aluminum_and_Copper_Elements. Jun. 10, 2020.
Aggarwal, R.K. and Markanda, S., 2012. A review on thermocouple for power generation. International Journal of Applied Science and Engineering Research, 1(1), pp. 98-105. New Delhi, India.
Ahn, D. and Choi, K., 2018. Performance Evaluation of Thermoelectric Energy Harvesting System on Operating Rolling Stock. Micromachines, 9(7), p. 359. Basel, Switzerland.
Airburners, Inc. ND. Air Burners Closed Circle Recycling: Overview. https://airburners.com/technology/closed-circle-recycling/. Dec. 16, 2018.
Airburners, Inc. ND. PGF-1000. https://airburners.com/products/pg-firebox/pgf-1000/. Dec. 16, 2018.
Airburners, Inc. ND. S-series Air Curtain Burner spec sheet. Rev. Aug. 2018. https://airburners.net/sales_brochures/firebox_a.pdf. Dec. 16, 2018.
Air Products and Chemicals, Inc. ND. Introduction to furnace brazing. http://www.airproducts.com/~/media/Files/PDF/industries/metals-introduction-furnace-brazing.pdf. Jul. 18, 2018.
All About Circuits. ND. "Thermocouples." https://www.allaboutcircuits.com/textbook/direct-current/chpt-9/thermocouples/. Jan. 1, 2018.
Allison, J.E. and Lents, J., 2002. Encouraging distributed generation of power that improves air quality: can we have our cake and eat it too? Energy Policy, 30(9), pp. 737-752. Amsterdam, Netherlands.
Al-Tounsi, A. and Hashmi, M.S.J., 1991. Effect of sintering temperature on high strain rate properties of iron powder compacts. Le Journal de Physique IV, 1(C3), pp. C3-203. Les Ulis, France.
Alphabet Energy. 2017. Callfornia Energy Commission Awards Funding for Next Generation Thermoelectric Waste Heat to Power Research. Press release. Apr. 13. https://www.alphabetenergy.com/california-energy-commission-awards-funding-next-generation-thermoelectric-waste-heat-power-research/. Feb. 17, 2018.
Alphabet Energy. 2015. Alphabet Energy Introduces the PowerModule Developer Kit™ forIncreased Industrial Energy Efficiency. Press release. Oct. 21. https://www.alphabetenergy.com/alphabet-energy-introduces-the-powermodule-developer-kit-for-Increased-Industrial-energy-efficiency/. Feb. 17, 2018.
Alphabet Energy. 2014. Alphabet Energy Introduces the World's Most Powerful Thermoelectric Generator. Press release. Oct. 7. https://www.alphabetenergy.com/alphabet-energy-introduces-worlds-powerful-thermoelectric-generator/. Jan. 23, 2018.
Alphabet Energy. ND. PowerCardy:™ A robust thermoelectric device for power generation. https://www.alphabetenergy.com/product/powercard/. Jan. 8, 2018.
Amec Foster Wheeler. ND. Waste heat recovery units. https://www.amecfw.com/products/fired-heaters/heat-recovery/waste-heat-recovery-units. Dec. 1, 2018.
American Council for an Energy-Efficient Economy. ND. Combined heat and power (CHP). https://aceee.org/topics/combined-heat-and-power-chp. Dec. 30, 2018.
American Council on Renewable Energy. ND. Waste heat. https://acore.org/renewable-energy-101/item/3986-waste. Jan. 15, 2018.
Ametek Solidstate Controls. ND. Digital ProcessPower® Inverter. http://www.solidstatecontrolsinc.com/products/inverters/dpi. Jan. 16, 2018.
Anand, M.D., Devadhas, G.G., Prabhu, N. and Karthikeyan, T., 2016, Ceramic Monolith Heat Exchanger—A Theoretical Study and Performance Analysis. Indian Journal of Science and Technology, 9 (13). Chennai, Tamilnadu, India.
Andrei, V., Bethke, K. and Rademann, K. 2016. Adjusting the thermoelectric properties of copper (i) oxide-graphite-polymer pastes and the applications of such flexible composites. Physical Chemistry Chemical Physics, 18(16), p. 10700-10707. https://pubs.rsc.org/en/content/articlelanding/2016/cp/c5cp06828b#!divAbstract. Accessed Apr. 5, 2019.
Andrei, V., Bethke, K. and Rademann, K. 2014. Copper (I) oxide based thermoelectric powders and pastes with high Seebeck coefficients. Applied Physics Letters, 105(23), p. 233902. Mar. 23, 2018.
Andrei, V., Bethke, K. and Rademann, K. ND, Copper(I) oxide based thermoelectric powders and pastes with high Seebeck coefficients: supplemental material. https://aip.scitation.org/doi/suppl/10.1063/1.4903832/suppl_file/supplemental+material.pdf. Mar. 27, 2018.
Angelo, P.C. and Subramanian, R. 2008. Powder metallurgy: science, technology and applications. PHI Learning Pvt. Ltd. Nov. 29, 2018. Delhi, India.
Aniwaa. ND. 3D printers comparison. https://www.aniwaa.com/comparison/3d-printers/?filter_search&filter_price_minimum&filter_price_maximum&filter_build_size_width&filter_build_size_height&filt%E2%80%A6. Feb. 8, 2018.
Aniwaa. ND. Admaflex 130. https://www.aniwaa.com/product/3d-printers/admatec-admaflex-130/. Mar. 1, 2018.
Anikreddy, K., Menon, A.K., Iezzi, B., Yee, S.K., Losego M.D. and Jur, J.S. 2016. Electrical conductivity, thermal behavior, and seebeck coefficient of conductive films for printed thermoelectric energy harvesting systems. Journal of Electronic Materials, 45(11), pp. 5561-5569. Feb. 7, 2018. New York, NY, United States.
Anžel, I., 2007. High temperature oxidation of metals and alloys. Metalurgija, 13(4), pp. 325-336. Zagreb, Croatia.

(56) References Cited

OTHER PUBLICATIONS

Apertet Y., Ouerdane, H., Goupil, C. and Lecoeur, P. 2016. A note on the electrochemical nature of the thermoelectric power. The European Physical Journal Plus, 131(4), p. 76. New York, NY, United States.
Aptus Designworks. 2017. High Volume Component Insertion. http://www.aptusdesignworks.com/portfolio-items/high-volume-component-insertion/. Jan. 20, 2019.
Arce, M., Saavedra, Á., Miguez, J., Granada, E. and Cacabelos, A. 2013. Biomass fuel and combustion conditions selection in a fixed bed combustor. Energies, 6(11), pp. 5973-5989. Basel, Switzerland.
ASM International. 2007. "Sintering and Corrosion Resistance." Powder Metallurgy Stainless Steels: Processing, Microstructures, and Properties. https://www.asminternational.org/documents/10192/3449622/5200_Sample.pdf/aebe9db1-07d3-443d-87ae-f72f8fdc3705. May 12, 2018.
ASM Ready Reference: Thermal Properties of Metals. 2002. Chapter 2: Thermal Expansion. ASM International. https://www.asminternational.org/documents/10192/1849770/ACFAAD6.pdf/2d574bfc-e104-48c5-8d8e-c33ffe91c3a0. Feb. 13, 2018.
ASTM Committee E-20 on Temperature Measurement, 1981. Manual on the use of thermocouples in temperature measurement (vol. 470). ASTM International. West Conshohocken, PA, United States.
Attari, S.Z., Dekay, M.L., Davidson, C.I. and Debruin, W.B., 2010. Public perceptions of energy consumption and savings. Proceedings of the National Academy of Sciences, 107(37), pp. 16054-16059. Washington, DC, United States.
Aufhauser. ND. Nickel Brazing Alloy Procedures and Techniques for Torch Brazing. https://www.brazing.com/Support/Procedures_and_techniques/NickelTorchBrazingProcedures.aspx. Jan. 26, 2019.
Auparay, N., 2013. Room temperature Seebeck coefficient measurement of metals and semiconductors. Oregon State University. Mar. 8, 2019. Corvallis, OR, United States.
Aurora Labs. ND. Best value and most flexible 3D metal printer on the market. Product brochure. Bibra Lake, WA, United States.
Autosplice. ND. Pin insertion machines. https://www.autosplice.com/insertion-systems. Jan. 20, 2019.
Autosplice. ND. Minisert technical datasheet. https://docs.wixstatic.com/ugd/23d362_7b03aa1995774409bb99cb4041f28dfe.pdf. Jan. 20, 2019.
Avery, R.E. and Tuthill, A.H., 1994. Guidelines for the Welded Fabrication of Nickel Alloys for Corrosion-resistant Service, Nickel Development Institute. Apr. 13, 2018. Toronto, ON, Canada.
Ayres, S., Bell, L., Crane, D. and Lagrandeur, J. Aug. 2009. Development of a 500 Watt High Temperature Thermoelectric Generator. In presentation at US Department of Energy Directions in Engine Efficiency and Emissions Research (DEER) Conference, Dearborn, Michigan. Jan. 28, 2018.
Azo Materials. ND. "Borosilicate Glass—Properties of Borosilicate Glass (Pyrex/Duran) by Goodfellow Ceramic & Glass Division." https://www.azom.com/article.aspx?ArticleID=4765#. Jun. 7, 2018.
Azzi, L., Stephenson, T., Pelletier S., St. Laurent, S. 2007. High-performance PM steels using extra-fine nickel. International Journal of Powder Metallurgy, 43(4), pp. 39-49.https://nrc-publications.canada.ca/eng/view/accepted/?id=942aa012-f925-4491-8089-1d951cc74c8f. Jul. 17, 2020/.
Bai, Y. and Williams, C.B. 2015. An exploration of binder jetting of copper. Rapid Prototyping Journal, 21(2), pp. 177-185. https://sffsymposium.engr.utexas.edu/sites/default/files/2014-063-Bai.pdf. Feb. 6, 2018.
Baker, F.S., Campana, R.J. and Sargent, W.S. 1967. SNAP-15A Thermoelectric Generator. Final Report, May 6, 1963-Sep. 30, 1964 (No. GA-5317). General Dynamics Corp., San Diego, Calif. General Atomic Div. https://www.ostl.gov/servlets/purl/4472063. Jan. 23, 2019.
Banerjee, S and Joens, C.J. N.D. A Comparison of Techniques for Processing Powder Metal Injection Molded 17-4. http://www.dshtech.com/pub/files/Comparisonoftechniquesforprocessingpowermetalinjectionmolded.pdf. Apr. 19, 2019.
Barako, M. Leblanc, S., and Goodson, K. 2013. Novel materials and packaging for thermoelectric waste heat recovery. Precourt Institute Energy Advisory Council, May 1. https://energy.stanford.edu/sites/g/files/sblybj9971/l/5goodson_precourt_advisory_may_1-2013.pdf. Jun. 23, 2018.
Baranowski, L.L., Warren, E.L. and Toberer, E.S. 2014. High-temperature high-efficiency solar thermoelectric generators. Journal of Electronic Materials, 43(6), pp. 2348-2355. May 17, 2018. New York, NY, United States.
Bardhan, P.K., Patra, S. and Sutradhar, G. 2010. Analysis of density of sintered iron powder component using the response surface method. Materials Sciences and Applications, 1(03), p. 152. https://www.scirp.org/pdf/msa20100300004_27356927.pdf. Jul. 17, 2020.
Barnes, C. 2018. Industry and Market Outlook. CreateSpace Independent Publishing Platform; 2018 edition (Oct. 30). Bonita Springs, FL, United States.
Barrett, T.R., Ellis, G.C. and Knight, R.A. 1958. The pressureless sintering of loose beryllium powder. Powder Metallurgy, 1(1-2), pp. 122-132. Dec. 29, 2018. Philadelphia, PA, United States.
Barry, J., 2007. Environment and social theory. Second edition. Routledge. Abingdon, United Kingdom.
Batal, M.A., Nashed, G. and Jneed, F.H., 2014. Conductivity and thermoelectric properties of nanostructure tin oxide thin films. Journal of the Association of Arab Universities for Basic and Applied Sciences, 15(1), pp. 15-20. Philadelphia, PA, United States.
Bawkon, B., 1991. Incineration technologies for managing solid waste. Pollution Engineering, 23 (9), pp. 96-100. Troy, MI, United States.
Bed Bath & Beyond Inc. 2018. GoSun® Go Portable Solar Grill in Stainless Steel. https://www.bedbathandbeyond.com/store/product/gosun-reg-go-po...&gclid=EAlalQobChMlq9ba5c7l2gIVFVuGCh3aJALGEAQYAyABEglqUvD_BwE. May 1, 2018.
Behera, S. and Sarkar, R., 2015. Sintering of magnesia: effect of additives. Bulletin of Materials Science, 38(6), pp. 1499-1505. New York, NY, United States.
Bell, L.E., 2008. Cooling, heating, generating power, and recovering waste heat with thermoelectric systems. Science, 321(5895), pp. 1457-1461. Washington, DC, United States.
Bell, L.E., Koripella, R. and Collins, R.T., 2011. Increased Efficiency Thermoelectric Generator With Convective Heat Transport. BSST LLC Irwindale, CA. Aug. 16, 2019.
Benedict, R.P., Hurwitz, M.J., Leschek, W.C. and Boles, D.G., 1985. Detection of water induction in steam turbines. Phase 3: field demonstration. Final report. [Detection of water or cool vapor] (No. EPRI-CS-4285). Westinghouse Electric Corp., Orlando, FL (USA). Power Generation Operating Div.
Benedict, R.P. 1984. Fundamentals of temperature, pressure, and flow measurements. 3rd edition. John Wiley & Sons. Somerset, NJ, United States.
Benjamin, J.S., 1976. Mechanical alloying. Scientific American, 234(5), pp. 40-49. London, United Kingdom.
Bernardo, E., Colombo, P., Pippel, E. and Woltersdorf, J. 2006. Novel mullite synthesis based on alumina nanoparticles and a preceramic polymer. Journal of the American Ceramic Society, 89(5), pp. 1577-1583. Westerville, OH, United States.
Bertrand, N., Desgranges, C., Poquillon, D., Lafont, M.C. and Monceau, D. 2010. Iron oxidation at low temperature (260-500 C) in air and the effect of water vapor. Oxidation of Metals, 73 (1-2), pp. 139-162. New York, NY, United States.
Bethke, K., Andrei, V. and Rademann, K., 2016. Decreasing the Effective Thermal Conductivity in Glass Supported Thermoelectric Layers. PloS one, 11(3), p. e0151708. San Francisco, CA, United States.
Big Ceramic Store. ND. Ways to use plaster molds. http://www.bigceramicstore.com/info/ceramics/tips/tip45_use_plaster_molds.html. Sep. 26, 2018.
Biomass Thermal Energy Council. 2017. Thermoelectric wood stoves. Sep. 21. http://www.biomassthermal.com/resource/Webinars/2017-05-18%2011.00%20Thermoelectric%20Wood%20Stoves.mp4. Feb. 11, 2018.

(56) References Cited

OTHER PUBLICATIONS

Bisconti, A., 2016. Public opinion on nuclear energy: what influences it. Bulletin of the Atomic Scientists. Apr. 27. https://thebulletin.org/2016/04/public-opinion-on-nuclear-energy-what-influences-it/. Nov. 21, 2018.
Blatt, J., 2012. Thermoelectric power of metals. Springer Science & Business Media. New York, NY, United States.
Bluvas, K., 2006. Distributed generation: a step forward in United States energy policy. Albany. Law Review, 70, p. 1589. Albany, NY, United States.
Boc. ND. Sintering and Sinter Hardening. https://www.boconline.co.uk/en/images/Principles%20of%20Sintering_tcm410-114392.pdf. Jun. 4, 2020.
Borgwardt, R.H., 1989. Sintering of nascent calcium oxide. Chemical Engineering Science, 44 (1), pp. 53-60. Amsterdam, Netherlands.
Borup, K.A., De Boor, J., Wang, H., Drymiotis, F., Gascoin, F., Shi, X., Chen, L., Federov, M.I., Muller, E., Iversen, B.B. and Snyder, G.J., 2015. Measuring thermoelectric transport properties of materials. Energy & Environmental Science, 8(2), pp. 423-435. Cambridge, United Kingdom.
Bosch Packaging Technology. ND. GKF 702. https://www.boschpackaging.com/en/pa/products/industries/pd/product-detail/gkf-702-12864.php. Dec. 4, 2018.
Boscivic, S. and Tabatabaian, M. 2011. Thermoelectric power generation. Technical seminar, Sep. 23, British Columbia Institute of Technology, School of Energy. https://www.bcit.ca/files/energy/pdf/thermo_power_generation_tech_seminar.pdf. Feb. 1, 2018.
Brandstetter, A., Yekutieli, G., Lanxner, M. and Shai, I., 1978. Solar furnace type high power density thermoelectric generator. In 13th Intersociety Energy Conversion Engineering Conference (pp. 1989-1995). May 1, 2018.
Breneman, R.C. and Halloran, J.W., 2014. Kinetics of cristobalite formation in sintered silica. Journal of the American Ceramic Society, 97(7), pp. 2272-2278. Westerville, OH, United States.
Brito, F.P., Figueiredo, L., Rocha, L.A., Cruz, A.P., Goncalves, L.M., Martins, J. and Hall, M.J., 2016. Analysis of the effect of module thickness reduction on thermoelectric generator output. Journal of Electronic Materials, 45(3), pp. 1711-1729. https://www.researchgate.net/publication/284275718_Analysis_of_the_Effect_of_Module_Thickness_Reduction_on_Thermoelectric_Generalor_Output/link/5679697008ae40c0e27dbfb1/download. May 1, 2018.
Brooks, H., Clarkson, P., Davies, P. and Fairclough, D., 2017. Sintering of 3D printed metal, ceramic and glass multi-material parts. Conference paper. https://www.researchgate.net/publication/318541061_Sintering_of_3D_printed_metal_ceramic_and_glass_multi-material_parts. Jul. 17, 2020.
Brown, M.A., 2017. Commercial cogeneration benefits depend on market rules, rates, and policies. Environmental Research Letters, 12(3). Philadelphia, PA, United States.
Brown, M.A., Cox, M. and Baer, P., 2013. Reviving manufacturing with a federal cogeneration policy. Energy Policy, 52, pp. 264-276. https://www.sciencedirect.com/science/article/pii/S0301421512007525. Dec. 30, 2018.
Brown, R.L. 2008. Waste heat recovery. INGAA Foundation Spring Meeting, Apr. 17. PowerPoint presentation. https://www.ingaa.org/file.aspx?id=6454. Dec. 1, 2008.
Brückner, S., Liu, S., Miró, L., Radspieler, M., Cabeza, L.F. and Lävemann, E., 2015. Industrial waste heat recovery technologies: an economic analysis of heat transformation technologies. Applied Energy, 151, pp. 157-167. https://www.sciencedirect.com/science/article/pil/S0306261915004584. Dec. 2, 2018.
Bubnova, O., et al. "Optimization of the thermoelectric figure of merit in the conducting polymer poly (3, 4-ethylenedioxythiophene)." Nature materials 10.6 (2011):429. http://www.diva-portal.org/smash/record.jsf?pid=diva2%3A421193&dswid=9065. Jul. 3, 2018.
Bullseye Glass Company. 2015. Technotes: Volume & bubble control. https://www.bullseyeglass.com/images/stories/bullseye/PDF/TechNotes/technotes_05.pdf. Jun. 10, 2020.
Bullseye Glass Company. 2009. TechNotes 4. Heat & Glass: Understanding the Effects of Temperature Variations of Bullseye Glass. https://www.bullseyeglass.com/images/stories/bullseye/PDF/TechNotes/technote_4_2020.pdf. Jun. 10, 2020.
Calderwood, F.W. and Wilder, D., 1957. Effect of calcium fluoride additions on the sintering of magnesium oxide. Iowa State University. https://lib.dr.iastate.edu/cgi/viewcontent.cgi?article=1171&context=ameslab_iscreports. Sep. 18, 2018.
Caldwell, F.R. [1962] 1969. Thermocouple materials. National Bureau of Standards Monograph 40. United States Department of Commerce. US Government Printing Office. Washington, DC, USA.
California Brazing. ND. Q: What is hydrogen furnace brazing? https://www.californiabrazing.com/faq-what-is-hydrogen-furnace-brazing/. May 13, 2018.
California Energy Commission. 2015. Guidelines for Certification of Combined Heat and Power Systems Pursuant to the Waste Heat and Carbon Emissions Reduction Act, Public Utilities Code Section 2840 et. seq. California Energy Commission. CEC-200-2015-001-CMF. https://www.energy.ca.gov/wasteheat/. Dec. 1, 2018.
California Energy Commission. ND. Combined heat and power. California Energy Commission—Tracking progress. https://ww2.energy.ca.gov/renewables/tracking_progress/documents/combined_heat_and_power.pdf. Dec. 30, 2018.
C40 Cities. 2011. 98% of Copenhagen City Heating Supplied by Waste Heat. Nov. 3. https://www.c40.org/case_studies/98-of-copenhagen-city-heating-supplied-by-waste-heat. Dec. 1, 2018.
Callister, W.D., Jr. 2003. Materials science and engineering: an introduction. Sixth edition. John Wiley & Sons. Somerset, NJ, United States.
Cao, X.Q., Vasssen, R. and Stoever, D., 2004. Ceramic materials for thermal barrier coatings. Journal of the European Ceramic Society, 24(1), pp. 1-10. Amsterdam, Netherlands.
Cao, Z., Shi, J.J., Torah, R.N., Tudor, M.J. and Beeby, S.P., 2015. All dispenser printed flexible 3D structured thermoelectric generators. In Journal of Physics: Conference Series (vol. 660, No. 1, p. 012096). IOP Publishing. Philadelphia, PA, United States.
Cao, Z., 2014. Printable thermoelectric devices for energy harvesting (Doctoral dissertation, University of Southampton). Southampton, United Kingdom.
Cao, Z., Koukharenko, E., Torah, R.N. and Beeby, S.P., Jun. 2013. Exploring screen printing technology on thermoelectric energy harvesting with printing copper-nickel and bismuth-antimony thermocouples. In 2013 Transducers & Eurosensors XXVII: The 17th International Conference on Solid-State Sensors, Actuators and Microsystems (Transducers & Eurosensors XXVII) (pp. 478-481). IEEE. Piscataway, NJ, United States.
Cardarelli, F. 2008. Miscellaneous Electrical Materials in Materials Handbook: A Concise Desktop Reference. Springer. New York, NY, United States.
Carter, C.B. and Norton, M.G., 2007. Ceramic materials: science and engineering. Springer. New York, NY, United States.
Casten, T.R. and Schewe, P.F., 2009. Getting the Most from Energy: Recycling waste heat can keep carbon from going sky high. American Scientist, 97(1), pp. 26-33. Research Triangle Park, NC, United States.
Ceramco. ND. http://www.ceramcoceramics.com/index.php; http://www.ceramcoceramics.com/solutions/insulation.thermal/insulation.thermal.php; http://www.ceramcoceramics.com/processes/near.net.shaping/near.net.shaping.php. Sep. 12, 2019.
Ceramic Arts Network. 2010. Ceramic mold making techniques. https://ceramicartsnetwork.org/wp-content/uploads/2010/03/moldmakingtechniques.pdf. Sep. 17, 2018.
Ceramic Industry. ND. "Material Properties Charts." https://www.ceramicindustry.com/ext/resources/pdfs/2013-CCD-Material-Charts.pdf. Feb. 13, 2018.
Ceramic Industry. 2012. Global Industrial Furnaces and Ovens Market to Reach$12.5 Billion by 2017. Apr. 3. https://www.ceramicindustry.com/articles/92466-global-industrial-furnaces-and-ovens-market-to-reach--12-5-billion-by-2017. Jan. 14, 2018.
Chabert, F., Dunstan, D.E. and Franks, G.V., 2008. Cross-linked polyvinyl alcohol as a binder for gelcasting and green machining.

(56) References Cited

OTHER PUBLICATIONS

Journal of the American Ceramic Society, 91(10), pp. 3138-3146. https://onlinelibrary.wiley.com/doi/pdf/10.1111/j.1551-2916.2008.02534.x. Nov. 21, 2018.

Chalabyan, A., Jansch, E., Niemann, T., Zeumer, B. and Zhuravleva, K., 2017. How 3-D Printing Will Transform the Metals Industry. Mckinsey global institute. https://www.mckinsey.com/industries/metals-and-mining/our-insights/how-3d-printing-will-transform-the-metals-industry. Jan. 1, 2018.

Champier, D., 2017. Thermoelectric generators: A review of applications. Energy Conversion and Management, 140, pp. 167-181. Amsterdam, The Netherlands.

Chan, D.Y.L., Yang, K.H., Lee, J.D. and Hong, G.B., 2010. The case study of furnace use and energy conservation in iron and steel industry. Energy, 35(4), pp. 1665-1670. Amsterdam, The Netherlands.

Chandel, M.K., Pratson, L.F. and Jackson, R.B., 2011. The potential impacts of climate-change policy on freshwater use in thermoelectric power generation. Energy Policy, 39(10), pp. 6234-6242. Amsterdam, The Netherlands.

Chang, S.H., Chen, J.C., Huang, K.T. and Chen, J.K., 2013. Improvement of Mechanical and Electrical Properties on the Sintered Ni-50 mass% Cr Alloys by HIP Treatment. Materials Transactions, 54(6), pp. 1034-1039. Sendai, Japan.

Chaston, J.C., 1975. The oxidation of the platinum metals. Platinum Metals Review, 19(4), pp. 135-140. https://www.ingentaconnect.com/content/matthey/pmr/1975/00000019/00000004/art00002?crawler=true&mimetype=application/pdf. Jun. 16, 2020.

Chen, W.H., 2003. Waste burning and heat recovery characteristics of a mass burn incineration system. Journal of the Air & Waste Management Association, 53(2), pp. 136-142. Philadelphia, PA United States.

Chen, A.N., Wu, J.M., Liu, K., Chen, J.Y., Xiao, H., Chen, P., Lil C.H. and Shi, Y.S., 2018. High-performance ceramic parts with complex shape prepared by selective laser sintering: a review. Advances in Applied Ceramics, 117(2), pp. 100-117. Philadelphia, PA United States.

Chen, G. 2013. Concentrated solar thermoelectric power. Concentrating Solar Power Program Review Meeting. https://www.energy.gov/sites/prod/files/2014/01/f7/csp_review_meeting_042313_chen.pdf. Sep. 16, 2019.

Chen, Q., Longtin, J.P., Tankiewicz, S., Sampath, S. and Gambino, R.J., 2004. Ultrafast laser micromachining and patterning of thermal spray multilayers for thermopile fabrication. Journal of Micromechanics and Microengineering, 14(4), p. 506. Bristol, United Kingdom.

Cheng, Zhe. ND. EMA 5646 Ceramic Processing Lecture. "Green Body Formation." Florida International University. https://ac.fiu.edu/wp-content/uploads/2016/04/Lecture-06_Green-body-formation.pdf. Sep. 22, 2018.

Chu, C.H., Lin, C.P., Wen, S.B. and Shen, Y.H., 2009. Sintering of aluminum nitride by using alumina crucible and MoSi2 heating element at temperatures of 1650° C. and 1700° C. Ceramics International, 35(8), pp. 3455-3461. https://www.sciencedirect.com/science/article/pii/S0272884209002740. Aug. 26, 2018.

CIA World Factbook. https://www.cia.gov/library/publications/the-world-factbook/geos/us.html. Sep. 17, 2019.

Cleaves, H.E. and Hiegel, J.M., 1942. Properties of high-purity iron. J. Res. Natl. Bur. Standards, 28(643), p. 1471. Washington, DC, United States.

CMS Circuit Solutions. ND. Multilayer thick film screen printed substrates. http://cmscircuitsolutions.com/capabilities/multilayer-thick-film-substrates/. Jan. 1, 2018.

Conner-Simons, A. Aug. 24, 2015. "'MultiFab' 3-D prints a record 10 materials at once, no assembly required." MIT News. http:/news.mit.edu/2015/multifab-3-d-print-10-materials-0824. Jan. 1, 2018.

Cohrt, H. and Enders, M. 1993. Sintered steel and iron in Ulimann's encyclopedia of industrial chemistry. Wiley-VCH, vol. A24, pp. 185-208. Berlin, Germany.

Cool Tools. ND. Silver Clay Firing Tips & Info. https://www.cooltools.us/Silver-Metal-Clay-Firing-Tips-Info-s/1219.htm. Jan. 24, 2019.

Copper Development Association. 2018. Copper Powder Consolidation Techniques. https://www.copper.org/resources/properties/129_6/consolidation.html. Apr. 11, 2018.

Copper Development Association. ND. Characteristics and Properties of Copper and Copper Alloy P/M Materials. https://www.copper.org/resources/properties/129_6/characteristics_properties.html. Apr. 15, 2018.

Corbyn, Z, 2014. A container-sized generator that converts waste heat into energy. The Guardian, Dec. 7. https://www.theguardian.com/technology/2014/dec/07/1-alphabet-energy-generator-waste-heat-energy-oil-gas. Jan. 8, 2018.

Corning Incorporated. ND. Corning® Pyroceram® Code 9606. https://www.corning.com/media/worldwide/csm/documents/86784A3D-E2EE-4C4F-BBBD-A9E3721F4E21.pdf. Jul. 15, 2018.

Corti, C.W., 1986. Sintering alds in powder metallurgy. Platinum metals review, 30(4), pp. 184-195. https://www.ingentaconnect.com/content/matthey/pmr/1986/00000030/00000004/art00009?crawler=true&mimetype=application/pdf. Jun. 16, 2020.

Cotronics Corporation. ND. High temp. materials instructional handbook. vol. 14, No. 60. http://www.cotronics.com/vo/cotr/pdf/Cotronics_InstructionalHandbook_Web.pdf. Sep. 10, 2018.

Crabb, B. and Zweibel, K. 2012. Energy Incentives: The Power Behind the Power George Washington University Solar Institute; California Solar Industries Association. https://solar.gwu.edu/energy-incentives-power-behind-power-0. Nov. 21, 2018.

Crabtree, G., Integrating Renewable Electricity on the Grid—A Report by the APS Panel on Public Affairs. 2010. American Physical Society: Washington DC, United States.

Creyssels, M., Falcon, E. and Castaing, B. Jun. 2009. Experiment and theory of the electrical conductivity of a compressed granular metal. In AIP Conference Proceedings (vol. 1145, No. 1, pp. 123-126). American Institute of Physics. College Park, MD, United States.

Cracow University of Technology. ND. Institute of Material Engineering. Sintering. https://mail.pk.edu.pl/~mnykiel/iim/26/DOWNLOAD/pdf/CHAPT06.PDF [author unidentified]. Sep. 24, 2019.

Cracow University of Technology. ND. Institute of Material Engineering. Sintering. https://mail.pk.edu.pl/~mnykiel/iim/26/DOWNLOAD/pdf/CHAPT09.PDF [author unidentified]. Sep. 24, 2019.

Custom Thermoelectric. 2014. TEG Specificallon Sheet. "Seebeck Thermoelectric Generator." Part #2411G-7L31-15CX1. Rev. May 6, 2014. https:/customthermoelectric.com/media/wysiwyg/TEG_spec_sheets/2411G-7L31-15CX1_20140508_spec_sht.pdf. Feb. 2, 2019.

Cygan, D., and Wissmiller, D. (Gas Technology Institute). 2015. Demonstration of Waste Heat Recovery for Power Generation. California Energy Commission. Publication No. CEC-500-2015-066. Sacramento, CA, United States.

Danninger, H., Calderon, R.D.O. and Gierl-Mayer, C. 2017. Powder Metallurgy and Sintered Materials. Additive Manufacturing, 19, p. 4. Amsterdam, Netherlands.

Datta, B.K., 2014. Powder Metallurgy: An Advanced Technique of Processing Engineering Materials. Second editon. PHI Learning Pvt. Ltd. Delhi, India.

D'aveni, R., 2015. The 3-D printing revolution. Harvard Business Review, 93(5), pp. 40-48. Boston, MA, United States.

Davies, P.A., Dunstan, R., Hayward, A.C., and Howells, R. ND. Development of master alloy powders, including nickel-based superalloys, for Metal Injection Molding (MIM). https://www.materials.sandvik/globalassets/global/downloads/products_downloads/metal_powders/technical_papers/development-of-master-alloy-powders.pdf. Aug. 19, 2018.

Deckers, J., Vleugels, J. and Kruthl, J.P., 2014. Additive manufacturing of ceramics: a review. Journal of Ceramic Science and Technology, 5(4), pp. 245-260. Dresden, Germany.

Department of the Army. 2013. "Waste management for deployed forces." Technical Manual No. 3-34.56. Washington, DC. United States.

(56) References Cited

OTHER PUBLICATIONS

Desktop Metal. ND. Studio System—Office-friendly metal 3D printing. https://www.desktopmetal.com/products/studio/. Feb. 8, 2018.

Deutsches Kupferinstitut—Copper Alliance. ND. Soldering and brazing of copper and copper alloys. https://www.copper.org/applications/marine/cuni/pdf/Broschuere_Loeten_ENG.pdf. Jan. 26, 2019.

Devine-Wright, P., 2008. Reconsidering public acceptance of renewable energy technologies: a critical review. Delivering a low carbon electricity system: technologies, economics and policy, pp. 1-15. http://citeseerx.ist.psu.edu/viewdoc/download?doi=10.1.1.568.6388&rep=rep1&type=pdf. Nov. 21, 2018.

Devine-Wright, P., Jun. 2003. A cross-national, comparative analysis of public understanding of, and attitudes towards nuclear, renewable and fossil-fuel energy sources. In Proceedings of the 3rd conference of the EPUK (Environmental Psychology in the UK) network: Crossing Boundaries—The Value of Interdisciplinary Research (pp. 160-173). https://iaps.architexturez.net/system/files/pdf/10d6.content.02934.pdf. Nov. 21, 2018.

Deziel. C. ND. How to wire a solar panel to a battery to an inverter. https://www.hunker.com/12315204/how-to-wire-a-solar-panel-to-a-battery-to-an-inverter. Apr. 18, 2018.

DK Ceramic Circuits. ND. Ceramic PCB. https://www.europages.co.uk/DK-CERAMIC-CIRCUITS/00000004688371-487568001.html. May 29, 2019.

digitalfire.com. ND. Binders for ceramic bodies. https://digitalfire.com/4sight/education/binders_for_ceramic_bodies_345.html. Nov. 26, 2018.

digitalfire.com. ND. Crystallization. https://digitalfire.com/4sight/glossary/glossary_crystallization.html. Aug. 11, 2018.

Dincer, I. and Rosen, M.A., 1999. Energy, environment and sustainable development. Applied Energy, 64(1-4), pp. 427-440. Amsterdam, Netherlands.

Dobrzanski, L.A., Dobrzanska-Dankiewicz, A.D., Achtelikfranczak, A., Dobrzanski, L.B., Hajduczek, E. and Matula, G., 2017. Fabrication technologies of the sintered materials Including materials for medical and dental application. In Powder Metallurgy-Fundamentals and Case Studies. IntechOpen. https://www.researchgate.net/publication/315756201_Fabrication_Technologies_of_the_Sintered_Materials_Including_Materials_for_Medical_and_Dental_Application, Dec. 22, 2018.

Dominguez Espinosa, F.A., 2011. Effect of fabrication parameters on thermophysical properties of sintered wicks (Master's Thesis, Massachusetts Institute of Technology). Cambridge, MA. United States.

Dominion Metallurgical. ND. Manufacturing capabilities. https://www.dom-met.com/capabilities. May 23, 2018.

Doris, E., Cochran, J. and Vorum, M., 2009. Energy efficiency policy in the United States: overview of trends at different levels of government (No. NREL/TP-6A2-46532). National Renewable Energy Lab.(NREL), Golden, CO (United States).

Duby, S., Ramsey, B., Harrison, D. and Hay, G., Oct. 2004. Printed thermocouple devices. In Sensors, 2004 IEEE (pp. 1098-1101), IEEE. http://citeseerx.ist.psu.edu/viewdoc/download?doi=10.1.1.426.5220&rep=rep1&type=pdf. Accessed Jun. 22, 2020.

Duby, S., Ramsey, B. and Harrison, D., The Power of Thermoelectrics. HELECO '05, TEE, Αθήνα, 3-6 Φεβρουαρίου 2005. http://library.tee.gr/digital/m2045/m2045_duby.pdf. Accessed Jun. 22, 2020.

Duffield, W.A. and Sass, J.H., 2003, Geothermal energy: Clean power from the earth's heat (vol. 1249). US Geological Survey. Denver, CO. United States.

Duncan-Parnell. ND. Prototyping Services. https://www.duncan-parnell.com/3d-print-solutions/prototyping-services. Jan. 12, 2018.

Duval, D.J., Risbud, S.H. and Shackelford, J.F., 2008. Mullite. In Ceramic and Glass Materials (pp. 27-39). Springer, Boston, MA. United States.

Echogen Power Systems, LLC. 2018. Advocacy. https://www.echogen.com/waste-heat-to-power/advocacy/ 4/. Dec. 2, 2018.

Echogen Power Systems, LLC. 2018. Incentives and Policies. https://www.echogen.com/waste-heat-to-power/incentives-and-policies/. Dec. 31, 2018.

Ebrahimi, K., Jones, G.F. and Fleischer, A.S. 2014. A review of data center cooling technology, operating conditions and the corresponding low-grade waste heat recovery opportunities. Renewable and Sustainable Energy Reviews, 31, pp. 622-638. Amsterdam, Netherlands.

Eirich Machines. ND. 3D Printing Mixing and Blending. https://www.eirichusa.com/by-industry/chemical-and-industrial/3d-printing-mixing-and-blending?gclid=EAlalQobChMImLeo59GR2QIVIIzICh0Z8QWREAAYASA%E2%80%A6. Jun. 22, 2020.

Eisenmann, M., 1998. Porous powder metallurgy technology. ASM International, ASM Handbook, 7, pp. 1031-1042. http://chandeisenmann.com/resources/asmmodified110603.pdf. Oct. 5, 2019.

Electratherm. ND. https://electratherm.com/. Feb. 27, 2018.

El-Genk, M.S., Saber, H.H. and Caillat, T. Jan. 2002. A performance comparison of SiGe and skutterudite based segmented thermoelectric devices. In AIP conference proceedings (vol. 608, No. 1, pp. 1007-1015). AIP. Oct. 5, 2019.

Elsheikh, M.H., Shnawah, D.A., Sabri, M.F.M., Said, S.B.M., Hassan, M.H., Bashir, M.B.A. and Mohamad, M., 2014. A review on thermoelectric renewable energy: Principle parameters that affect their performance. Renewable and Sustainable Energy Reviews, 30, pp. 337-355. Amsterdam, Netherlands.

Elson, A., Tidball, R. and Hampson, A., 2015. Waste heat to power market assessment. Oak Ridge National Laboratory. http://www.heatispower.org/wp-content/uploads/2015/02/ORNL-WHP-Mkt-Assessment-Report-March-2015.pdf. Jan. 3, 2018.

Emrullahoglu Abi, C.B. 2013. Production of cordierite-mullite ceramic composite from olivine. Mach Technol Mater, 12, pp. 15-17. http://mech-ing.com/journal/Archive/2013/12/4_77_Emrullahoglu_mtm13.doc.pdf. Accessed Jun. 24, 2020.

Energy Informative. ND. Grid-tied solar systems. https://energyinformative.org/grid-tied-off-grid-and-hybrid-solar-systems/. Jul. 3, 2018.

Envisiontec. ND. Ultra 3SP and Ultra 3SP Hi-Res brochure. https://envisiontec.com/wp-content/uploads/2016/09/2017-ULTRA-3SP-Series.pdf. Aug. 6, 2018.

Eremenko, V.N. and Natanzon, Y.V., 1962. Variation in electrical conductivity of metal powders during sintering. Metal Science and Heat Treatment, 2(1), pp. 45-48. https://link.springer.com/article/10.1007/BF00655591. Apr. 17, 2018.

Errea, I. 2014. Harvesting heat to create electricity: A new world record. Nov. 19. https://mappingignorance.org/2014/11/19/harvesting-heat-create-electricity-new-world-record/. Apr. 12, 2018.

Esgin, U., Özyürek, D. and Kaya, H., Apr. 2016. An investigation of wear behaviors of different Monel alloys produced by powder metallurgy. In AIP Conference Proceedings (vol. 1727, No. 1, p. 020008). AIP Publishing. Melville, NY, United States.

Etherington, D. 2016. MIT's new software makes multi-material 3D printing easy. TechCrunch. Oct. 11. https://techcrunch.com/2016/10/11/mits-new-software-makes-multi-material-3d-printing-easy/. Jan. 1, 2018.

Everhart J.L. 2017. Copper and Copper Alloy Powder Metallurgy Properties and Applications. Copper Development Association. https://www.copper.org/resources/properties/129_6/consolidation.html. Dec. 22, 2018.

Exone. ND. Benefits of Binder Jetting & Additive Manufacturing. https://www.exone.com/Resources/Technology-Overview/Benefits. Feb. 2, 2018.

Exone. ND. Parts on Demand. https://www.exone.com/Services/3D-Printing-Services/Parts-On-Demand. Jan. 15, 2018.

Exone. ND. Mid-Atlantic Production Service Center (PSC). https://www.exone.com/About-ExOne/Locations/The-Americas/Mid-Atlantic. Feb. 6, 2018.

Exone. ND. What is Binder Jetting? https://www.exone.com/Resources/Technology-Overview/What-is-Binder-Jetting. Feb. 7, 2018.

FABRIC8LABS. ND. http://fabric8labs.com/. Feb. 27, 2018.

Falcon, E., Castaing, B. and Creyssels, M. 2004. Nonlinear electrical conductivity in a 1D granular medium. The European Physical

(56) References Cited

OTHER PUBLICATIONS

Journal B-Condensed Matter and Complex Systems, https://arxiv.org/pdf/cond-mat/0311453.pdf. Apr. 15, 2018.
Fan, H. 2011. Power Generation from Thermoelectric Cells by Using Solar Parabolic Concentration Dish. Master's Thesis, RMIT University. http://researchbank.rmit.edu.au/view/rmit:160676/Fan.pdf. Apr. 1, 2018.
Fang, H., Xia, J., Zhu, K., Su, Y. and Jiang, Y., 2013. Industrial waste heat utilization for low temperature district heating. Energy policy, 62, pp. 236-246. https://www.sciencedirect.com/science/article/pii/S0301421513006113. May 27, 2018.
Farkas, I., Szente, A., Nyitri, D. and Odry, P., ND. Power Efficiency of Thermopile Technology. https://www.researchgate.net/profile/Jozsef_Nyers/publication/321243827_Proceedings_EXPRES_2016/links/5a1696420f7e9bc6481ca135/Proceedings-EXPRES-2016.pdf#page=11. Jun. 23, 2018.
Ferrotech Corporation. Thermoelectric technical reference. ND. https://thermal.ferrotec.com/technology/thermoelectric-reference-guide/thermalref13/. Jan. 1, 2018.
Figueira, J., Loureiro, J., Marques, J., Bianchi, C., Duarte, P., Ruoho, M., Tittonen, I. and Ferreira, I., 2017. Optimization of cuprous oxides thin films to be used as thermoelectric touch detectors. ACS applied materials & interfaces, 9(7), pp. 6520-6529. Dec. 19, 2018.
Flemmig, K., Wieters, K.P. and Kieback, B., ND. The Sintering Behaviour of Coated Particles. https://www.ifam.fraunhofer.de/content/dam/ifam/de/documents/dd/Publikationen/2005/1b1.pdf. Dec. 30, 2018.
Fleurial, J.P., Gogna, P., Li, B.C., Firdosy, S., Chen, B.J., Huang, C.K., Ravi, V., Caillat, T. and Star, K., Sep. 2009. Waste heat recovery opportunities for thermoelectric generators. In DoE Workshop on Thermoelectrics. https://www.energy.gov/sites/prod/files/2014/03/f13/fleurial.pdf. Jan. 8, 2018.
Ford, S.L., 2014. Additive manufacturing technology: potential implications for US manufacturing competitiveness. J. Int'l Com. & Econ., 6, p. 40. https://usitc.gov/publications/332/journals/vol_vi_article4_additive_manufacturing_technology.pdf. Accessed Jun. 24, 2020.
Forman, C., Muritala, I.K., Pardemann, R. and Meyer, B., 2016. Estimating the global waste heat potential. Renewable and Sustainable Energy Reviews, 57, pp. 1568-1579. https://www.sciencedirect.com/science/article/pii/S1364032115015750. May 27, 2018.
Formlabs, Inc. ND. Form 1+. https://support.formlabs.com/s/topic/0TO1Y000006mfMXWAY/form-1?language=en_US. Dec. 16, 2018.
Formlabs, Inc. ND. Form 1+: Introducing Desktop SLA. https://archive-media.formlabs.com/upload/Form-1-plus-overview-US.pdf. Dec. 12, 2018.
Formlabs, Inc. ND. Form 2. https://formlabs.com/store/form-2/buy-printer/. Oct. 11, 2019.
Formlabs, Inc. ND. Form 2 Tech Specs. https://formlabs.com/3d-printers/form-2/tech-specs/. Dec. 20, 2018.
Formlabs, Inc. ND. Software. https://support.formlabs.com/s/topic/0TO1Y000006mfMeWAI/software?language=en_US. Dec. 16, 2018.
Formlabs, Inc. ND. Form Wash and Form Cure Tech Specs. https://formlabs.com/tools/wash-cure/tech-specs/. Jan. 14, 2019.
Formlabs, Inc. 2019. Materials Data Sheet Photopolymer Resin for Form 1+ and Form 2. Mar. 1. https://formlabs-media.formlabs.com/datasheets/XL-DataSheet-601.pdf. Jan. 9, 2019.
Formlabs, Inc. 2018. Usage and Design Guide: Ceramic Resin. May. https://archive-media.formlabs.com/upload/ceramic-user-guide.pdf. May 9, 2018.
Formlabs, Inc. 2018. Using Tough Resin. Aug. 11. https://support.formlabs.com/s/article/Using-Tough-Resin?language=en_US. Jan. 10, 2019.
Formlabs, Inc. 2017. Usage and Design Guide: Ceramic Resin. January. https://formlabs.ib-caddy.com/assets/technical_data_sheet/formlabs_ceramic-usage-design-guide.pdf. Dec. 14, 2018.
Formlabs, Inc. 2018. Form 2: The Industry-Leading Desktop 3D Printer. https://formlabs.com/3d-printers/form-2/. Jan. 29, 2018.
Fraunhofer Institute for Solar Energy Systems. Fraunhofer Institute for Solar Photovoltaics report. Mar. 14, 2019. https://www.ise.fraunhofer.de/content/dam/ise/de/documents/publications/studies/Photovoltaics-Report.pdf. Jan. 13, 2018.
Frey, S. 2017. ND. Bottom-Up vs Top-Down vs Clip 3D Printing. The Ortho Cosmos. Mar. 22. https://theorthocosmos.com/bottom-vs-top-vs-clip-3d-printing/. Jan. 4, 2019.
Frellsen, A., 1987. Pate de verre process. MFA Thesis, Rochester Institute of Technology. Rochester, NY, United States.
Frost and Sullivan. 2010. Executive summary: Waste heat recovery opportunities in selected US Industrles. http://www.heatispower.org/wp-content/uploads/2011/10/Frost-and-Sullivan-on-waste-heat-recovery.pdf. Jan. 13, 2018.
frys.com. ND. Sunforce Coleman 60 Watt, 12-Volt Crystalline Solar Panel https://www.frys.com/product/8049924?site=sa:Electronic%20Components%20Pod:Pod5. Mar. 31, 2018.
Fujita, S. and Suzuki, A., 2011. Quantum theory of thermoelectric power (Seebeck coefficient). In Electromotive Force and Measurement in Several Systems. IntechOpen. https://www.intechopen.com/books/electromotive-force-and-measurement-in-several-systems/quantum-theory-of-thermoelectric-power-seebeck-coefficient-. Jun. 24, 2020.
Full Spectrum Laser. ND. Pegasus Touch by FSL3D. https://fslaser.com/Product/Pegasus3D. Dec. 4, 2018.
Funahashi, S., Nakamura, T., Kageyama, K. and Ieki, H., 2011. Monolithic oxide-metal composite thermoelectric generators for energy harvesting. Journal of Applied Physics, 109(12), p. 124509. https://aip.scitation.org/doi/pdf/10.1063/1.3599890. Mar. 31, 2018.
Funk, C. and Kennedy, B., 2016. The Politics of Climate. Pew Research Center: Internet. Science & Tech (Oct. 4). Available online at http://www.pewinternet.org/2016/10/04/the-politics-of-climate. Nov. 21, 2018.
Galbiati, M., Stoot, A.C., Mackenzie, D.M.A., Bøggild, P. and Camilli, L., 2017. Real-time oxide evolution of copper protected by graphene and boron nitride barriers. Scientific reports. 7. p. 39770. https://www.nature.com/articles/srep39770. Sep. 19, 2018.
Ganapathy, V., 1995. Recover heat from waste incineration. Hydrocarbon Processing, 74, pp. 51-51. http://www.angelfire.com/md3/vganapathy/incinhr.pdf. Accessed Jun. 29, 2020.
Gargaro, D., 2018. Public opinion on nuclear energy. https://raineycenter.org/wp-content/uploads/2018/07/PublicOpinionon-NuclearEnergy_PolicyPaper01.pdf. Nov. 21, 2018.
General Electric Company. ND. Thermopile IR Sensor Applications. http://426bb82d2999c9147474-eae010336623170ce70309697bb6e591.r89.cf3.rackcdn.com/UK_NOV_ZTP-115P_AN.pdf. Accessed Apr. 6, 2015.
Gentherm Global Power Technologies. ND. 1120 Thermoelectric Generator Operating Manual 02474 Rev. 7. http://www.genthermglobalpower.com/sites/default/files/product_files/02474%20rev7%20-%201120%20Manual%20GPT.pdf. Jan. 8, 2018.
Gentherm Global Power Technologies. ND. OEM Solutions. http://www.genthermglobalpower.com/content/oem-solutions. Jan. 8, 2018.
Gentherm Global Power Technologies. ND. Advantages of GPT's thermoelectric generators. http://www.genthermglobalpower.com/sites/default/files/product_files/Advantages%20%26%20TEG%20overview%20web.pdf. Dec. 27, 2017.
Gentherm Global Power Technologies. ND. Corporate overview. http://www.genthermglobalpower.com/sites/default/files/product_files/GPT_Overview_2018.pdf. Dec. 16, 2018.
Gentherm Global Power Technologies. ND. Say hello to the Model S-1100. http://www.genthermglobalpower.com/sites/default/files/pdfs/S-1100_Hello_w.pdf. Dec. 16, 2018.
German, R. 2014. Sintering: from empirical observations to scientific principles. Butterworth-Heinemann.https://www.sciencedirect.com/science/article/pii/B9780124016828000001. Apr. 15, 2018.
Ghasemi, H., Ni, G., Marconnet, A.M., Loomis, J., Yerci, S., Miljkovic, N. and Chen, G. 2014. Solar steam generation by heat localization. Nature communications, 5, p.ncomms 5449. https://discoverv.kaust.edu.sa/en/article/486/energv-efficiencv-on-a-roll. Jan. 19, 2019.

(56) References Cited

OTHER PUBLICATIONS

Gierth, P., Rebenklau, L., Augsburg, K., Bachmann, E. and Niedermeyer, L. 2018. Novel thermocouples for automotive applications. Journal of Sensors and Sensor Systems, 7(1), pp. 43-49. Göttingen, Germany.

Gillis, J. 2018. Why a Big Utility Is Embracing Wind and Solar. The New York Times. Feb. 6. https://www.nytimes.com/2018/02/06/opinion/utility-embracing-wind-solar.html?action=click&pgtype=Homepage&clickSource=story-heading&module=opinion-c-c%E2%80%A6. Feb. 6, 2018.

Gingerich, D.B. and Mauter, M.S. 2015. Quantity, quality, and availability of waste heat from United States thermal power generation. Environmental science & technology, 49(14), pp. 8297-8306. https://pubs.acs.org/doi/abs/10.1021/es5060989. May 17, 2018.

Ginley, D. Toberer, E., Warren, E., et al. N.D. High-temperature solar thermoelectric generators (STEG). ARPA-E. https://www.energy.gov/sites/prod/files/2014/01/f7/csp_review_meeting_042313_ginley.pdf. Dec. 21, 2018.

Gizmo 3D Printers. ND. https://www.gizmo3dprinters.com.au/3d-printers. Dec. 17, 2018.

Glass Fusing Made Easy. ND. Pate de Verre. https://www.glass-fusing-made-easy.com/pate-de-verre.html. Oct. 29, 2018.

Goehrke, S. A. 2017. Aerosint Brings Multi-Material Capabilities to Powder Bed 3D Printing. 3DPrint.com. https://3dprint.com/190661/aerosint-multi-material-3dp/. Feb. 27, 2018.

gofusing.com. ND. How to cast glass frit—3D glass. https://www.gofusing.com/blog/how-to-cast-glass-frit-3d-glass/. Aug. 11, 2018.

Goldfarb, R.J., 2014. Tellurium: The Bright Future of Solar Energy. US Department of the Interior, US Geological Survey, Reston, VA, United States.

Goldsmid, H., 2014. Bismuth telluride and its alloys as materials for thermoelectric generation. Materials, 7(4), pp. 2577-2592. Basel, Switzerland.

Goldsmid, H., 1964. Thermoelectric refrigeration. Springer. https://www.springer.com/us/book/9781489957252. Dec. 21, 2018.

Gosun.® ND. GoSun Sport® solar oven.https://www.gosun.co/products/gosun-sport. Jun. 3, 2018.

Graf, M-P., Holm, T., Malas, A. Wiberg S. ND. Furnace atmospheres No. 6: Sintering of steels. The Linde Group. http://www.linde-gas.com/en/legacy/attachment?files=tcm:s.17-460206,tcm:.17-460206,tcm:17-460206. Apr. 22, 2018.

Grainger Industrial Supply. ND. Portable and Inverter Generators. https://www.grainger.com/category/outdoor-equipment-electrical-generators-portable-and-Inverter-generators/ecatalog/N-1bxu/Ntt-inverter?sst=subset&ts_optout=true. Jan. 16, 2018.

Graziano, E. 1962. Thermoelectric Generators and Materials. Radiation effects, reliability, lifetime, and failure. An annotated bibliography (No. SB-61-60). Lockheed Missiles and Space Co., Inc., Sunnyvale, CA. United States.

Grebenkemper, J.H., Hu, Y., Barrett, D., Gogna, P., Huang, C.K., Bux, S.K. and Kauzlarich, S.M., 2015. High temperature thermoelectric properties of Yb14MnSb11 prepared from reaction of MnSb with the elements. Chemistry of Materials, 27(16), pp. 5791-5798. Washington, DC, United States.

Green, B.D. and Nix, R.G. 2006. Geothermal—the energy under our feet: Geothermal resource estimates for the United States (No. NREL/TP-840-40665). National Renewable Energy Lab.(NREL), Golden, CO (United States).

Gu, Y., Wu, A., Federici, J.F. and Zhang, X., 2017. Inkjet printable constantan ink for the fabrication of flexible and conductive film. Chemical Engineering Journal, 313, pp. 27-36. Amsterdam, Netherlands.

Günther, D. and Mögele, F., 2016. Additive manufacturing of casting tools using powder-binder-jetting technology. In New Trends in 3D Printing. IntechOpen. https://www.intechopen.com/books/new-trends-in-3d-printing/additive-manufacturing-of-casting-tools-using-powder-binder-jetting-technology. Oct. 28, 2019.

Gupta, B. and Shepherd, P., 1992. Data summary of municipal solid waste management alternatives (No. NREL/TP-431-4988C). National Renewable Energy Lab., Golden, CO (United States): SRI International. Menlo Park. CA (United States).

Hadhud, A. 2012. Design of reducing agent for sintering of high-performance alloyed PM steels based on different carbon grades analysis. Diploma work, (95). Chalmers University of Technology, Gothenburg, Sweden.

Hall, J.A. 1981. High temperature oxidation of sterling silver. Thesis. Rochester Institute of Technology. Rochester, NY, United States.

Han, J.H., 2011. Joining alumina ceramics in green state using a paste of ceramic slurry. Journal of Materials Processing Technology, 211(6), pp. 1191-1196. Jul. 2, 2018. Amsterdam, Netherlands.

Hand, M.M., Baldwin, S., Demeo, E., Reilly, J.M., Mai, T., Arent, D., Porro, G., Meshek, M. and Sandor, D., 2012. Renewable electricity futures study (entire report). National Renewable Energy Laboratory. Golden, CO, United States.

Harrington, K. 2016. Engineer making waste heat a major power source. AlChE. Jul. 29. https://www.aiche.org/chenected/2016/07/engineer-making-waste-heat-major-power-source. Feb. 17, 2018.

Harris, J.N. and Welsh, E.A., 1973. Fused silica design manual. AD-766494. United States Department of Commerce, National Technical Information Service. Springfield, VA, United States.

Harris Products Group. 2014. Brazing and Soldering: Serviceman's Guide. https://www.google.com/search?q=Harris+Products+Group.+2014.+Brazing+and+Soldering.turn+to+the+pros&rlz=1C5CHFA_enUS849US849&oq=Harris+Products+Group.+2014.+Brazing+and+Soldering.turn+to+the+pros&aqs=chrome..69i57.4918j0j8&sourceid=chrome&ie=UTF-8, May 24, 2018.

Harro-Höfliger. ND. Modu-C MS. https://www.hoefliger.com/en/machines/dosing-and-filling/modu-c-ms/. Dec. 4, 2018.

Hartman, N. R. 2015. Soldering paste. Seattle Findings. May 12. https://www.seattlefindings.com/Soldering-Paste_b_72.html. Jan. 24, 2019.

Hashim, H., Shariffudin, S.S., Saad, P.S.M. and Ridah, H.A.M., 2015. Electrical and optical properties of copper oxide thin films by sol-gel technique. In IOP Conference Series: Materials Science and Engineering (vol. 99, No. 1, p. 012032). IOP Publishing. Philadelphia, PA, United States.

Haugsrud, R., 2003. On the high-temperature oxidation of nickel. Corrosion Science, 45(1), pp. 211-235. Washington, DC, United States.

Hausner, H.H., 1961. Pressureless Compacting and Sintering Metal Powders. J. Metals, 13. New York, NY, United States.

He, J. and Tritt, T.M., 2017. Advances in thermoelectric materials research: Looking back and moving forward. Science, 357(6358). Washington, DC, United States.

He, B., Xu, G., Zhou, M. and Yuan, Q., 2016. Effect of oxidation temperature on the oxidation process of silicon-containing steel. Metals, 6(6), p. 137. Basel, Switzerland.

Hebert, S., 2012. Oxides for thermoelectricity. https://www.mrl.ucsb.edu/~seshadri/2012-SummerSchool-Talks/UCSB-2012-Hebert.pdf, Mar. 31, 2018.

Helferich, R.L. and Zanis, C.A., 1973. An Investigation of Yttrium Oxide as a Crucible Material for Melting Titanium, US Naval Ship Res. and Develop. Center Rep. 3911. United States Department of Commerce, National Technical Information Service. Springfield, VA.

Hendricks, T. and Choate, W.T., 2006. Engineering scoping study of thermoelectric generator systems for industrial waste heat recovery. Pacific Northwest National Lab. (PNNL), Richland, WA (United States).

Hendricks, T.J., Yee, S. and Leblanc, S., 2015. Cost scaling of a real-world exhaust waste heat recovery thermoelectric generator: a deeper dive. Journal of Electronic Materials, 45(3), pp. 1751-1761. New York, NY, United States.

Henrich, T. 2017. Rethinking flares and combustors. Alphabet Energy. Feb. 14. https://ngspb.com/wp-content/uploads/2017/02/Alphabet-Energy-February-2017.pdf. Feb. 11, 2018.

Henson, B. ND. Brazing flux 101. Harris Products Group. https://www.harrisproductsgroup.com/en/blog/2016/january/brazing-flux-101.aspx. Jan. 26, 2019.

(56) References Cited

OTHER PUBLICATIONS

Henson, B. ND. What is solidus and liquidus and why is it important to brazing? Harris Products Group. https://www.harrisproductsgroup.com/en/blog/2017/april/what-is-solidus-and-liquidus.aspx. Jan. 24, 2018.
Herring, D.H., 2010. Hydrogen embrittlement. Wire Forming Technology International, 13(4), pp. 24-27. http://www.heat-treat-doctor.com/documents/Hydrogen%20Embrittlement.pdf. Accessed Jul. 13, 2020.
Hess, D.J., Mai, Q.D. and Brown, K.P., 2016. Red states, green laws: ideology and renewable energy legislation in the United States. Energy Research & Social Science, 11, pp. 19-28. https://www.sciencedirect.com/science/article/pii/S221462961530030X. May 29, 2018.
Hijazi, H., Mokhiamar, O. and Elsamni, O., 2016. Mechanical design of a low cost parabolic solar dish concentrator. Alexandria Engineering Journal, 55(1), pp. 1-11. Amsterdam, Netherlands.
Hill, R. Jr. 2004. High Gas Velocity: A New Frontier of Cooling Performance in Vacuum Furnaces. Industrial Heating. March. http://solaratm.com/uploads/2015/06/6_heat-treat-velocity-bh-04.pdf. May 13, 2018.
Hi-Z Technology, Inc. ND. 14 watt module data sheet. http://hi-z.com/wp-content/uploads/2017/05/Data-Sheet-HZ-14.pdf. Jan. 12, 2018.
Hi-Z Technology, Inc. ND. 20 watt module data sheet. https://hi-z.com/wp-content/uploads/2017/05/Data-Sheet-HZ-20.pdf. Jan. 12, 2018.
Hoffert, M.I., Caldeira, K., Benford, G., Criswell, D.R., Green, C., Herzog, H., Jain, A.K., Kheshgi, H.S., Lackner, K.S., Lewis, J.S. and Lightfoot, H.D., 2002. Advanced technology paths to global climate stability: energy for a greenhouse planet. Science, 298(5595), pp. 981-987. Washington, DC, United States.
Hoffman, I.M., Goldman, C.A., Rybka, G., Leventis, G., Schwartz, L., Sanstad, A.H. and Schiller, S., 2017. Estimating the cost of saving electricity through US utility customer-funded energy efficiency programs. Energy Policy, 104, pp. 1-12. Amsterdam, Netherlands.
Holanda, R., 1984. Analysis of thermoelectric properties of high-temperature complex alloys of nickel-base, iron-base and cobalt-base groups. NASA Technical Paper 2278. February. Washington, DC, United States.
Holcomb, F.H., Parker, R.S., Hartranft, T.J., Preston, K., Sanborn, H.R. and Darcy, P.J., 2008. Proceedings of the 1st Army Installation Waste to Energy Workshop (No. ERDC/CERL-TR-08-11). Engineer Research and Development Center, Construction Engineering Lab, Champaign, IL. United States.
Holtzer, M., Gorny, M. and Danko, R., 2015. Microstructure and properties of ductile iron and compacted graphite iron castings: the effects of mold sand/metal interface phenomena. Springer. New York, NY, United States.
Howard, A. ND. Preventing glass bubbles. Paragon Industries. https://www.paragonweb.com/Kiln_Pointer.cfm?PID=109. Aug. 8, 2018.
Hranka, K. 2017. Hybrid printing could leave powder-bed 3D printing in the dust. Machine Design. Apr. 8. https://www.machinedesign.com/3d-printing/hybrid-printing-could-leave-powder-bed-3d-printing-dust. Jan. 1, 2018.
Hsu, C.T., Won, C.C., Chu, H.S. and Hwang, J.D., Oct. 2013. A case study of thermoelectric generator application on rotary cement furnace. In 2013 8th International Microsystems, Packaging, Assembly and Circuits Technology Conference (IMPACT) (pp. 78-81). IEEE. http://ieeexplore.ieee.org/document/6706644/?reload=true. Jan. 13, 2018.
Huang, K., Yan, Y., Li, B., Li, Y., Li, K. and Li, J., 2018. A novel design of thermoelectric generator for automotive waste heat recovery. Automotive Innovation, 1(1), pp. 54-61. New York, NY, United States.
Hung, T.C., 2001. Waste heat recovery of organic Rankine cycle using dry fluids. Energy Conversion and Management, 42(5), pp. 539-553. Amsterdam, Netherlands.
Hust, J.G. and Lankford A.B., 1984. Update of thermal conductivity and electrical resistivity of electrolytic iron, tungsten, and stainless steel. National Bureau of Standards Special Publication, 260, p. 71. Gaithersburg, MD, United States.
Hust, J.G. and Giarrantano, P.J., 1975. Thermal conductivity and electrical resistivity standard reference materials: electrolytic iron SRM's 734 and 797 from 4 to 1000 K (No. 260-50). US Dept. of Commerce, National Bureau of Standards. US Government Printing Office, Washington, DC, United States.
Hwang, H.K., Lee, G.W., Athar, T., Kim, S.J., Seo, W.S., Lim, Y.S., Choi, S.M. and Park, K., 2013. Influence of Sintering Temperature on the Microstructure and Thermoelectric Properties of Polycrystalline Fe1. 9925P0. 0075O3. Journal of nanoscience and nanotechnology, 13(1), pp. 405-408. https://www.ncbi.nlm.nih.gov/pubmed/23646746. Mar. 16, 2018.
I3D Mfg. ND. 3D Metal Printing—DMLM/DMLS. https://www.i3dmfg.com/3d-metal-printing-dmls-dmlm/. Apr. 13, 2018.
Ikeda, H. and Fujino, S., 2017, Fabrication and Characterization of Porous Silica Monolith by Sintering Silica Nanoparticles. Journal of Minerals and Materials Characterization and Engineering, 5(03). Wuhan, China.
Illinois Tool Works—ITW. ND. https://www.itweae.com/products/printers/momentum-hie. Jan. 1, 2018.
i.materialise.com. 2015. How 3D printing in ceramic really works. Jun. 5. https://i.materialise.com/blog/going-strong-how-3d-printing-in-ceramics-really-works/. Feb. 6, 2018.
International Energy Agency. 2017. CO2 Emissions from Fuel Combustion; International Energy Agency: Paris, France.
Isah, K.U., Bakeko, M., Ahmadu, U., Essang, U., Kimpa, M.I., Yabagi, J.A. 2013, Effect of oxidation temperature on the properties of copper oxide thin films prepared from thermally oxidised evaporated copper thin films. IOSR J. Appl. Phys, 3(2), pp.61-66. https://www.researchgate.net/publication/235981446_Effect_of_Oxidation_Temperature_on_the_Properties_of_Copper_Oxide_Thin_Films_Prepared_from_Thermally_Oxidised_Evaporated_Copper_Thin_Films/link/0c9605152b5e6e344c000000/download. Jul. 21, 2020.
Iskander, M.G., Liu, J. and Sadek, S., 2002. Transparent amorphous silica to model clay. Journal of Geotechnical and Geoenvironmental Engineering, 128(3), pp. 262-273. Reston, VA, United States.
Islak, S., Kir, D. and Buytoz, S., 2014. Effect of sintering temperature on electrical and microstructure properties of hot pressed cu-tic composites. Science of Sintering, 46(1). http://www.doiserbia.nb.rs/img/doi/0350-820X/2014/0350-820X1401015l.pdf. Jul. 21, 2020.
Jacquin, B., 1975. WRe5%/WRe26% thermocouples intended for high temperature measurement: manufacturing-properties (No. EUR--5395 (vol. 1). https://inis.iaea.org/search/searchsinglerecord.aspx?recordsFor=SingleRecord&RN=7246306. Dec. 12, 2018.
Jager, R.E., and Pollard, R.E. 1947. United States patents on powder metallurgy. National Bureau of Standards Monograph 106. July. United States Department of Commerce. Washington, DC: US Government Printing Office. United States.
Jeandin, M., and Bienvenu, Y. Koutny, J.L., ND. Liquid phase sintering of nickel base superalloys. https://www.tms.org/superalloys/10.7449/1984/Superalloys_1984_467_476.pdf. May 2, 2018.
Jiménez, J., Rojas, E. and Zamora, M., 1984. Design and construction of precision heat fluxmeters. Journal of Applied Physics, 56(11), pp. 3353-3356. Melville, NY, United States.
Johnson, I., Choate, W.T. and Davidson, A., 2008. Waste heat recovery. Technology and opportunities in US industry. United States Department of Energy and BCS, Inc., Laurel, MD (United States). https://www1.eere.energy.gov/manufacturing/intensiveprocesses/pdfs/waste_heat_recovery.pdf. Jan. 11, 2018.
Jones, N. 2018. Waste Heat: Innovators Turn to an Overlooked Renewable Resource. Yale Environment 360. May 29. https://e360.yale.edu/features/waste-heat-innovators-turn-to-an-overlooked-renewable-resource. May 31, 2018.
Jones, T., ND. Explosive nature of hydrogen in partial pressure vacuum. https://slideplayer.com/slide/4218068/. May 13, 2018.
Jones, T., 2009. Explosive nature of hydrogen in partial pressure vacuum. Heat Treating Progress, 9(1), pp. 43-46. Materials Park, OH, United States.

(56) References Cited

OTHER PUBLICATIONS

Jones, W.R. ND. Understanding vacuum furnace temperature measurement Issues. Solar Atmospheres, Inc. https://solaratm.com/uploads/2015/08/understanding-vacuum-furnace-temp-bill-jones-asm-webinar.pdf. May 12, 2018.

Jordan, L. and Eckman, J.R., 1925. Gases in metals: The determination of oxygen and hydrogen in metals by fusion in vacuum (No. 514). US Dept. of Commerce, Bureau of Standards. Washington, DC, United States.

Jordan, L. and Swanger, W.H., 1930. The properties of pure nickel. Bureau of Standards Journal of Research 10, p. 6028. Washington, DC, United States.

Joshi, S., Sundar, G., Rao, F., Ogrenci-Memik, S. and Grayson, M., 2017. Thin film Thermocouple Fabrication Procedure. Northwestern University, Technical Report NU-EECS-17-02, Evanston. IL. United States.

Kagawa, S., Sakamoto, M. and Hirayama, N., Aug. 1999. A practical test of a Bi—Te thermoelectric waste heat generator system in an incinerator using oil for heat transfer. In Eighteenth International Conference on Thermoelectrics. Proceedings, ICT'99 (Cat. No. 99TH8407) (pp. 321-324). IEEE. https://ieeexplore.ieee.org/abstract/document/843394. Dec. 30, 2018.

Kagel, A., Bates, D. and Gawell, K., 2005. A guide to geothermal energy and the environment. Geothermal Energy Association, Washington, DC (USA).

Kajihara, K., 2013. Recent advances in sol-gel synthesis of monolithic silica and silica-based glasses. Journal of Asian Ceramic Societies, 1(2), pp. 121-133. Philadelphia, PA, United States.

Kajikawa, T., Mar. 1996. Thermoelectric power generation systems recovering heat from combustible solid waste in Japan. In Fifteenth International Conference on Thermoelectrics. Proceedings ICT'96 (pp. 343-351). IEEE. https://ieeexplore.ieee.org/abstract/document/553504. Dec. 30, 2018.

Kanimba, E. and Tian, Z., 2016. Modeling of a Thermoelectric Generator Device. In Thermoelectrics for Power Generation—A Look at Trends in the Technology. InTech. https://www.intechopen.com/books/thermoelectrics-for-power-generation-a-look-at-trends-in-the-technology/modeling-of-a-thermoelectric-generator-device. Dec. 16, 2018.

Karpe, S., 2016. Thermoelectric power generation using waste heat of automobile. International Journal of Current Engineering and Technology, 4(4), pp. 144-148. http://inpressco.com/wp-content/uploads/2016/03/Paper31144-148.pdf. Accessed Jul. 21, 2020.

Karplus, V. 2018. Global energy: politics, markets and policy. Course syllabus, MIT Sloan School of Management. https://sloanbid.mit.edu/resources/15.2191.pdf. Dec. 1, 2018.

Kaplan, S. 2016. Here's How to Get Your Multi-Material Part Ready to Print. Xometry. Sep. 7. https://www.xometry.com/blog/heres-how-to-get-your-multi-material-part-ready-to-print. Feb. 6, 2018.

Kasap, S.O., 2006. Principles of electronic materials and devices (vol. 2). New York: McGraw-Hill. https://www.chegg.com/homework-help/seebeck-coefficient-pt-metals-table-411-gives-seebeck-coeffi-chapter-4-problem-24qp-solution-9780078028182-exc. Feb. 7, 2018.

Kaust Discovery. "Energy Efficiency on a Roll." Apr. 22, 2018. https://discovery.kaust.edu.sa/en/article/486/energy-efficiency-on-a-roll. Jul. 3, 2018.

Kawaoka, K. 1980. Military wastes-to-energy applications. The Aerospace Corporation. https://apps.dtic.mil/dtic/tr/fulltext/u2/a093042.pdf. Jul. 28, 2018.

Kecskes, L.J., Woodman, R.H., Trevino, S.F., Klotz, B.R. and Hirsch, S.G., 2003. The Sintering and Densification Behavior of an Iron Nanopowder Characterized by Comparative Methods (No. ARL-TR-2909). Army Research Lab, Aberdeen Proving Ground, MD Weapons and Materials Research Directorate. United States.

Keem, J.E. and Honig, J.M., 1978. Selected electrical and thermal properties of undoped nickel oxide (No. CINDAS-52). Thermophysical and Electronic Properties Information Analysis Center, Lafayette, IN. United States.

Keith High Temperature Thermal Processing Systems. 2017. Sintering Furnaces for Ceramic Matrix Composites (CMCs) and Metals. https://www.keithcompany.com/documents/Sintering-Furnaces-for-Ceramic-Matrix-Composites-CMS-Metals.pdf. Mar. 30, 2018.

Kelm, A.C. and Osterhild, C.M., 1913. Commercial Possiblilities of Thermopiles. University of Wisconsin-Madison. United States.

Kennedy, C.A., Stewart, I., Facchini, A., Cersosimo, I., Mele, R., Chen, B., Uda, M., Kansal, A., Chiu, A., Kim, K.G. and Dubeux, C., 2015. Energy and material flows of megacities. Proceedings of the National Academy of Sciences, 112(19), pp. 5985-5990. Washington, DC, United States.

Kerns, J. 2017. 3D Printing Dives into Mass Production. Machine Design. July 1.https://cdn.baseplatform.io/files/base/ebm/machinedesign/document/2019/04/machinedesign_10683_massprod_pdflayout.pdf Jul. 16, 2020.

Kidd, M.L., 2012. Watch out for those thermoelectric voltages. Cal Lab, 19 (April/May/June), pp. 18-21. Aurora, CO, United States.

Killander, A.J., 1996. Generating electricity for families in northern Sweden. The TRIZ Journal. http://triz-journal.com/generating-electricity-families-northern-sweden/. Apr. 6, 2015.

Kim, H.S., Liu, W., Chen, G., Chu, C.W. and Ren, Z., 2015. Relationship between thermoelectric figure of merit and energy conversion efficiency. Proceedings of the National Academy of Sciences, 112 (27), pp. 8205-8210. Washington, DC, United States.

Kim, N.S., Amert, A.K., Woessner, S.M., Decker, S., Kang, S.M. and Han, K.N., 2007. Effect of metal powder packing on the conductivity of nanometal ink. Journal of Nanoscience and Nanotechnology, 7(11), pp. 3902-3905. Valencia, CA, United States.

Kishore, R. and Priya, S., 2018. A Review on Low-Grade Thermal Energy Harvesting: Materials, Methods and Devices. Materials, 11(8), p. 1433. Basel, Switzerland.

Klick, H. and Smith, R.A.N., 2009. Public understanding of and support for wind power. In annual meeting of the American Association for Public Opinion Research, Hollywood, Florida. Retrieved from http://www.polsci.ucsb.edu/faculty/smith/Klick±Smith_wind.pdf. Nov. 21, 2018.

Klocke, F. and Ader, C., 2003. Direct laser sintering of ceramics. In Solid freeform fabrication symposium (pp. 447-455).https://sffsymposium.engr.utexas.edu/Manuscripts/2003/2003-43-Klocke.pdf. Nov. 11, 2019.

Kobbekaduwa, K.P.V.B. and Subasinghe, N.D., Oct. 2015. Thermoelectric Generation Using Industrial Grade Low-Cost Materials. In 2015 International Conference on Sustainable Energy and Environmental Engineering. Atlantis Press. Amsterdam, Netherlands.

Koehler, L. Powder Metallurgy Nickel and Nickel Alloys. 2015. In Samal, P.K. and Newkirk, J.W., ASM Handbook, vol. 7: Powder Metallurgy. ASM International, pp. 1-907. Materials Park, OH, United States.

Kopeliovich, D. ND. Methods of shape forming ceramic powders. Substech: Substances and Technologies. http://www.substech.com/dokuwiki/doku.php?id=methods_of_shape_forming_ceramic_powders. Sep. 22, 2018.

Korzhavyi, P.A. and Johansson, B. 2011. Literature review on the properties of cuprous oxide Cu2O and the process of copper oxidation (No. SKB-TR--11-08). Swedish Nuclear Fuel and Waste Management Co. https://inis.iaea.org/collection/NCLCollectionStore/_Public/43/041/43041487.pdf. Nov. 11, 2019.

Kotyrlo, G.K. and Shchegolev, G.M., 1974. Thermal Diagrams of Thermo-Electrical Devices (Selected Chapters) (No. FTD-MT-24-1778-74). Foreign Technology Division—Wright-Patterson AFB, OH, United States.

Kotz, F., Arnold, K., Bauer, W., Schild, D., Keller, N., Sachsenheimer, K., Nargang, T.M., Richter, C., Helmer, D. and Rapp, B.E., 2017. Three-dimensional printing of transparent fused silica glass. Nature, 544(7650), p. 337. New York, NY, United States.

Kowalewski, J. and Szczurek. ND. Issues in vacuum brazing. https://www.secowarwick.com/wp-content/uploads/2017/03/Issues-in-vacuum-brazing-VAC.pdf. Jun. 20, 2018.

Kramer, K.J., Masanet, E. and Worrell, E., 2010. Energy efficiency opportunities in the US pulp and paper industry. Energy engineering, 107(1), pp. 21-50. https:/escholarship.org/content/qt82m148b2/qt82m148b2.pdf. Feb. 1, 2018.

Kristiansen, N.R., Snyder, G.J., Nielsen, H.K. and Rosendahl, L., 2012. Waste heat recovery from a marine waste incinerator using a

(56) References Cited

OTHER PUBLICATIONS thermoelectric generator. Journal of Electronic Materials, 41(6), pp. 1024-1029. New York, NY, United States.

Kroon, R., Mengistie, D.A., Kiefer, D., Hynynen, J., Ryan, J.D., Yu, L. and Müller, C., 2016. Thermoelectric plastics; from design to synthesis, processing and structure-property relationships. Chemical Society Reviews, 45(22), pp. 6147-6164. http://pubs.rsc.org/-/content/articlehtml/2016/cs/c6cs00149a. Jan. 6, 2018.

Kruth, J.P., Mercelis, P., Van Vaerenbergh, J., Froyen, L. and Rombouts, M., 2005. Binding mechanisms in selective laser sintering and selective laser melting. Rapid prototyping journal, 11(1), pp. 26-36. https:/www.researchgate.net/profile/L_Froyen/publication/241699851_Binding_Mechanisms_in_Selective_Laser_Sintering_and_Selective_Laser_Melting/links/004635216434c7c575000000.pdf. Feb. 6, 2018.

Kruth, J.P., Froyen, L., Van Vaerenbergh, J., Mercelis, P., Rombouts, M. and Lauwers, B., 2004. Selective laser melting of iron-based powder. Journal of materials processing technology, 149(1-3), pp. 616-622. https://www.sciencedirect.com/science/article/pii/S0924013604002201. Apr. 15, 2018.

Kuo, C.H., Chien, H.S., Hwang, C.S., Chou, Y.W., Jeng, M.S. and Yoshimura, M., 2011. Thermoelectric properties of fine-grained PbTe bulk materials fabricated by cryomilling and spark plasma sintering. Materials Transactions, pp. 1103281331-1103281331. Sendai, Japan.

Kupkova, M. and Kupka, M., 2004. Theoretical Bounds on the Electrical Conductivity of Sintered Materials and Their Relation to Bounds on the Young's Modulus. Metalurgija, 43(3), p. 236. Zagreb, Croatia.

Kuznetsov, V.L., Kuznetsova, L.A., Kaliazin, A.E. and Rowe, D.M., 2002. High Performance functionally graded and segmented Bi2Te3-based materials for thermoelectric power generation. Journal of Materials Science, 37(14), pp. 2893-2897. New York, NY, United States.

Kyanite Mining Corporation. 2015. Virginia Mullite. https://img1.wsimg.com/blobby/go/ebb7581e-dbb3-43bf-8e6d-1530f95e5b72/downloads/Mullite%20Specification%20Sheet%204-2015.pdf?ver=1558100016388. Aug. 28, 2018.

Kyle, W.J., 1973. An economical electroplating bath and its use in the construction of thermopiles. Climatological Bulletin, p. 33. http://cmosarchives.ca/CB/cb14.pdf. Nov. 12, 2019.

L&L Special Furnace Company. ND. Atmospheric treating. https://llfurnace.com/atmospheric-treating/. May 12, 2018.

Lagrandeur, J. and Crane, D., 2012. Scientific and Technical Information (STI) for Financial Assistance and Non-M&O/M&I. BSST, LLC, Irwindale, CA (United States). https://www.osti.gov/servlets/purl/1165358. Nov. 12, 2019.

Laguna Clay. ND. How to . . . Make and adjust casting slip. http://www.lagunaclay.com/support/art-of-slipmaking.php. Sep. 23, 2018.

Lakshminarayan, U., Ogrydiziak, S. and Marcus, H.L., 1990. Selective laser sintering of ceramic materials. In 1990 International Solid Freeform Fabrication Symposium. https://sffsymposium.engr.utexas.edu/Manuscripts/1990/1990-03-Lakshiminarayan.pdf. Nov. 12, 2019.

Lakshmanan, A. ed., 2012. Sintering of ceramics: new emerging techniques. BoD—Books on Demand. https://www.intechopen.com/books/sintering-of-ceramics-new-emerging-techniques. Aug. 12, 2018.

Lal, A. and German, R.M., 2000. The role of viscosity during supersolidus liquid phase sintering. Dio, 50, p. D90. https://www.cavs.msstate.edu/publications/docs/2000/07/2532000-32.pdf. May 24, 2018.

Lall, C. and Starr, E., High Nickel Alloys Offering a Combination of High Strength and High Impact Properties. Metal Powder Products Company, 16855. https://www.mppInnovation.com/wp-content/uploads/2013/07/2013-PM-Conf_Chaman-Lall_High-Strength-Nickel-Alloys-Rev-July-22.pdf. Nov. 12, 2019.

Langnau, L. 2017. 3D print with copper and copper/nickel for electronic devices. May 2. http://www.makepartsfast.com/3d-print-copper-coppernickel-electronic-devices/. Dec. 26, 2017.

Angnau, L. 2017. HP kit helps users develop materials for its 3D printers. Makepartsfast.com. Mar. 28. https://www.makepartsfast.com/hp-kit-helps-users-develop-materials-3d-printers/. Feb. 8, 2018.

Lasance, J. M. 2006. The Seebeck coefficient. Electronics Cooling. https://www.electronics-cooling.com/2006/11/the-seebeck-coefficient/#. Jan. 23, 2018.

Laubscher, R. and Dobson, R.T. 2013. Theoretical and experimental modelling of a heat pipe heat exchanger for high temperature nuclear reactor technology. Applied Thermal Engineering, 61(2), pp. 259-267.https://www.sciencedirect.com/science/article/pii/S1359431113004882. Jun. 11, 2018.

Leblanc, S., 2014. Thermoelectric generators: Linking material properties and systems engineering for waste heat recovery applications. Sustainable Materials and Technologies, 1, pp. 26-35. Amsterdam, Netherlands.

Leblanc, S., Yee, S.K., Scullin, M.L., Dames, C. and Goodson, K.E. 2014. Material and manufacturing cost considerations for thermoelectrics. Renewable and Sustainable Energy Reviews, 32, pp. 313-327. Amsterdam, Netherlands.

Leheup, E.R. and Moon, J.R. 1978. Electrical conductivity changes during compaction of pure iron powder. Powder Metallurgy, 21(4), pp. 195-198. https://www.tandfonline.com/doi/abs/10.1179/pom.1978.21.4.195?journalCode=ypom20. Apr. 17, 2018.

Levasseur, D. and Brochu, M. 2016. Effect of heating rate on the pressureless sintering densification of a nickel-based superalloy. Metallurgical and Materials Transactions A, 47(5), pp. 2257-2266. Dec. 29, 2018.

Levasseur, D. 2015. The Effect of Green Density, Heating Rate and Pressure During Sintering of Inconel 718 (Doctoral dissertation, McGill University Libraries).http://digitool.library.mcgill.ca/R?func=dbin-jump-full&object_id=135485. Nov. 13, 2019.

Lemmens, S., May 2015. Waste heat recovery: potential, policy challenges and technology choices. In Energy Security, Technology and Sustainability Challenges Across the Globe, 38th IAEE International Conference, May 25-27, 2015. International Association for Energy Economics. https://www.researchgate.net/publication/301355250_Waste_heat_recovery_potential_policy_challenges_and_technology_choices. Nov. 13, 2019.

Lee, C.Y., Fang, L.H., Su, A., Jung, G.B., Huang, Y.T. and Liang, Y.C., 2015. Application of Screen Printing in Flexible Miniature Thermocouple Process Development. International Journal of Electrochemical Science, 10, pp. 3082-3087. Belgrade, Serbia.

Lee, R.T., Cheng, W.S., Lee, C.S., Lin, F.F. and Liu, F.H. 2017. Mullite Ceramic Fabrication by 3D Printing. Proceedings of the 7th International Conference on Mechanics and Materials in Design Albufeira/Portugal Jun. 11-15, 2017. https://paginas.fe.up.pl/~m2d/Proceedings_M2D2017/data/papers/6750.pdf. Accessed Nov. 13, 2019.

Li, F.M., Waddingham, R., Milne, W.I., Flewitt, A.J., Speakman, S., Dutson, J., Wakeham, S. and Thwaies, M., 2011. Low temperature (< 100° C.) deposited P-type cuprous oxide thin films: Importance of controlled oxygen and deposition energy. Thin Solid Films, 520(4), pp. 1278-1284. Amsterdam, Netherlands.

Li, J., Liang, X., Liou, F. and Park, J., 2018. Macro-/micro-controlled 3D lithium-ion batteries via additive manufacturing and electric field processing. Scientific Reports, 8(1), p. 1846, New York, NY, United States.

Li, J.F., Liu, W.S., Zhao, L.D. and Zhou, M., 2010. High-performance nanostructured thermoelectric materials. NPG Asia Materials, 2(4), p. 152. New York, NY, United States.

Lindeberg, M., Yousef, H., Rodjegård, H., Martin, H. and Hjort, K., 2008. A PCB-like process for vertically configured thermopiles. Journal of Micromechanics and Microengineering, 18(6), p. 065021. Philadelphia, PA, United States.

Lindley, D., 2009, The energy should always work twice. Nature News, 458(7235), pp. 138-141. New York, NY, United States.

Lindsley, B., 2008. Sintering of chromium containing PM steels processed to high density. http://www.yunamedia.com/GKNPLCHC.com/KyungHoeganae/TechPapersv2/PowderMet2008/0168LindsleySinteringofCr-containingPMsteels.pdf. May 2, 2018.

Liu, L., 2014. Feasibility of large-scale power plants based on thermoelectric effects. New Journal of Physics, 16(12), p. 123019. Philadelphia, PA, United States.

(56) References Cited

OTHER PUBLICATIONS

Liu, C., Chen, P. and Li, K., Feb. 2014. A 1 KW thermoelectric generator for low-temperature geothermal resources. In Proceedings, Thirty-Ninth Workshop on Geothermal Reservoir Engineering, Stanford University, Stanford, CA, United States.
Liu, K., Sun, H., Tan, Y., Shi, Y., Liu, J., Zhang, S. and Huang, S., 2017. Additive manufacturing of traditional ceramic powder via selective laser sintering with cold isostatic pressing. The International Journal of Advanced Manufacturing Technology, 90(1-4), pp. 945-952. https://link.springer.com/article/10.1007/s00170-016-9441-3. Feb. 6, 2018.
Liu, W. and Xie, Z., 2014. Pressureless sintering behavior of injection molded alumina ceramics. Science of Sintering, 46(1). New York, NY, United States.
Locker, A. 2017. 2018 Ceramic 3D Printer Guide—All About Ceramic 3D Printing. All3DP. https://all3dp.com/1/3d-printing-ceramic-3d-printer/. Nov. 13, 2019.
Locker, A. 2016. Formlabs Form 2 Review: The SLA 3D Printer Benchmark. All3DP.com. Aug. 10. https://all3dp.com/formlabs-form-2-review-price-sla-3d-printer/. May 9, 2018.
Lu, X., 2014. Thermoelectric Properties of Natural Mineral Based Tetrahedrite Compounds. Doctoral dissertation, Michigan State University. East Lansing, MI, United States.
Lucas-Milhaupt. ND. SIL-FOS 15. https://www.lucasmilhaupt.com/EN/Products/SIL-FOS-15.htm. Jan. 25, 2019.
Lucas-Milhaupt. ND. Silvaloy 560. https://www.lucasmilhaupt.com/EN/Products/SILVALOY560.htm. Jan. 25, 2019.
Lund, C.H. and Wagner H.J. 1965. Oxidation of nickel and cobalt-base superalloys (No. DMIC-214). Batelle Memorial Institute, Defense Metals Information Center. Columbus, OH, United States.
madehow.com. ND. Ceramic filter. http://www.madehow.com/Volume-5/Ceramic-Filter.html. Sep. 22, 2018.
Madur. ND. "Thermocouples." http://www.madur.com/pdf/article/en/Thermocouples_EN.pdf. Feb. 8, 2018.
Mahan, G.D., 2016. Introduction to thermoelectrics. APL Materials, 4(10), p. 104806. Melville, NY, United States.
Makena, I.M., Shongwe, M.B., Ramakokovhu, M.M. and Lethabane, M.L., 2017. A Review on Sintered Nickel based Alloys. In Proceedings of the World Congress on Engineering (vol. 2). http://www.iaeng.org/publication/WCE2017/WCE2017_pp922-927.pdf. Feb. 14, 2019.
Malas, A and Feldbauer, S. L. ND. Gassing up to get the right atmosphere. Abbott Furnace Company. https://abbottfurnaceco.com/wp-content/uploads/2017/10/Gassing-Up-to-Get-The-Right-Atmosphere.pdf. Jun. 20, 2018.
Mamunya, Y.P., Zois, H., Apekis, L. and Lebedev, E.V., 2004. Influence of pressure on the electrical conductivity of metal powders used as fillers in polymer composites. Powder Technology, 140(1-2), pp. 49-55. Amsterdam, Netherlands.
Markforged. ND. Furnace specifications: Sinter-1, F-SR-0001. https://agile-manufacturing.com/wp-content/uploads/2019/08/metal-x-995296.pdf. Nov. 15, 2019.
Marjon Ceramics, Inc. ND. The art of slipmaking. http://www.marjonceramics.com/pages/Tips/slipmaking.htm. Sep. 23, 2019.
Market Research Future. ND. Global Thermoelectric Generator Market Research Report—Forecast to 2022. https://www.marketresearchfuture.com/reports/thermoelectric-generator-market-1845. Apr. 29, 2018.
Marnay, C., Asano, H., Papathanassiou, S. and Strbac, G., 2008. Policymaking for microgrids. IEEE Power and Energy Magazine, 6(3), pp. 66-77. Piscataway, NJ, United States.
Martin, J., Tritt, T. and Uher, C., 2010. High temperature Seebeck coefficient metrology. Journal of Applied Physics, 108(12), p. 14. Melville, NY, United States.
Matterhackers. ND. Lay Ceramic filament. https://www.matterhackers.com/store/l/layceramic-3.00mm/sk/M7RE5J6P. Apr. 17, 2018.
Matterhackers. ND. Peopoly Moai Laser SLA 3D Printer—Fully Assembled https://www.matterhackers.com/store/l/peopoly-moai-laser-sla-3d-printer-fully-assembled/sk/M2513KLL?rcode=GAT9HR&gclid=EAIaIQobChMI89v_roSH3wIV%E2%80%A6. Dec. 4, 2018.

Matteucci, F., Dondi M. and Guarini, G., 2002. Effect of soda-lime glass on sintering and technological properties of porcelain stoneware tiles. Ceramics International, 28(8), pp. 873-880. Amsterdam. Netherlands.
May, A.F., Fleurial, J.P. and Snyder, G.J., 2008. Thermoelectric performance of lanthanum telluride produced via mechanical alloying. Physical Review B, 78(12), p. 125205. College Park, MD, United States.
Mcadam Jr., D.J. and Geil, G.W., 1942. Rate of oxidation of typical nonferrous metals as determined by interference colors of oxide films. Journal of Research of the National Bureau of Standards, 28(5), pp. 593-635. Washington, DC, United States.
Mclure, P.R., Poston, D.I., Dasari, V.R. and Reid, R.S., 2015. Design of megawatt power level heat pipe reactors (No. LA-UR-15-28840). Los Alamos National Lab.(LANL), Los Alamos, NM, United States.
medium.com. 2018. Announcing the Ceramo One, a high-precision 3D printer for manufacturing ceramics. Jan. 22. https://medium.com/@Kwambio/introducing-ceramo-one-ceramics-binder-jetting-3d-printer-94875a9ae6c. Aug. 6, 2018.
Meisner, G.P. Oct. 2011. Thermoelectric Conversion of Exhaust Gas Waste Heat into Usable Electricity. In Proc. 2011 Directions in Engine-Efficiency and Emissions Research (DEER) Conference, Detroit, Michigan. https://www.energy.gov/sites/prod/files/2014/03/18/deer11_meisner.pdf. Nov. 15, 2019.
Melnikov, A., 2016. Powder metallurgy for thermoelectrics. Metal powder report, 71(4), pp. 279-284. https://www.materialstoday.com/powder-applications/features/powder-metallurgy-for-thermoelectrics/. Dec. 29, 2017.
Metal AM. ND. Metal Additive Manufacturing processes. https://www.metal-am.com/introduction-to-metal-additive-manufacturing-and-3d-printing/metal-additive-manufacturing-processes/. Dec. 29, 2017.
Metallux. 2014. Hybrid circuits technology: a brief outline. September. https://nanopdf.com/download/hybrid-circuits-technology_pdf. Jan. 1, 2018.
Metal Powder Industries Federation. ND. Making metal powder. https://www.mpif.org/IntrotoPM/MakingMetalPowder.aspx. May 29, 2018.
Metlab. ND. Heat treating parts from less than 1 pound to 25 tons. https://www.metlabheattreat.com/index.html. May 23, 2018.
Midwest Prototyping, LLC. ND. Case studies: An in-depth look at the benefits of additive manufacturing. https://www.midwestproto.com/Case-Studies. Apr. 9, 2018.
Milewski, J.O. 2017. Additive manufacturing of metals: from fundamental technology to rocket nozzles, medical implants, and custom jewelry. Springer. Cham, Switzerland.
Millenium Circuits Limited. ND. Printed Circuit Board Layer Stack. https://www.mclpcb.com/pcb-capabilities/pcb-layer-stack/. Jan. 1, 2018.
Miro, L., Bruckner, S. and Cabeza, L.F., 2015. Mapping and discussing Industrial Waste Heat (IWH) potentials for different countries. Renewable and Sustainable Energy Reviews, 51, pp. 847-855. https://repositori.udl.cat/bitstream/handle/10459.1/58575/022995.pdf?sequence=1&isAllowed=n. Nov. 18, 2019.
Mitchell, C. and Connor, P., 2004. Renewable energy policy in the UK 1990-2003. Energy Policy, 32(17), pp. 1935-1947. Amsterdam, Netherlands.
Molitch-Hou, M. 2017. SPEE3D Puts Supersonic Speed in Metal 3D Printing. Jul. 26. Engieering.comhttps://new.engineering.com/story/spee3d-puts-supersonic-speed-in-metal-3d-printing. Nov. 18, 2019.
Montecucco, A., Siviter, J. and Knox, A.R., 2014. The effect of temperature mismatch on thermoelectric generators electrically connected in series and parallel. Applied Energy, 123, pp. 47-54. Amsterdam, Netherlands.
Monteiro, W.A., Carrio, J.A.G., Masson, T.J., Abreu, C.D., Marques, I.M. and Da Silva, L.C.E., 2010. Microstructure and microanalysis studies of copper-nickel-tin alloys obtained by conventional powder metallurgy processing. In Materials Science Forum (vol. 660, pp. 29-34). Trans Tech Publications. Baech, Switzerland.
Monteiro, W.A., Carrio, J.A.G., Carvalhal, M.A., Okazaki, A.K., Da Silveira, C.R. and Martins, M.V.S., 2013. Sintering of Ternary

(56) References Cited

OTHER PUBLICATIONS

Copper Alloys (Powder Metalurgy)—Electrical and Mechanical Properties Effects. In Sintering Applications. IntechOpen. London, United Kingdom.
Montes, J., Cueavas, F., Ternero, F., Astacio, R., Caballero, E. and Cintas, J., 2017. A Method to Determine the Electrical Resistance of a Metallic Powder Mass under Compression. Metals. 7(11). p. 479. Basel, Switzerland.
Montes, J.M., Cuevas, F.G., Cintas, J. and Gallardo, J.M., 2016. Electrical conductivity of metal powder aggregates and sintered compacts. Journal of Materials Science, 51(2), pp. 822-835. https://link.springer.com/article/10.1007/s10853-015-9405-2. Apr. 15, 2018.
Montes, J.M., Cuevas, F.G., Cintas, J. Porosity effect on the electrical conductivity of sintered powder compacts. Applied Physics A. Aug. 1, 2008;92(2):375-80. New York, NY, United States.
Morcos, V.H., 1989. Energy recovery from municipal solid waste incineration—A review. Heat Recovery Systems and CHP, 9(2), pp. 115-126. https://www.sciencedirect.com/science/article/pii/0890433289900756. Dec. 30, 2018.
Morrisette, M. 2015. Comparing 3D Printing Processes. Oct. 19. https://www.xometry.com/blog/3d-printing-processes. Feb. 7, 2018.
Mortland, J.E., Evans, R.M. and Monroe, R.E., 1972. Welding and brazing of nickel and nickel-base alloys. NASA report SP-5101. Washington, DC, United States.
Mueller, S. 2006. Missing the spark: An investigation into the low adoption paradox of combined heat and power technologies. Energy Policy, 34(17), pp. 3153-3164. Amsterdam, Netherlands.
Muller-Steinhagen, H. 2013. Concentrating solar thermal power. Philosophical Transactions of the Royal Society A: Mathematical, Physical and Engineering Sciences, 371(1996), p. 20110433. London, United Kingdom.
Muhammad, U.K. and Umar, S. 2013. Experimental performance investigations and evaluation of base metals thermocouples. International Journal of Modern Applied Physics, 3(1), pp. 26-37. Weston, FL. United States.
Murr, L.E., Staudhammer, K.P., and Meyers, M.A., eds. 1986. Metallurgical Applications of Shock-Wave and High-Strain Rate Phenomena. 1st Edition. CRC Press. Dec. 14, 2018., p. 315. https://books.google.com/books?id=7Qu5njtu2SoC&pg=PA317&dq=powder+%2B+constantan&hl=en&ppis=_c&sa=X&ved=2ahUKEwii6PXPnPnlAhXppVkKHR5DDscQ6AEwAHoECAIQAg#v=onepage&q=powder%20%2B%20constantan&I=false. Dec. 14, 2018.
Myers, M., Sep. 2009. The performance implications of silver as a contact finish in traditionally gold finished contact applications. In 2009 Proceedings of the 55th IEEE Holm Conference on Electrical Contacts (pp. 310-318). IEEE. Piscataway, NJ, United States.
Nakako, H., Ishikawa, D., Sugama, C., Kawana, Y., Negishi, M, and Ejiri, Y. ND. Sintering Cu bonding paste that can be sintered without pressure. Hitachi Chemical Technical Report No. 60. https://www.hitachi-chem.co.jp/english/report/060/60_tr10.pdf. Apr. 15, 2018.
Narasimhan, K.S. and Semel F.J., 2007. Sintering of powder premixes—A brief overview. Hoeganaes Corporation. Paper No. 2007. 01-0145. https://www.researchgate.net/profile/F_Semel/publication/237732467_SINTERING_OF_POWDER_PREMIXES_-_A_BRIEF_OVERVIEW/llinks/5694719c08ae3ad8e33b75fc.pdf. May 2, 2018.
National Academies 2011. 2011. Energy Sustainability: A Focus on Waste Heat Recovery. Meeting Summary, Nov. 29. https://sites.nationalacademies.org/cs/groups/pgasile/documents/webpage/pga_070439.pdf. Dec. 31, 2018.
National Action Plan for Energy Efficiency (2008). National Action Plan for Energy Efficiency Vision for 2025: A Framework for Change. https://www.epa.gov/sites/production/files/2015-08/documents/vision.pdf. Nov. 21, 2019.
National Basic Sensor. ND. Technical Reference. http://www.nationalbasicsensor.com/Technical-Reference1.pdf. Jan. 13, 2019.
National Research Council (US). Committee on Coatings, 1970. High-temperature oxidation-resistant coatings: coatings for protection from oxidation of superalloys, refractory metals, and graphite. National Academies Press. Washington, DC, United States.
Neely, J.E. 1989. Practical metallurgy and materials of industry. Third edition. Prentice-Hall. Upper Saddle River, NJ, United States.
Netzsch. ND.Thermoelectric Materials: Material Characterization, Phase Changes, Thermal Conductivity. Brochure. https://pdf.directindustry.com/pdf/netzsch-geraetebau-gmbh/thermoelectric-materials-application-brochure/39926-128367.html. Nov. 21, 2019.
New Mexico Clay, Inc. ND. Art clay silver 950. https://silver-clay.com/art-clay-silver-950-50-grams.html. Nov. 21, 2019.
Nimbalkar, S., 2015. Waste Heat Recovery from Industrial Process Heating Equipment. Oak Ridge National Laboratory, 20. https://docplayer.net/27604257-Waste-heat-recovery-from-industrial-process-heating-equipment.html. Nov. 21, 2019.
Northwestern University Department of Materials Science and Engineering. "Thermoelectrics." ND. http://thermoelectrics.matsci.northwestern.edu/thermoelectrics/index.html. Dec. 16, 2018.
Norton, H.N., 1969. Handbook of transducers for electronic measuring systems. Prentice-Hall. Upper Saddle River, NJ, United States.
Novacentrix. ND. nScrypt Deposition Platform. https://www.novacentrix.com/sites/default/files/pdf/Integrated%203D%20Fabrication%20%26%20Printed%20Electronics%20Tool.PDF. Feb. 27, 2018.
Ntasi, A., Al Jabbari, Y.S., Silikas, N., Al Taweel, S.M. and Zinelis, S., 2014. Metallurgical characterization of experimental Ag-based soldering alloys. The Saudi Dental Journal, 26(4), pp. 139-144. Amsterdam, Netherlands.
Nuruzzaman, D.M., Kamaruzaman, F.F. and Azmi, N.M., 2016. Effect of Sintering Temperature on the Properties of Aluminium-Aluminium Oxide Composite Materials. International Journal of Engineering Materials and Manufacture, 1(2), pp. 59-64. Kuala Lumpur, Malaysia.
Nvbots. 2016. Nvbots Introduces Ultra-High-Speed, Multi-Metal 3D Printing Technology for Commercial Use through Alpha Program. Feb. 25. https://nvbots.com/news/nvbots-introduces-ultra-high-speed-multi-metal-3d-printing-technology-for-commercial-use-through-alpha-program/. Apr. 13, 2018.
Nvbots. 2016. NVPro. https://nvbots.com/hardware/. Feb. 27, 2018.
Ogwu, A.A., Darma, T.H. and Bouquerel, E. 2007. Electrical resistivity of copper oxide thin films prepared by reactive magnetron sputtering. Journal of Achievements in Materials and Manufacturing Engineering, 24(1), pp. 172-177. Gliwice, Poland.
O'Halloran, S. and Rodrigues, M.M., 2012, AC 2012-3976: Power and efficiency measurement in a thermoelectric generator. American Society for Engineering Education. Washington, DC, United States.
O'Kane, S. 2018. Three US states will spend $1.3 billion to build more electric vehicle charging. Jun. 1. The Verge. https://www.theverge.com/2018/6/1/17416778/california-new-york-electric-charging-investment-stations. Jun. 2, 2018.
Olsen, M.L., Warren, E.L., Parilla, P.A., Toberer, E.S., Kennedy, C.E., Snyder, G.J., Firdosy, S.A., Nesmith, B., Zakutayev, A., Goodrich, A. and Turchi, C.S., 2014. A high-temperature, high-efficiency solar thermoelectric generator prototype. Energy Procedia, 49, pp. 1460-1469. Amsterdam, Netherlands.
Olson-Hazboun, S.K., 2017. Public opinion on renewable energy: The nexus of climate, politics, and economy. Dissertation, Utah State University. Logan, UT, United States.
Omega Engineering. ND. Physical properties of thermoelement materials. https://www.omega.com/temperature/z/pdf/z016.pdf. Jan. 12, 2018.
Omega Engineering, ND. ANSI and IEC color does for thermocouples, wire and connectors. ND. https://www.omega.com/temperature/pdf/tc_colorcodes.pdf. Nov. 25, 2019.
Optomec. ND. Aerosol Jet 5X Systems. https://www.optomec.com/printed-electronics/aerosol-jet-printers/aerosol-jet-5x-system/. Jan. 8, 2018.
Orcutt, M. 2016. One 3-D Printer for 21 Metals. MIT Technology Review. Feb. 25. https://www.technologyreview.com/s/600876/one-3-d-printer-for-21-metals/. Feb. 27, 2018.
Orr, B., Akbarzadeh, A., Mochizuki, M. and Singh, R., 2016. A review of car waste heat recovery systems utilising thermoelectric generators and heat pipes. Applied Thermal Engineering, 101, pp. 490-495. Amsterdam, Netherlands.

(56) References Cited

OTHER PUBLICATIONS

Orr, B. and Akbarzadeh, A., 2017. Prospects of waste heat recovery and power generation using thermoelectric generators. Energy Procedia, 110, pp. 250-255. Amsterdam, Netherlands.

Orrill, M. and Leblanc, S., 2017. Printed thermoelectric materials and devices: Fabrication techniques, advantages, and challenges. Journal of Applied Polymer Science, 134(3). Somerset, NJ, United States.

Ostfeld, A.E., Deckman, I., Gaikwad, A.M., Lochner, C.M. and Arias, A.C., 2015. Screen printed passive components for flexible power electronics. Scientific Reports, 5, p. 15959. New York, NY, United States.

Otoma, S., Mori, Y., Terazono, A., Aso, T. and Sameshima, R., 1997. Estimation of energy recovery and reduction of CO2 emissions in municipal solid waste power generation. Resources, Conservation and Recycling, 20(2), pp. 95-117. Amsterdam, Netherlands.

Ouyang, Z. and Li, D., 2016. Modelling of segmented high-performance thermoelectric generators with effects of thermal radiation, electrical and thermal contact resistances. Scientific Reports, 6, p. 24123. New York, NY, United States.

Pahl, M. and Hjalmarson, L. 2015. On-Site Power: New Options for Wellhead & Gathering Compression. Alphabet Energy, Inc. https://www.epa.gov/sites/production/files/2016-04/documents/16hjalmarsonpahl.pdf. Nov. 25, 2019.

Pak, P.S., 2007. Comprehensive evaluation of repowering systems for utilizing waste heat from small scale garbage incineration plants. IEEJ Transactions on Power and Energy, 127(7), pp. 776-782. Somerset, NJ, United States.

Panda, A., Dobransky, J., Jancik, M., Pandova, I. and Kacalova, M., 2018. Advantages and effectiveness of the powder metallurgy in manufacturing technologies. Metalurgija, 57(4), pp. 353-356. Zagreb, Croatia.

Pandit, J., Thompson, M., Ekkad, S.V. and Huxtable, S., Jul. 2013. Experimental Investigation of Heat Transfer Across a Thermoelectric Generator for Waste Heat Recovery From Automobile Exhaust. In ASME 2013 Heat Transfer Summer Conference collocated with the ASME 2013 7th International Conference on Energy Sustainability and the ASME 2013 11th International Conference on Fuel Cell Science, Engineering and Technology. http://proceedings.asmedigitalcollection.asme.org/proceeding.aspx?articleid=1795315. Jan. 6, 2018.

Panigrahi, B.B., Das, K. and Godkhindi, M.M., 2007. Dilatometry of Ball Milled Nickel Nano Powder during Non-Isothermal Sintering. Science of Sintering, 39(1). New York, NY, United States.

Patterson, M.G., 1996. What is energy efficiency?: Concepts, indicators and methodological issues. Energy policy, 24(5), pp. 377-390. https://www.sciencedirect.com/science/article/pii/0301421596000171.May 27, 2018.

Paulsen, J.A. and Renn, M.J., 2006. Maskless Printing of Miniature Polymer Thick Film Resistors for Embedded Applications. http://www.optomec.com/wp-content/uploads/2014/04/Optomec_Maskless_Printing_of_Resistors_for_Embedded_Applications.pdf. Jan. 8, 2018.

Pavlas, M. and Tous, M., 2009. Efficient waste-to-energy system as a contribution to clean technologies. Clean Technologies and Environmental Policy, 11(1), pp. 19-29. https://link.springer.com/article/10.1007/s10098-008-0173-4. Dec. 31, 2018.

Pavlas, M., Tous, M., Klimek, P. and Bebar, L., 2011. Waste incineration with production of clean and reliable energy. Clean Technologies and Environmental Policy, 13(4), pp. 595-605. https://link.springer.com/article/10.1007/s10098-011-0353-5. Dec. 30, 2018.

Pavlas, M., Tous, M, Bebar, L. and Stehlik, P., 2010. Waste to energy—An evaluation of the environmental impact. Applied Thermal Engineering, 30(16), pp. 2326-2332. ttps://www.sciencedirect.com/science/article/pii/S1359431109003184. Dec. 30, 2018.

Pavlik, C. 2016. Mold Release Application Guide—Troubleshooting Guide—ReleaSys.™ Oct. 24.https://miller-stephenson.com/mold-release-application-guide/. Sep. 21, 2018.

Penn, I. 2018. Cheaper Battery Is Unvelled as a Step to a Carbon-Free Grid. The New York Times. Sep. 26. https://www.nytimes.com/2018/09/26/business/energy-environment/zinc-battery-solar-power.html. Sep. 27, 2018.

Pereira, D., Biasibetti, G.R.S., Camerini, R.V. and Pereira, A.S., 2014. Sintering of mullite by different methods. Materials and Manufacturing Processes, 29(4), pp. 391-396. Philadelphia, PA, United States.

Perry, S., Klemes, J. and Bulatov, I., 2008. Integrating waste and renewable energy to reduce the carbon footprint of locally integrated energy sectors. Energy, 33(10), pp. 1489-1497. Amsterdam, Netherlands.

Perpetua Power Source Technologies, Inc. 2014. Power TileTM Energy Harvester. https://perpetuapower.com/wp-content/uploads/2016/03/Power_Tile_PDS-.pdf. Apr. 6, 2015.

Phillips, G.C. 1991. A concise introduction to ceramics. Van Nostrand Reinhold. New York, NY, United States.

Pound, W., 2010. Meeting the Energy Challenges of the Future: A Guide for Policymakers. National Conference of State Legislators. http://www.ncsl.org/research/energy/meeting-the-energy-challenges-of-the-future.aspx. Nov. 21, 2018.

Powell, R.W., Ho, C.Y. and Liley, P.E., 1966. Thermal conductivity of selected materials (vol. 8). NSRDS-NBS 8. US Department of Commerce, National Bureau of Standards. Washington, DC, United States.

Praxair. ND. Shielding gases selection manual. https://www.scribd.com/document/334338465/Praxair-Shielding-Gas-Manual. Apr. 21, 2018.

Press, M. and Arnould, E.J., 2009. Constraints on sustainable energy consumption: market system and public policy challenges and opportunities. Journal of Public Policy & Marketing, 28(1), pp. 102-113. Washington, DC, United States.

PROTO3000. ND. Polyjet Matrix 3D Printing Services. https://proto3000.com/polyjet-matrix-3D-printing-technology-services.php. Jan. 15, 2018.

Proto Labs, Inc. ND. Prototyping with PolyJet 3D Printing. https://www.protolabs.com/resources/design-tips/prototyping-with-polyjet-3d-printing/. Feb. 6, 2018.

Roto Labs, Inc. ND. Material Comparison Guide. https://www.protolabs.com/materials/comparison-guide/?filter=3d-printing-materials. Feb. 6, 2018.

Purhoit, K., Meena, P.M., Singh, K., Jain, S.K. and Dadhich, M., 2016. Review paper on optimizations of thermoelectric system. International Journal of Innovative Research in Engineering & Management (IJIREM), 3, pp. 259-263. Kalyanpur, India.

Pyda, W. ND. Theory and practice of ceramic processes. Lecture 4:Preparation of ceramic powders. http://home.agh.edu.pl/~nmos1/TPCP/TPCP-Lecture_4_TPCP_2011_Powder-Preparation.pdf. Sep. 22, 2018.

Quick, D. 2012. World's most efficient thermoelectric material developed. Sep. 20. http://www.gizmag.com/most-efficient-thermoelectric-material/24210/. Apr. 12, 2015.

Ragossnig, A.M., Wartha, C. and Kirchner, A., 2008. Energy efficiency in waste-to-energy and its relevance with regard to climate control. Waste Management & Research, 26(1), pp. 70-77. https://journals.sagepub.com/doi/abs/10.1177/0734242X07087655. Dec. 6, 2019.

Rahman, M.M., Nor, S.S.M. and Rahman, H.Y., 2012. The Effects of Sintering Schedule to the Final Properties of Iron Powder Compacts Formed through Warm Compaction Route. International Journal on Advanced Science, Engineering and Information Technology, 2(3), pp. 241-245. Padang, Indonesia.

Rawat, P.K., Paul, B. and Banerji, P., 2013. Lead telluride based thermoelectrics: Approaches for higher efficiency. In Méndez-Vilas, A., 2013. Materials and Processes for Energy: Communicating Current Research and Technological Development. Formatex Research Center: Badajoz, Spain.

Ray, R. 2016. Power Plant Performance in 2015. Natural gas use climbs in US as power producers switch fuels. Power Engineering. Dec. 22. https://www.power-eng.com/articles/print/volume-120/issue-12/features/power-plant-performance-In-2015.html. Feb. 8, 2018.

(56) References Cited

OTHER PUBLICATIONS

RCA. 1969. Silicon Germanium Thermoelectric Materials and Module Development Program (U). Topical Report. Contract AT (29-2)-2510. US Atomic Energy Commission. Springfield, VA. United States.
Recktenwald, G., 2010. Conversion of thermocouple voltage to temperature. Mechanical and Materials Engineering Department, Portland State University, Portland, Oregon. http://web.cecs.pdx.edu/~gerry/epub/pdf/thermocouple.pdf. Dec. 10, 2019.
Recycling Magazine. 2018. Massive growth for waste heat to power market. Jan. 2. https://www.recycling-magazine.com/2018/02/01/massive-growth-waste-heat-power-market/. Feb. 12, 2018.
Reed, R.P., 2014. Thermocouple Junctions Are Not Voltage Sources. https://slidex.tips/download/thermocouple-junctions-are-not-voltage-sources. Dec. 10, 2019.
Rein, M. 2011. Clearing the air on carbon firing. Art Jewelry. http://www.tgmetalarts.com/wp-content/uploads/2014/06/ClearingAirCarbonFiring.pdf. May 25, 2018.
Reinsch, T., Dobson, P., Asanuma, H., Huenges, E., Poletto, F. and Sanjuan, B., 2017. Utilizing supercritical geothermal systems: a review of past ventures and ongoing research activities. Geothermal Energy, 5(1), p. 16. New York, NY, United States.
Remeli, M.F., Kiatbodin, L., Singh, B., Verojporn, K., Date, A. and Akbarzadeh, A. 2015. Power generation from waste heat using heat pipe and thermoelectric generator. Energy Procedia, 75, pp. 645-650. Amsterdam, Netherlands.
Renn, M.J., King, B.H., O'Reilly, M., Leal, J.S. Pangrle, S.K. 2010. Aerosol Jet® Printing of High Density, 3-D Interconnects for Multi-Chip Packaging. https://www.optomec.com/wp-content/uploads/2014/04/Optomec_IMAPS_2010_Phoenix_Paper_VC1.pdf. Jan. 8, 2018.
Research and Markets. 2017. Global Waste Heat Recovery Market, 2021. https://www.prnewswire.com/news-releases/global-waste-heat-recovery-market-2021-300480369.html. Dec. 2, 2018.
Rhodes, W., Sellers, D. and Vasilos, T., 1967. Development and Evaluation of Transparent Magnesium Oxide (No. AVSSD-0168-67-RR). Avco Missiles, Space and Electronics Group, Lowell, MA; Avco Space Systems Division. US Army Materials Research Agency. Watertown, MA, United States.
Richerson, D.W. 1982. Modern Ceramic engineering: properties processing and use in design. New York: Marcel Dekker, Inc. United States.
Riffat, S.B. and Ma, X., 2003. Thermoelectrics: a review of present and potential applications. Applied Thermal Engineering, 23(8), pp. 913-935. Amsterdam, Netherlands.
Rio Grande. ND. How to Solder on PMC: Frequently Asked Questions Soldering. https://www.riogrande.com/Content/Frequently-Asked-Soldering-Questions-HT-psd. Jan. 24, 2019.
Rios, O. and Carter, W.G. 2018. Additive Manufacturing Consolidation of Low-Cost Water Atomized Steel Powder Using Micro-Induction Sintering (No. ORNL/TM-2018/845). Oak Ridge National Lab.(ORNL), Oak Ridge, TN, United States.
Rodrigo, P.D.D. and Boch, P. 1985. Preparation of high purity mullite ceramics. Journal de Physique Colloques, 1986, 47 (C1), pp. C1-411-C1-416. Les Ulis, France.
Roeser, W.F., and Dahl A.I. 1938. Reference tables for iron-constantan and copper-constantan thermocouples. Journal of Research of the National Bureau of Standards 20: 337. US Government Printing Office. Washington, DC, United States.
Roeser, W.F. and Wensel, H.T., 1935. Methods of testing thermocouples and thermocouple materials. Journal of Research of the National Bureau of Standards 14. US Dept. of Commerce, National Bureau of Standards. US Government Printing Office. Washington, DC, United States.
Roeser, W.F. 1937. Standard tables for Chromel-Alumel thermocouples. Journal of Research of the National Bureau of Standards 14. US Dept. of Commerce, National Bureau of Standards. US Government Printing Office. Washington, DC, United States.

Rosen, M.A. and Dincer, I., 2001. Exergy as the confluence of energy, environment and sustainable development. Exergy, an International journal, f(1), pp. 3-13. Amsterdam, Netherlands.
Rosenbaum, W.A., 2015. American energy: the politics of 21st century policy. CQ Press. Washington, DC, United States.
Rosenberg, S.J. 1968. Nickel and its alloys. National Bureau of Standards Monograph 106. May. United States Department of Commerce. Washington, DC: US Government Printing Office. Washington, DC, United States.
Ross, N., Shulman, H., Allan, S. and Ranjan, R. 2015. Additive manufacturing for cost efficient production of compact ceramic heat exchangers and recuperators. Ceralink Incorporated, Troy, NY, United States.
Rotman, D., 2017. The 3-D Printer That Could Finally Change Manufacturing. MIT Technology Review. Apr. 25. https://www.technologyreview.com/s/604088/the-3-d-printer-that-could-finally-change-manufacturing/. Jan. 1, 2018.
Rouklove, P. and Truscello, V., Jan. 1972. Thermoelectric generators for deep space application. In Proceedings of the XXth International Astronautical Congress (pp. 379-408b). Pergamon. Dec. 12, 2019.
Rowe, M.D., Min, G., Williams, S.G., Aoune, A., Matsuura, K., Kuznetsov, V.L. and Fu, L.W., Jul. 1997. Thermoelectric recovery of wasle heat-case studies. In IECEC-97 Proceedings of the Thirty-Second Intersociety Energy Conversion Engineering Conference (Cat. No. 97CH6203)(vol. 2, pp. 1075-1079). IEEE. Piscataway, NJ, United States.
Rowe, D.M. 1999. Thermoelectrics, an environmentally-friendly source of electrical power. Renewable energy, 16(1-4), pp. 1251-1256. https://www.sciencedirect.com/science/article/pii/S0960148198005126. Dec. 30, 2018.
Rubow, K.L. and Stange, L.L. Nov. 2002. Sintered metal filter systems for the chemical process industry. In Papers of the 2nd China International Filtration Conference. https://www.teesing.nl/files/downloads/filters-whitepapers/mott-sintered-metal-filter-systems-for-the-chemical-process-industry.pdf. Dec. 13, 2019.
Sadik, C., El Amrani, I.E. and Albizane, A. 2014. Recent advances in silica-alumina refractory: A review. Journal of Asian Ceramic Societies, 2(2), pp. 83-96. https://www.sciencedirect.com/science/article/pii/S218707641400027X. Sep. 19, 2018.
Saidur, R., Rezaei, M., Muzammil, W.K., Hassan, M.H., Paria, S. and Hasanuzzaman, M. 2012. Technologies to recover exhaust heat from Internal combustion engines. Renewable and sustainable energy reviews, 16(8), pp. 5649-5659. https://www.sciencedirect.com/science/article/abs/pii/S1364032112003474. Dec. 16, 2019.
Salisu, A.A., Abba, H. and Inuwa, M.S., 2015. Preparation and Application of Polyvinyl Alcohol Based UV Curable Flexographic Printing Ink. International Journal of Engineering and Applied Sciences, 2(12). Jaipur, India.
Salvador, J. 2017. Development of Cost-Competitive Advanced Thermoelectric Generators for Direct Conversion of Vehicle Waste Heat Into Useful Electrical Power. https://www.ostl.gov/biblio/1414341-development-cost-competitive-advanced-thermoelectric-generators-direct-conversion-vehicle-wasle-heat-useful-electrical-power. Jan. 20, 2019.
Samal, S. 2016. High temperature oxidation of metals. https://www.intechopen.com/books/high-temperature-corrosion/high-temperature-oxidation-of-metals. Jul. 15, 2018.
Satyala, N. and Vashaee, D. 2012. Modeling of thermoelectric properties of magnesium silicide (Mg 2 Si). Journal of Electronic Materials, 41(6), pp. 1785-1791. New York, NY, United States.
Scervini, M. 2016. Development of Low-Drift Nickel-Based Thermocouples for High-Temperature Applications. Journal of Engineering for Gas Turbines and Power, 138(8), p. 081601. http://gasturbinespower.asmedigitalcollection.asme.org/article.aspx?articleid=2488075. Feb. 7, 2018.
Scervini, M. 2009. Thermoelectric materials for thermocouples. Department of Material Science and Metallurgy, University of Cambridge, Cambridge. https://www.msm.cam.ac.uk/utc/thermocouple/pages/ThermocouplesOperatingPrinciples.html. Dec. 26, 2017.
Schelly, C., 2015. What's political about solar electric technology? The user's perspective. Engaging Science, Technology, and Society, 1, pp. 25-46. Amsterdam, Netherlands.

(56) References Cited

OTHER PUBLICATIONS

Schwartz, M.A., White, G. and Curtis, C., 1953. Crucible Handbook. A Compilation of Data on Crucibles Used for Calcining, Sintering, Melting, and Casting. Technical Information Service, US AEC Rept. ORNL, 1354. Oak Ridge, TN, United States.
Schwartz, R.B., Kasiraj, P. and Vreeland Jr, T., 1985. Temperature kinetics during shock-wave consolidation of metallic powders (No. LA-UR-85-2821; CONF-850770-9). Los Alamos National Lab., NM (USA); IBM Research Div., California Inst. of Tech., Pasadena (USA).San Jose, CA (USA).
Scott, C. 2017. XJet to Present Ceramic NanoParticle Jetting 3D Printing Technology at Ceramics Expo. 3DPrint.com. Apr. 21. http://www.3dprintpulse.com/ceramic/?open-article-Id=6478489&article-title=xjet-to-present-ceramic-nanoparticle-jetting-3d-printing-technology-at-ceramics-expo&blog-domain=3dprinl.com&blog-title=3dprint-com. Dec. 18, 2019.
Scullin, M. 2015. How to make the most of waste heat. Jan. 23. World Economic Forum. https://www.weforum.org/agenda/2015/01/how-to-make-the-most-of-waste-heat/. Dec. 1, 2018.
Shah, R.K., 2011. Extended surface heat transfer. Thermopedia, Feb. 14, pp. 1-8. http://thermopedia.com/content/750/. Feb. 16, 2018.
Shapeways. ND. Shapeways custom 3D printing service. https://www.shapeways.com/create. Feb. 6, 2018.
Sher, D. 2017. Tethon 3D CEO Karen Linder on the future of high quality ceramics 3D printing. 3D Printing Media Network. Nov. 8. https://www.3dprintingmedia.network/tethon-3d-ceo-ceramics-3d-printing/. Jan. 5, 2019.
Sherchenkov, A.A., Shtern, Y.I., Mironov, R.E., Shtern, M.Y. and Rogachev, M.S., 2015. Current state of thermoelectric material science and the search for new effective materials. Nanotechnologies in Russia, 10(11-12), pp. 827-840. New York, NY, United States.
Shimamura, K, Kirihara, S., Akedo, J., Ohji, T, and Naito, M., eds. 2016. Additive Manufacturing and Strategic Technologies in Advanced Ceramics. Wiley. New York, NY, United States.
Short, B., Barrett, B., Gamble, J. Sintering of powdered copper, 2011. Engineering 45, SRJC Fall. Santarosa Junior College. https://www.google.com/search?q=Sintering+of+Powdered+Copper&rlz=1C5CHFA_enUS849US849&oq=Sintering+of+Powdered+Copper&aqs=chrome..69i57j0.180j0j8&sourceid=chrome&ie=UTF-8. Apr. 7, 2018.
Sikora, P. and Clarkin, P, 1957. Reduction of Oxidized Nichrome V Powders and Sintering of Nichrome V Bodies. NACA Technical Note 4032. Washington, DC, United States.
Simchi A. and Pohl, H., 2003. Effects of laser sintering processing parameters on the microstructure and densification of iron powder. Materials Science and Engineering: A, 359(1-2), pp. 119-128. https://www.sciencedirect.com/science/article/abs/pii/S0921509303003411. Apr. 13, 2018.
Sing, S.L., Yeong, W.Y., Wiria, F.E., Tay, B.Y., Zhao, Z., Zhao, L., Tian, Z. and Yang, S., 2017. Direct selective laser sintering and melting of ceramics: a review. Rapid Prototyping Journal, 23(3), pp. 611-623. http://www.emeraldinsight.com/doi/pdfplus/10.1108/RPJ-11-2015-0178. Feb. 6, 2018.
Singh, D.V. and Pedersen, E., 2016. A review of waste heat recovery technologies for maritime applications. Energy Conversion and Management, 111, pp. 315-328. https://www.sciencedirect.com/science/article/pii/S0196890415011826. Dec. 30, 2018.
Singh, J., Verma, S.A. 2013. Comparison of figure of merit for some common thermocouples in the high temperature range. Global Journal of Researches in Engineering: Electrical and Electronics Engineering 2013;13:7-12. Framingham, MA, United States.
SM Contact Corporation. ND. Pin insertion equipment. https://smcontact.eu/pin-insertion-equipment/. Dec. 21, 2019.
Smith, K, Thornton, M. 2009. Feasibility of thermoelectrics for waste heat recovery in conventional vehicles. No. NREL/TP-540-44247. National Renewable Energy Lab.(NREL), Golden, CO, United States.
Snyder, G.J. and Toberer, E.S., 2008. Complex thermoelectric materials. Nature Materials, 7(2). New York, NY, United States.
Sokolowski, P.K., Murphy, T.F. and Lindsley, B.A., Jun. 2010. Considerations in sinter-brazing PM components. In 2010 Powder Metal World Congress & Exhibition, Hollywood, Florida (pp. 27-30). http://yunamedia.com/GKNPLCHC.com/KyungHoeganae/TechPapersv2/PowderMet2010/Considerations%20in%20Sinter-Brazing%20PM%20Components_Sokolowski.pdf. May 24, 2018.
Society for Laboratory Automation and Screening. ND. SLAS Ignite Collaboration Presentations. https://www.slas2019.org/for-presenters/ignite-presentations/. Dec. 5, 2018.
Solar Atmospheres, Inc. ND. Vacuum sintering services. https://solaratm.com/vacuum-heat-treating/sintering/. May 12, 2018.
Solarcellcentral. ND. Concentrated solar power (CSP). http://solarcellcentral.com/esp_page.html. Jul. 5, 2018.
Solar Panel Store. ND. SolarEdge SE5000A-US Single Phase 5000 W Inverter. https://www.solarpanelstore.com/solar-power/solaredge_inverters_optimizers/solaredge_interter_series/solaredge_se5000aus.html?_vsrefdom=adwords&gclid=EAIaI%E2%80%A6. Jan. 15, 2018.
Solartron Energy Systems, Inc. ND. Solarbeam 9M Hybrid Parabolic Solar Concentrator. Brochure. https://www.solartronenergy.com. May 26, 2018/.
Solidator. ND. Solidator 2.0—The Next-Generation DLP 3D Printer https://www.solidator.com/3D-Printer.html. Aug. 6, 2018.
Sommers, A., Wang, Q., Han, X., T'Joen, C., Park, Y. and Jacobi, A. 2010. Ceramics and ceramic matrix composites for heat exchangers in advanced thermal systems—a review. Applied Thermal Engineering, 30(11-12), pp. 1277-1291. Amsterdam, Netherlands.
Southwell, B.G., Murphy, J.J., Dewaters, J.E. and Lebaron, P.A., 2012. Americans' perceived and actual understanding of energy. RTI Press. Research Triangle Park, NC, United States.
Spence, A., Poortinga, W., Pidgeon, N. and Lorenzoni, I., 2010. Public perceptions of energy choices: The influence of ballots about climate change and the environment. Energy & environment, 21(5), pp. 385-407. https://www.jstor.org/stable/43734937?seq=1#page_scan_tab_contents. Nov. 21, 2018.
Spring, K.H. and Swift-Hook, D.T. 1962. Prospects for large-scale thermoelectric power generation. British Journal of Applied Physics, 13(4), p. 159. ttps://iopscience.iop.org/article/10.1088/0508-3443/13/4/305/pdf. Jan. 25, 2019.
Sprint Ray, Inc. 2017. MoonRay 3D Printer Design Guide https://impresoratresd.cl/wp-content/uploads/2018/03/MoonRay-S-DesignGuide.pdf. Aug. 6, 2018.
Ståhl, M. and Berghel, J., 2011. Energy efficient pilot-scale production of wood fuel pellets made from a raw material mix including sawdust and rapeseed cake. Biomass and Bioenergy, 35(12). pp. 4849-4854. Amsterdam, Netherlands.
Stanford Nanoheat. ND. Thermoelectric waste heat recovery. Department of Mechanical Engineering, Stanford University. https://nanoheat.stanford.edu/projects/thermoelectric-waste-heat-recovery. Jan. 8, 2018.
Star, K., 2013. Synthesis and Characterization of 14-1-11 Ytterbium Manganese Antimonide Derivatives for Thermoelectric Applications. Doctoral dissertation, University of California at Los Angeles. Los Angeles, CA, United States.
Stefansecu, D.M., May 2008. The Effect of Mould/Metal Interface Phenomena on the Surface Quality of Castings. In 10th Asian Foundry Congress (AFC10), Nagoya, Japan (pp. 21-24). https://www.researchgate.net/publication/260058771_The_Effect_of_MouldMelal_Interface_Phenomena_on_the_Surface_Quality_of_Castings. Dec. 27, 2019.
Stehlik, P., 2009. Contribution to advances in waste-to-energy technologies. Journal of Cleaner Production, 17(10), pp. 919-931. https://www.sciencedirect.com/science/article/pii/S0959652609000407. Dec. 30, 2018.
Sterbentz, J.W., Werner, J.E., Mckellar, M.G., Hummel, A.J., Kennedy, J.C., Wright, R.N. and Biersdorf, J.M., 2017. Special Purpose Nuclear Reactor (5 MW) for Reliable Power at Remote Sites Assessment Report (No. INL/EXT-16-40741). Idaho National Lab. (INL), Idaho Falls, ID, United States.

(56) References Cited

OTHER PUBLICATIONS

St. Gobain Ceramic Materials. 2017. Combat® Boron Nitride Coatings Product Data Sheet. https://www.bn.saint-gobain.com/sites/imdf.bn.com/files/combat-bn-coatings-aqueous-high-temp-ds.pdf. Aug. 25, 2018.
Stocker, T., Exner, J., and Moos, R. 2016. Thermoelectric properties of copper based oxide materials processes with the novel aerosol deposition method. https://www.researchgate.net/publication/306917949_Thermoelectric_Properties_of_Copper_Based_Oxide_Materials_Processed_with_the_Novel_Aerosol_Deposition_Method. Dec. 18, 2018.
Stohrer, U., Voggesberger, R., Wagner, G. and Birkholz, U., 1990. Sintered FeSi2 for thermoelectric power generation. Energy conversion and management, 30(2), pp. 143-147. https://www.sciencedirect.com/science/article/pii/019689049090025T. Dec. 27, 2018.
Stoutenborough, J.W., Shi, L. and Vedlitz, A., 2015. Probing public perceptions on energy: Support for a comparative, deep-probing survey design for complex issue domains. Energy, 81, pp. 406-415. Amsterdam, Netherlands.
Stratasys. ND. Application Brief: PolyJet Multi-Material 3D Printing. http://usglobalimages.stratasys.com/Main/Files/Application%20Briefs_AB/AB_PJ_MultiMaterial_1115.pdf?v=635969199677743101. Feb. 27, 2018.
Stratasys. ND. Direct Metal Laser Sintering: DMLS Frequently Asked Questions. https://www.stratasysdirect.com/technologies/direct-metal-laser-sintering. Apr. 12, 2018.
Stratasys. 2017. Direct metal laser sintering (DMLS). Brochure. SDM-BROCHURE-DMLS-0317. https://www.stratasysdirect.com/-/media/files/direct/brochures/dmls_brochure.pdf?la=ru&hash=A620192003606A4EEB47CC691BA54F9A3C85C915. Jan. 6, 2020.
Stratasys. ND. Monel K500. Direct metal laser sintering. Brochure. SS_TemplateTable_1115. https://www.stratasysdirect.com/-/media/files/direct/material-datasheets/direct-metal-laser-sintering/dmls_monel_k500_material_specifications.pdf?la=en&hash=C6681DCB49376B7080C2C1710940D6D31A73AAF9. Jan. 6, 2020.
Stratasys. ND. Functional prototyping. https://www.stratasysdirect.com/applications/functional-prototyping. Jan. 12, 2018.
Stratasys. ND. Connex3: The New Versatility Standard in 3D Printing. http://www.stratasys.com/resources/white-papers/connex3-capabilities. Jan. 1, 2018.
Stratasys. ND. White Paper: Connex3 Capabilities. https://www.stratasys.com/resources/search/white-papers/connex3. Jan. 6, 2020. Note: paper not downloaded.
Stratasys. ND. ObjetEden260VS. Spec sheet. https://www.stratasys.com/-/media/files/printer-spec-sheets/pss_pj_objeteden260vs.pdf. Jan. 6, 2020.
Stratasys. ND. DMLS Frequently Asked Questions. https://www.stratasysdirect.com/technologies/direct-metal-laser-sintering. Jan. 6, 2020.
Stratasys. ND. Multi-Material 3D Printing. http://www.stratasys.com/solutions/additive-manufacturing/multi-material-3d-printing. Jan. 30, 2018.
Stratasys. ND. Monel Materials for 3D Printing. https://www.stratasysdirect.com/materials/metals/monel#monel-k500. Jan. 6, 2020.
Stratton, R., 1957. On the elementary theory of thermoelectric phenomena. British Journal of Applied Physics, 8(8). Philadelphia, PA, United States.
Suarez, H.A., Santos, A.S. and Otalora, C.O. Feb. 2016. Borax as flux on sintering of iron Ancor Steel 1000® under glow discharge. In Journal of Physics: Conference Series (vol. 687, No. 1, p. 012083). IOP Publishing. Philadelphia, PA, United States.
Swithenbank, J., Finney, K.N., Chen, Q., Yang, Y.B., Nolan, A. and Sharifi, V.N. 2013. Waste heat usage. Applied Thermal Engineering, 60(1-2), pp. 430-440. https://www.sciencedirect.com/science/article/pii/S1359431112006977. Dec. 30, 2018.
Tanaka, S., Pin, C.C. and Uematsu, K., 2006. Effect of Organic Binder Segregation on Sintered Strength of Dry-Pressed Alumina. Journal of the American Ceramic Society, 89(6), pp. 1903-1907. https://onlinelibrary.wiley.com/doi/abs/10.1111/j.1551-2916.2006.01057.x. Nov. 21, 2018.
Tang, H.H., 2006. Building ultra-thin layers by ceramic laser sintering. Materials Transactions, 47(3), pp. 889-897. Sendai, Japan.
Tarricone, M. 2018. Personal email correspondence with Superior Technical Ceramics regarding ceramic capabilities. Aug. 17, 2018.
TE Connectivity. 2018. Pin Insertion Machines. https://www.te.com/content/dam/te-com/documents/application-tooling/global/2338136-1_Pin-Insertion-Catalog.pdf. Jan. 20, 2019.
Teeming Machinery Corp. ND. AIP-28 Auto. Pin Inserting Machine. https://teeming.en.taiwantrade.com/product/aip-28-auto-pin-inserting-machine-1586120.html. Jan. 20, 2019.
Teledyne Energy Systems. ND. Thermoelectric converters. http://www.teledynees.com/our-products/thermal-power-systems/thermoelectric-converters. Jan. 12, 2018.
Telkes, M., 1954. Solar thermoelectric generators. Journal of Applied Physics, 25(6), pp. 765-777. https://aip.scitation.org/doi/abs/10.1063/1.1721728. Jan. 21, 2018.
Tesla. ND. Powerwall: Meet Powerwall, your home battery. https://www.tesla.com/powerwall. Jul. 16, 2018.
Teter A.R., 1965. Evaluation of binders for machinable unfired ceramics. (No. RFP-659). Rocky Flats Div., Dow Chemical Co., Golden, CO, United States.
Tethon3d.ND. Web site. https://tethon3d.com/. Apr. 9, 2018.
Tethon3d. ND. Genesis® Development Resin Base—liter. https://tethon3d.com/product/genesis/. Jan. 9, 2019.
Tethon3d. ND. Vitrolite® Glass-Ceramic Resin. http://tethon3d.com/product/vitrolite/. Jul. 18, 2018.
Tethon3d. ND. Porcelite® User Guide. https://tethon3d.com/wp-content/uploads/Porcelite-User-Guide.pdf. Jan. 12, 2019.
Tethon3d. ND. Tethonite® Ceramic Powder. http://tethon3d.com/product/tethonite-ceramic-powder/. Mar. 1, 2018.
Tethon3d. 2018. Safety Data Sheet: Tethonite High Alumina Clay Powder. Jul. 1. Tethon Corporation, Omaha, NE, United States.
Tethon3d, 2017. Safety Data Sheet: Porcelite, Mar. 1. Tethon Corporation, Omaha, NE, United States.
Tewolde, M., 2015. Fabrication of Thermoelectric Devices Using Additive-Subtractive Manufacturing Techniques: Application to Waste-Heat Energy Harvesting (Doctoral dissertation, The Graduate School, Stony Brook University: Stony Brook, NY.).Excerpt. https://search.proquest.com/docview/1786277160. Accessed Aug. 14, 2020.
Thacher, E.F., Helenbrook, B.T., Karri, M.A. and Richter, C.J., 2007. Testing of an automobile exhaust thermoelectric generator in a light truck. Proceedings of the Institution of Mechanical Engineers, Part D: Journal of Automobile Engineering, 221(1), pp. 95-107. Washington, DC, United States.
The Home Depot. ND. Kisae Home Solar Kit with 400W Inverter, 34Ah Battery, 8A Charge Controller. https://www.homedepot.com/p/KISAE-Home-Solar-Kit-with-400W-Inverter-34Ah-Battery-8A-Charge-Controller-HS400-00/203510972. Jan. 15, 2018.
The Home Depot. ND. Xantrex PowerHub 1800-Watt Solar Inverter https://www.homedepot.com/p/Xantrex-PowerHub-1800-Watt-Solar-Inverter-PH-1800-GFP/205570469. Jan. 15, 2018.
The Inverter Store. ND. AIMS 10 Amp Solar Charge Controller 12 or 24 VDC PWM. https://theinverterstore.com/product/aims-10-amp-solar-charge-controller/. Jan. 16, 2018.
The Inverter Store. ND. 5000 Watt Modified Sine Power Inverter 24 VDC to 120 VAC. https://theinverterstore.com/product/5000-watt-modified-sine-power-inverter-24-vdc-to-120-vac/?gclid=EAlalQobChMlgaqSxYTd2AIVmlqzCh3k9QDxEAQYAIAB%E2%80%A6. Jan. 16, 2018.
The Inverter Store. ND. 120 Watt Solar with 400 Watt Power Inverter Kit Off Grid. https://theinverterstore.com/product/120-watt-solar-with-400-watt-power-inverter-kit-off-grid/. Jan. 16, 2018.
Thekdi, A. and Nimbalkar, S.U., 2015. Industrial waste heat recovery—potential applications, available technologies and crosscutting R&D opportunities (No. ORNL/TM-2014/622). Oak Ridge National Lab. (ORNL), Oak Ridge, TN, United States.
Thomas-Ogbuji, L., Humphrey, D.L. and Setlock, J.A., 2003. Oxidation-Reduction Resistance of Advanced Copper Alloys. NASA/TM, 212549. Hanover, MD, United States.
Thornburg, D.R., Emley, F. and Lane, D.H., 1966. Thermoelectric Materials from Powder Metallurgy. In Modern Developments in

(56) References Cited

OTHER PUBLICATIONS

Powder Metallurgy (pp. 138-159). Springer, Boston, MA. ttps://link.springer.com/chapter/10.1007%2F978-1-4684-7712-2_11 p. Mar. 15, 2018.
Tian, Z., Lee, S. and Chen, G., ND. A comprehensive review of heat transfer in thermoelectric materials and devices https://arxiv.org/pdf/1401.0749.pdf. Accessed Jan. 19, 2019.
Thomas, D.S. and Gilbert, S.W., 2014. Costs and cost effectiveness of additive manufacturing. NIST Special Publication, 1176, p. 12. Gaithersburg, MD, United States.
Thompson, M.K., Moroni, G., Vaneker, T., Fadel, G., Campbell, R.I., Gibson, I., Bernard, A., Schulz, J., Graf P., Ahuja, B. and Martina, F., 2016. Design for Additive Manufacturing: Trends, opportunities, considerations, and constraints. CIRP annals, 65(2), pp. 737-760. Amsterdam, Netherlands.
Thurman, D., 2010. Sintering in Hydrogen Atmosphere: It Punishes Refractory. Industrial Heating, 77(2), p. 55. Troy, MI, United States/.
TNO. 2012. Using waste heat in the paper industry. https://www.ecn.nl/newsletter/english/2012/december/using-waste-heat-in-the-paper-industry/. Jan. 31, 2018.
Trenke, D., Muller, N. and Rolshofen, W., 2006. Selective Laser Sintering of metal and ceramic compound structures. In Intelligent Production Machines and Systems (pp. 198-203). Elsevier Science Ltd. Amsterdam, Netherlands.
trimech.com. ND. FDM Technology. https://trimech.com/products/3d-printers/fdm-technology?utm_source=Google&utm_medium=PPC&utm_campaign=STRATASYS%20Products%20-%20All&utm_c%E2%80%A6. Feb. 8, 2018.
Tring, H. 2013. Understanding Vacuum Measurement Units. Feb. 9. Vac Aero International, Inc. https://vacaero.com/information-resources/vacuum-pump-technology-education-and-training/633-understanding-vacuum-measurement-units.html. Jun. 7, 2018.
Tripathi, H.S., Ghosh, A., Halder, M.K., Mukherjee, B. and Maiti, H.S., 2012. Microstructure and properties of sintered mullite developed from Indian bauxite. Bulletin of Materials Science, 35(4), pp. 639-643. New York, NY, United States.
Tritt, T.M. and Subramanian, M.A., 2006. Thermoelectric materials, phenomena, and applications: a bird's eye view. MRS bulletin, 31(3), pp. 188-198. New York, NY, United States.
Tsukerman, S.A., Powder Metallurgy, 1965. Pergamon Press, London, United Kingdom.
Tsutsui T., 2012. Recent technology of powder metallurgy and applications. Hitachi Chemical Technical Report, pp. 12-20. https://www.hitachi-chem.co.jp/english/report/054/54_sou2.pdf. Jan. 13, 2020.
UMG Tchnologies, Inc. ND. Introducing the Model PLT-902 SXP Inline Servo Driven Pin Inserterhttp://www.umgtinc.com/plt-902.html. Jan. 13, 2020.
United States Census. 2017. American Fact Finder. https://factfinder.census.gov/faces/tableservices/jsf/pages/productview.xhtml?pid=ECN_2012_US_00A1&prodType=table. Jan. 14, 2018.
United States Census. ND. American Fact Finder. https://www.census.gov/fastfacts/imcp/factsheet_tab1.php. Jan. 14, 2018.
United States Army. 2013. Waste management for deployed forces. Technical manual 3-34.56. Washington, DC, United States.
United States Army. 2004. Waste incineration. Technical Instructions. U.S. Army Corps of Engineers. UFC 3-240-05A. Washington, DC, United States.
United States Department of Defense. 2015. Department of Defense Annual Energy Management Report: Fiscal Year 2014. Washington, DC, United States.
United States Department of Defense. 1990. Solid waste management. NAVFAC MO-213; Air Force AFR 91-8; Army TM 5-634. United States Government Printing Office. Washington, DC. United States.
United States Department of Energy. 2018. Advanced Research Projects Agency—Energy (ARPA-E). Solicitation on Topics Informing New Program Areas. Dec. 20. https://arpa-e-foa.energy.gov/FileContent.aspx?FileID=be5664f4-e373-4d39-966f-b3cc43dc0398. Accessed Jan. 15, 2020.
United States Department of Energy. 2017 Advanced Manufacturing Office. Combined Heat and Power (CHP) Financing Primer. US Department of Energy, Jun. 2017. https://www.energy.gov/sites/prod/files/2017/06/135/CHP%20Financing%20Primer%206-16-17%20Final.pdf. Jan. 15, 2020.
United States Department of Energy. 2017. Waste heat recovery resource page. Jan. 24. https://energy.gov/eere/amo/articles/waste-heat-recovery-resource-page. Jan. 3, 2018.
United States Department of Energy. 2017. National Renewable Energy Laboratory. News Release: NREL Updates Baseline Cost and Performance Data for Electricity Generation Technologies. Aug. 24.
United States Department of Energy. 2017 Annual report. Geothermal Technologies Office, Office of Energy Efficiency & Renewable Energy, January. https://www.energy.gov/sites/prod/files/2018/01/f47/GTO%202017%20Annual%20Report.pdf. Jan. 15, 2020.
United States Department of Energy. 2016. Advanced Research Projects Agency—Energy (ARPA-E). Request for Information (RFI) DE-FOA-0001607 on Lower Grade Waste Heat Recovery. https://arpa-e-foa.energy.gov/FileContent.aspx?FileID=80197dc7-ad62-4d58-a8c4-4bdbcc0a52c6. Jan. 15, 2020.
United States Department of Energy. 2016. Combined Heat and Power (CHP) Technical Potential in the United States. March. https://www.energy.gov/siles/prod/llles/2016/04/f30/CHP%20Technical%20Potential%20Study%203-31-2016%20Final.pdf. Jan. 15, 2020.
United States Department of Energy. 2015. Quadrennial Technology Review 2015. Chapter 6: Innovating clean energy technologies in advanced manufacturing. https://www.energy.gov/sites/prod/files/2017/03/f34/qtr-2015-chapter6.pdf. May 6, 2018.
United States Department of Energy. 2015. Quadrennial Technology Review 2015. Executive Summary. https://www.energy.gov/sites/prod/files/2017/03/f34/qtr-2015-executivesummary.pdf. Jan. 11, 2018.
United States Department of Energy. ND. Thermoelectric Materials, Devices and Systems: Technology Assessment. https://www.energy.gov/siles/prod/files/2015/02/f19/QTR%20Ch8%20-%20Thermoelectic%20Materials%20TA%20Feb-13-2015.pdf. Jan. 16, 2020.
United States Department of Energy. ND. Office of Energy Efficiency & Renewable Energy. Combined heat and power basics. https://www.energy.gov/eere/amo/combined-heat-and-power-basics. Dec. 30, 2018.
United States Department of Energy. ND. Grid-connected renewable energy systems. https://www.energy.gov/energysaver/grid-connected-renewable-energy-systems. Jan. 15, 2018.
United States Department of Energy. ND. Office of Energy Efficiency & Renewable Energy. Exploration 1976-2006: A History of Geothermal Energy Research and Development in the United States. https://www.energy.gov/sites/prod/files/2014/02/f7/geothermal_history_1_exploration.pdf. Jun. 10, 2018.
United States Energy Information Administration. 2018. How much electricity does an American home use? https://www.eia.gov/tools/faqs/faq.php?id=97&t=3. Dec. 16, 2018.
United States Energy Information Administration. 2017. Natural gas generators make up the largest share of overall U.S. generation capacity. https://www.eia.gov/todayinenergy/detail.php?id=30872#tab1. Feb. 9, 2018.
United States Energy Information Administration. 2016. Today in energy: Many industries use combined heat and power to improve energy efficiency. Jul. 27. https://www.eia.gov/todayinenergy/detail.php?id=27252. Jan. 14, 2018.
United States Energy Information Administration. ND. Frequently Asked Questions. How much oil is consumed in the United States? https://www.eia.gov/tools/faqs/faq.php?id=33&t=6. Jan. 20, 2020.
United States Energy Information Administration. ND. Frequently Asked Questions. What is U.S. electricity generation by energy source? https://www.eia.gov/tools/faqs/faq.php?id=427&t=3. Oct. 15, 2020.
United States Energy Information Administration. ND. How much of carbon dioxide emissions are associated with electricity generation? https://www.eia.gov/tools/faqs/faq.php?id=77&t=11. Jan. 22, 2020.

(56) References Cited

OTHER PUBLICATIONS

United States Environmental Protection Agency. 2012. Waste heat to power systems. https://www.epa.gov/sites/production/files/2015-07/documents/waste_heat_to_power_systems.pdf. Jan. 13, 2018.

United States Environmental Protection Agency. ND. Sources of greenhouse gas emissions. https://www.epa.gov/ghgemissions/sources-greenhouse-gas-emissions. Oct. 17, 2018.

United States Environmental Protection Agency. ND. Bionmass CHP catalog of technologies. https://www.epa.gov/chp/biomass-chp-catalog-technologies, Jun. 11, 2018.

United States Navy, Naval Sea Systems Command. 2015. Naval Power and Energy Systems Technology Development Roadmap https://www.navsea.navy.mil/Portals/103/Documents/Naval_Power_and_Energy_Systems_Technology_Development_Roadmap.pdf. Jan. 10, 2019.

University of Babylon. ND. Sintering furnaces; sintering atmospheres. www.uobabylon.edu.iq/eprints/pubdoc_3_2647_560.docx. Apr. 3, 2018.

University of Delaware Department of Chemistry and Biochemistry. ND. Scientific glassblowing shop. https://www1.udel.edu/chem/GlassShop/PhysicalProperties.htm. Aug. 15, 2018.

University of New South Wales School of Materials Science and Engineering. 2007. Reduction of Stable Metal Oxides. Aug. 28. http://www.materials.unsw.edu.au/research-articles/reduction-stable-metal-oxides. Jun. 24, 2018.

Urashima, K. Cu paste for low temperature metallization process. Hitachi Chemical Technical Report No. 58. http://www.hitachi-chem.co.jp/english/report/058/58_tr09.pdf. Apr. 12, 2018.

USA Wanhao. ND. https://www.usawanhao.com/. Dec. 14, 2018.

Van Bel, J., Tong, C., Gan, R.N., Eshaghof, M., Nsavu-Nzao, C.D.N, and Gan, Y.X. 2018. Processing and Seebeck Effect Measurement of a Bismuth Based Alloy. https://www.journalair.com/index.php/AIR/article/view/17305/32243. Aug. 18, 2020.

Varotsis, A.B. ND. Introduction to Binder Jetting 3D printing. 3DHubs. https://www.3dhubs.com/knowledge-base/introduction-binder-jetting-3d-printing. Feb. 8, 2018.

Vazquez, J., Sanz-Bobi, M.A., Palacios, R. and Arenas, A. Oct. 2002. State of the art of thermoelectric generators based on heat recovered from the exhaust gases of automobiles. In Proc. 7th European Workshop on Thermoelectrics (No. 17). https://www.iit.comillas.edu/palacios/thermo/EWT02-Exhaust_gases.pdf. Jan. 29, 2020.

Vining, C.B., 2009. An inconvenient truth about thermoelectrics. Nature Materials, 8(2), p. 83. New York, NY, United States.

Vining, C.B., 1997. The thermoelectric process. https://studylib.net/doc/8603656/the-thermoelectric-process. Jan. 31, 2020.

Visumatic. ND. Fixed Systems & Robotics. http://www.visumatic.com/fix/fixed_robotics_systems.html. Jan. 20, 2019.

Wanhao 3D Printer. ND. Duplicator 7 V1.5 Product Brochure. http://www.wanhao3dprinter.com/xiazai/D7V1.5_REV.A.pdf. Dec. 14, 2018.

Waitz, R. Wubben, P., Geiß, B., Wilhelm Muller, W. ND. Resistance heated furnaces for prolective gas and vacuum operation. https://www.llnn-high-therm.de/lileadmin/user_upload/pages/about_us/download/publications/white_papers/Resistance_heated_furnaces_for_protective_gas_and_vacuum_operation.pdf. May 13, 2018. May 13, 2018.

Wakefield-Vette. ND. Heat sink design facts and guidelines for thermal analysis. Technical brief. https://www.digikey.com/en/pdf/w/wakefield-thermal-solutions/heat-sink-design-for-thermal-analysis. Feb. 2, 2019.

Walsh, C. and Thornley, P., 2012. Barriers to improving energy efficiency within the process industries with a focus on low grade heat utilisation. Journal of Cleaner Production, 23(1), pp. 138-146. Amsterdam, Netherlands.

Wan, W., Huang, C.E., Yang, J., Zeng, J. and Qiu, T., 2014. Effect of sintering temperature on the properties of fused silica ceramics prepared by gelcasting. Journal of Electronic Materials, 43(7), pp. 2566-2572. New York, NY United States.

Wang, L., 2008. Preparation and characterization of properties of electrodeposited copper oxide films. Doctoral dissertation, University of Texas at Arlington, Arlington, TX, United States.

Weckmann, S., 1997. Dynamic electrothermal model of a sputtered thermopile thermal radiation detector for earth radiation budget applications. Master of Science thesis, Virginia Polytechnical Institute. Blacksburg, VA, United States.

Weems, J.B., 1904. Chemistry of clays. Iowa Geological Survey Annual Report, 14(1), pp. 319-346. https://ir.ulowa.edu/cgi/viewcontent.cgi?article=1076&context=Igsar. Sep. 28, 2018.

Weiner, L., Chiotti, P. and Wilhelm, H.A., 1952. Temperature dependence of electrical resistivity of metals. Iowa State University, Ames Laboratory ISC Technical Reports. https://lib.dr.iastate.edu/cgi/viewcontent.cgi?article=1049&context=ameslab_iscreports. Mar. 1, 2018.

Weissgaerber, T., Pacheco, V., Recknagel, C. et al. 2014. Advanced PM Technologies to Manufacture Thermoelectric materials and supercapacitors. https://www.ifam.fraunhofer.de/content/dam/ifam/de/documents/dd/Publikalionen/2014/WorldPM_2014_Weißgärber_ADVANCED_PM_TECHNOLOGIES_TO_MANUFACTURE_THERMOELECTRIC_MATERIALS_AND_SUPERCAPACITORS_MPIF_APMI.pdf. Feb. 10, 2020.

Wen, S. and Chung, D.D.L., 2000. Seebeck effect in steel fiber reinforced cement. Cement and Concrete Research, 30(4), pp. 661-664. Amsterdam, Netherlands.

Wereszczak, A.A., Chen, B.R. and Oistad, B.A., 2018. Rellow-oven-processing of pressureless sintered-silver Interconnects. Journal of Materials Processing Technology, 255, pp. 500-506. https://www.osti.gov/biblio/1423101-reflow-oven-processing-pressureless-sintered-silver-interconnects. Dec. 29, 2018.

White Clouds. Binder Jetting in 3D Printing. http://ss.whiteclouds.com/3dpedia-index/binder-jetting-3d-printing. Feb. 14, 2018.

Wikimal. 2017. Form 1+: First Print. Oct. 4. https://wiki.imal.org/howto/form-1-first-print. Dec. 31, 2018.

Wikipedia. ND. Application of silicon-germanium thermoelectrics in space exploration. https://en.wikipedia.org/wiki/Application_of_silicon-germanium_thermoelectrics_in_space_exploration. May 6, 2018.

Wikipedia. ND. Copper (I) oxide. https://en.wikipedia.org/wiki/Copper(I)_oxide. Mar. 23, 2018.

Wikipedia. ND. Fermi energy. https://en.wikipedia.org/wiki/Fermi_energy. Dec. 26, 2017.

Wikipedia. ND. Power inverter. https://en.wikipedia.org/wiki/Power_inverter. Jan. 15, 2018.

Wilfahrt, A., 2014. Screen Printed Thermoelectric Devices. Doctoral dissertation, Linköping University. Norrköping, Sweden.

Wilson, I.O., 1981. Magnesium oxide as a high-temperature insulant. IEE Proceedings A (Physical Science, Measurement and Instrumentation, Management and Education, Reviews), 128(3), pp. 159-164. https://w3.pppl.gov/~neumeyer/ITER_IVC/References/1981_Wilson_BICC.pdf. Aug. 19, 2020.

Wong, T., Zhuk, S., Masudy-Panah, S. and Dalapati, G., 2016. Current status and future prospects of copper oxide heterojunction solar cells. Materials, 9(4). Basel, Switzerland.

Woodford, C. 2018. Thermocouples. https://www.explainthatstuff.com/howthermocoupleswork.html. Dec. 26, 2017.

Woody, T. 2014. This Sun-Powered Furnace Can Reach 3,000 Degrees. The Atlantic. Apr. 14. https://www.theatlantic.com/technology/archive/2014/04/this-sun-powered-furnace-can-reach-3-000-degrees/360423/. Feb. 23, 2017.

Woolnough, D. ND. Waste heat recovery. Thermopedia. http://www.thermopedia.com/content/1250/. Dec. 2, 2018.

Xie, M. and Gruen, D.M., 2010. Potential impact of ZT=4 thermoelectric materials on solar thermal energy conversion technologies. The Journal of Physical Chemistry B, 114(45), pp. 14339-14342. https://pubs.acs.org/doi/pdfplus/10.1021/jp9117387. May 6, 2018.

Xjet. 2016. XJet Carmel Line of AM Systems. http://xjet3d.com/systems/. Apr. 9, 2018.

Xometry, Inc. 2018. Customer Service Agreement. Sep. 10. https://www.xometry.com/service-agreement?_ga=2.198977199.1061883011.1540836719-2122942992.1540836719. Oct. 29, 2018.

Xometry, Inc. ND. Mini-Guide: PolyJet 3D Printing (PJ3D) Version 2.0. https://pages.xometry.com/pj3d-mini-guide. Feb. 8, 2018.

(56) References Cited

OTHER PUBLICATIONS

Xometry, Inc. 2018. Design Guide: Stereolithography (SLA). Jul. 25. https://www.xometry.com/design-guide-sla. Oct. 31, 2018.
Xometry, Inc. ND. Design Guide: Direct Metal Laser Sintering (DMLS). Version 3.0. https://cdn2.hubspot.net/hubfs/340051/Design_Guides/Xometry_DesignGuide_DMLS.pdf. Dec. 26, 2017.
Xometry, Inc. ND. PolyJet 3D Printing. https://www.xometry.com/polyjet-3d/. Feb. 6, 2018.
Xue, L.A. and Chen, I.W., 1991. Low-temperature sintering of alumina with liquid-forming additives. Journal of the American Ceramic Society, 74(8), pp. 2011-2013. Somerset, NJ, United States.
Xyzprinting, Inc. ND. Nobel 1.0. https://www.xyzprinting.com/en-US/product/nobel-1-0. Dec. 14, 2018.
Xyzprinting, Inc. ND. Nobel 1.0A. https://www.xyzprinting.com/en-US/product/nobel-1-0a. Jun. 2, 2018.
Xyzprinting Inc. ND. XYZmaker Suite User Manual. Version: 20180917. https://www.xyzprinting.com/en-US/software-series/DESIGN/xyzmaker-suite. Dec. 28, 2018.
Yadav, A., Pipe, K.P. and Shtein, M., 2008. Fiber-based flexible thermoelectric power generator. Journal of Power Sources, 175(2), pp. 909-913.https://www.sciencedirect.com/science/article/abs/pii/S0378775307021155. Feb. 20, 2020.
Yang, M.Z., Wu, C.C., Dai, C.L. and Tsai, W.J., 2013. Energy harvesting thermoelectric generators manufactured using the complementary metal oxide semiconductor process. Sensors, 13(2), pp. 2359-2367. Basel, Switzerland.
Yang, J., Lin, T-C, Manett, B., Young, J., Rooney, D., and Medvedovski, E. N.D. Fabrication of Magnesium Oxide Ceramics with Density Close to Theoretical Using Nanopowders. https://sciengineeredmaterials.com/wp-content/uploads/2017/03/Fabrication-of-Magnesium-Oxide-Ceramics-with-Density-Close-to-Theoretical-Using-Nanopowders.pdf. May 10, 2019.
Yazawa, K. and Shakouri, A., 2011. Cost-efficiency trade-off and the design of thermoelectric power generators. Environmental Science & Technology, 45(17), pp. 7548-7553. Washington, DC, United States.
Yeh, C.T. and Tuan, W.H., 2017. Oxidation mechanism of aluminum nitride revisited. Journal of Advanced Ceramics, 6(1), pp. 27-32. New York, NY, United States.
Yeh, T.S. and Sacks, M.D., 1988. Low-temperature sintering of aluminum oxide. Journal of the American ceramic society, 71(10), pp. 841-844 . . . http:/onlinelibrary.wiley.com/doi/10.1111/j.1151-2916.1988.tb07533.x/abstract. Feb. 11, 2018.
Yesiller, N., Hanson, J.L. and Yee, E.H., 2015. Waste heat generation: A comprehensive review. Waste Management, 42, pp. 166-179. Amsterdam, Netherlands.
Yong-Taeg, O., Fujino, S. and Morinag, K., 2002. Fabrication of transparent silica glass by powder sintering. Science and Technology of Advanced Materials, 3(4), pp. 297-301. Philadelphia, PA, United States.
Yoon, S.M., Madavali, B., Yoon, Y.N. and Hong, S.J., 2017. Investigation of the Microstructure and Thermoelectric Properties of P-Type BiSbTe Alloys by Usage of Different Revolutions Per Minute (RPM) During Mechanical Milling. Archives of Metallurgy and Materials, 62(2), pp. 1167-1171. Cracow, Poland.
Yu, C., Cao, P. and Jones, M., 2017. Microstructural Evolution during Pressureless Sintering of Blended Elemental Ti—Al—V—Fe Titanium Alloys from Fine Hydrogenated-Dehydrogenated Titanium Powder. Metals, 7(8), p. 285. Basel, Switzerland.
Yuksek, E.L. and Mirmobin, P., 2015. Waste heat utilization of main propulsion engine jacket water in marine application. In Proceedings of the 3rd International Seminar on ORC Power Systems, Bruxelles, Belgium (pp. 1-10). http:/asme-orc2015.typer.com/online/proceedings/documents/42.pdf. Feb. 25, 2020.
Zappa, D., Dalola, S., Faglia, G., Comini, E., Ferroni, M., Soldano, C., Ferrari, V. and Sberveglieri, G., 2014. Integration of ZnO and CuO nanowires into a thermoelectric module. Beilstein Journal of Nanotechnology, 5(1), pp. 927-936. Frankfurt am Main, Germany.
Zarr, RR., Flynn, D.R., Hettenhouser, J.W., Brandenburg, N.J. and Healy, W.M. 2006. Fabrication of a guarded-hot-plate apparatus for use over an extended temperature range and in a controlled gas atmosphere. Thermal Conductivity, 28, p. 235. https://tsapps.nist.gov/publication/get_pdf.cfm?pub_id=860976. Aug. 11, 2020.
Zevalkink, A., Toberer, E.S., Zeier, W.G., Flage-Larsen, E. and Snyder, G.J., 2011. Ca 3 AlSb 3: an inexpensive, non-toxic thermoelectric material for waste heat recovery. Energy & Environmental Science, 4(2), pp. 510-518. Jan. 8, 2018.
Zguris, Z., 2016. How mechanical properties of stereolithography 3D prints are affected by UV curing. Formlabs Inc., Somerville, MA. How mechanical properties of stereolithography 3D prints are affected by UV curing. https://archive-media.formlabs.com/upload/How-Mechanical-Properties-of-SLA-3D-Prints-Are-Affected-by-UV-Curing.pdf. Accessed Feb. 26, 2020.
Zhang, X. and Zhao, L.D., 2015. Thermoelectric materials: Energy conversion between heat and electricity. Journal of Materiomics, 1(2), pp. 92-105. Amsterdam, Netherlands.
Zheng, X.F., Liu, C.X., Yan, Y.Y. and Wang, Q., 2014. A review of thermoelectrics research—Recent developments and potentials for sustainable and renewable energy applications. Renewable and Sustainable Energy Reviews, 32, pp. 486-503. Amsterdam, Netherlands.
Zhu, D. and Miller, R.A., 1999. Thermophysical and thermomechanical properties of thermal barrier coating systems. NASA Technical Memorandum. Washington, DC, United States.
Zhu, D. and Miller, R.A., 2000. Thermal conductivity and elastic modulus evolution of thermal barrier coatings under high heat flux conditions. Journal of Thermal Spray Technology, 9(2), pp. 175-180. New York, NY, United States.
Zinsser Analytic. ND. Pipetting robot—Andrew™ http://www.directindustry.com/prod/zinsser-analytic/product-189077-1849389.html#product-item_1849346. Dec. 4, 2018.
Zipp, K. 2016. What are the di-erent types of solar inverters? Solar Power World. May 25. https://www.solarpowerworldonline.com/2016/05/different-types-solar-inverters/. Jan. 15, 2018.
3M. Characteristics of Thermal Interface Materials. 3M Technical Bulletin. Jan. 2001. St. Paul, MN, United States.
Alfa-Laval. Waste Heat Recovery—Optimizing your energy system. https://www.alfalaval.com/globalassets/documents/industries/chemicals/petrochemicals/waste-heat-recovery-ppi00443en.pdf. Mar. 2, 2020.
American Ceramic Society. ND. http://ceramics.org/wp-content/uploads/2014/04/Slip-Casting-Lesson-111.pdf. Feb. 28, 2020.
American Welding Society.1992. Specification for Filler Metals for Brazing and Braze Welding http://www.estahanfoolad.com/userimages/file/standards/96.pdf. Feb. 28, 2020.
Barati, M. Esfahani, S., and Utigard, T. A. 2011. Energy Recovery from High Temperature Slags. Energy 36.9. Amsterdam, Netherlands.
Bell, L.E. and Kossakovski, D., 2009. Thermoelectrics: Energy usage reduction through Solid State cooling/heating and waste heat recovery. Jul. 13. White Paper, Technology Innovation Program, National Institute of Standards and Technology. BSST LLC. https://www.nist.gov/system/files/documents/2017/06/09/198_thermoelectrics_energy_usage_reduction2.pdf. Mar. 2, 2020.
Brownell, E. Hodes, M. 2014. Optimal Design of Thermoelectric Generators Embedded in a Thermal Resistance Network. IEEE Transactions on Components, Packaging and Manufacturing Technology vol. 4, Issue 4 (April). https://ieeexplore.ieee.org/document/6728675/figures#figures. Jun. 18, 2019.
Cernaianu, M.O. and Gontean, A. 2013. Parasitic elements modelling in thermoelectricmodules. IET Circuits Devices Syst., 2013, vol. 7, Iss. 4, pp. 177-184. https://www.researchgate.net/publication/260667243_Parasitic_elements_modelling_In_thermoelectric_modules. Mar. 2, 2020.
Chen, L., Gong, J., Sun, F. and Wu, C., 2002. Effect of heat transfer on the performance of thermoelectric generators. International journal of thermal sciences, 41(1), pp. 95-99. https://www.sciencedirect.com/science/article/pii/S1290072901013072. Accessed Jun. 18, 2019.
Chen, G. and Ren, Z., 2015. Concentrated solar thermoelectric power (No. DOE-MIT-0005806). Massachusetts Institute of Technology. https://www.osti.gov/biblio/1191490/. Mar. 3, 2020.

(56) References Cited

OTHER PUBLICATIONS

Condos, A., Zimaras, L., Marlow, J. and Kurniawan, M., 2019. Optimisation of Wearable Thermoelectric Generators. PAM Review: Energy Science & Technology, 6. Ultimo, Australia.

Cotronics Corp. ND. Rescor Cer-Cast Ceramics Product Sheet. http://www.cotronics.com/catalog/60%20%20castable%20intro.pdf. Sep. 11, 2018.

Crane, D.T. and Jackson, G.S. 2003. Optimization of cross flow heat exchangers for thermoelectric waste heat recovery. https://www.researchgate.net/profile/Gregory_Jackson3/publication/222863511_Optimization_of_cross_flow_heat_exchangers_for_thermoelectric_waste_heat_recovery/links/59de2f6faca27247d79424da/Optimization-of-cross-flow-heat-exchangers-for-thermoelectric-waste-heat-recovery.pdf. Mar. 6, 2020.

De Leon, M.T., 2014. Efficiency improvement in MEMS thermoelectric generators employing solar concentration. Doctoral dissertation, University of Southampton. Southampton, United Kingdom.

Dell, R., Petralia, M.T., Pokharel, A. and Unnthorsson, R. 2019. Thermoelectric Generator Using Passive Cooling. In Advanced Thermoelectric Materials for Energy Harvesting Applications. IntechOpen. https://www.Intechopen.com/books/advanced-thermoelectric-malerials-for-energy-harvesting-applications/thermoelectric-generalor-using-passive-cooling. Mar. 11, 2020.

Dhannoon, M., 2016. Analytical Study of Miniature Thermoelectric Device (Doctoral dissertation, Western Michigan University). https://pdfs.semanticscholar.org/c5c9/57a8e8ccd35291ae543e5470c1c27f9d5e8.pdf. Accessed Jun. 18, 2019.s_energy_usage_reduction2.pdf. Mar. 2, 2020.

Dilhac, J.M., Montheard, R., Bafleur, M., Boitier, V., Durano-Estebe, P. and Tounsi, P. 2014. Implementation of thermoelectric generators in airliners for powering battery-free wireless sensor networks. Journal of Electronic Materials, 43(6), pp. 2444-2451. https://hal.archives-ouvertes.fr/hal-00998857/document. Jul. 10, 2019.

Dunham, M.T., Barako, M.T., Leblanc, S., Asheghi, M., Chen, B. and Goodson, K.E., 2015. Power density optimization for micro thermoelectric generators. Energy, 93, pp. 2006-2017. Amsterdam, Netherlands.

El-Genk, M.S., Saber, H.H, and Caillat, T. Jan. 2002. A performance comparison of SIGe and skullerudite based segmented thermoelectric devices. In AIP conference proceedings (vol. 608, No. 1, pp. 1007-1015). American Institute of Physics.https://www.scopus.com/record/display.uri?eld=2-s2.0-0002428572&origin=Inward&txGld=9d25df5758edb700290c192a1af254d6. May 6, 2018.

Electra Therm. ND. Waste Heat to Power: The Renewable You Already Have. https://electratherm.com/. Feb. 27, 2018.

Enescu, D., 2019. Thermoelectric Energy Harvesting: Basic Principles and Applications. In Green Energy Advances. IntechOpen. https://www.Intechopen.com/books/green-energy-advances/thermoelectric-energy-harvesting-basic-principles-and-applications. Sep. 4, 2020.

Fabian-Mijangos, A. Min, G. and Alvarez-Quintana, J. 2017. Enhanced performance thermoelectric module having asymmetrical legs. Energy Conversion and Management, 148, pp. 1372-1381. Amsterdam, Netherlands.

Farber, E.A. and Glickstein, M.R., 1954. Effects of Junction Manufacture on Thermocouple EMF Generation (No. PAPER-56-A-135). American Society of Mechanical Engineers. https://apps.dtic.mil/dtic/tr/fulltext/u2/a284486.pdf. Mar. 16, 2020.

Georgia Power. ND. Water heating systems. https://www.georgiapower.com/business/save-money-and-energy/customer-resource-center/equipment/water-heating-systems/whru.html. Apr. 6, 2019.

Ghimire, G.B. and Khatiwada, M., 2015. Realization of Electric Voltage from Exhaust. International Journal of Scientific and Research Publications, p. 262. New Delhi, India.

Gould, C.A., Shammas, N.Y.A, Grainger, S., Taylor, I. A novel 3D TCAD simulation of a thermoelectric couple configured for thermoelectric power generation. ICREPQ'11. http://icrepq.com/icrepq'11/PL5-1.pdf. Jul. 10, 2019.

Harrison, W.N., Moore, D.G. and Richmond, J.C., 1947. Ceramic coatings for high-temperature protection of steel. Journal of Research of the National Bureau of Standards 38, pp. 293-307. Washington, DC, United States.

Haynes International, ND. Brazing and soldering. https://www.haynesintl.com/alloys/fabrication-brochure/welding-and-joining/brazing-and-soldering. Mar. 31, 2019.

Henderson, C.M., Ault, R.G., Beaver, E.R., Harris, D.H., Hedley, W.H. and Janowiecki, R.J., 1964. High temperature thermoelectric research. United States Air Force Systems Command, Wright-Patterson Air Force Base, OH. Monsanto Research Corporation, Dayton, OH.https:/apps.dtic.mil/dtic/tr/fulltext/u2/609051.pdf. Mar. 16, 2020.

Ismail, B.I. and Ahmed, W.H., 2009. Thermoelectric power generation using waste-heat energy as an alternative green technology. Recent Patents on Electrical & Electronic Engineering (Formerly Recent Patents on Electrical Engineering), 2(1), pp. 27-39. https://pdfs.semanticscholar.org/69ab/7f16f47d83597b99e021e3d4ec16a9231f88.pdf. Sep. 4, 2020.

Ismail, Y. and Alaskalany, A., 2014. Thermoelectric Devices: Cooling and Power Generation. arXiv preprint arXiv:1403.3836. https://arxiv.org/pdf/1403.3836.pdf. Sep. 4, 2020.

Joshi, J.V. and Patel, N.M., 2012. Electricity generation using Thermopile system from the flue gases. International Journal of Scientific Engineering and Technology, 1(3), pp. 6-10. Bhopal, India.

Joshi, J.V. and Patel, N.M., 2012. Thermoelectric system to generate electricity from waste heat of the flue gases. Advances in Applied Science Research, 3(2), pp. 1077-1084. https://www.Imedpub.com/articles/thermoelectric-system-to-generate-electricity-from-waste-heat-of-the-flue-gases.pdf. Sep. 4, 2020.

Jouhara, H., Khordehgah, N., Almahmoud, S., Delpech, B., Chauhan, A. and Tassou, S.A., 2018. Waste heat recovery technologies and applications. Thermal Science and Engineering Progress, 6, pp. 268-289. https://www.sciencedirect.com/science/article/pii/S2451904918300015. Oct. 7, 2019.

Jovovic, V. 2016. Scientific and Technical Information (STI) for Financial Assistance and Non-M&O/M&I. Thermoelectric waste heat recovery program for passenger vehicles/ Gentherm LLC. Azusa, CA, United States.

Katkus, T., 2015. Design and construction of high temperature thermoelectric power generator module characterisation system. Doctorial thesis, University of Wollongong, Wollongong, Australia.

Kauzlarich, S.M., Zevalkink, A., Toberer, E. and Snyder, G.J. 2017. Zintl Phases: Recent Developments in Thermoelectrlcs and Future Outlook. In Thermoelectric Materials and Devices, Editors:Nandhakumar I, White, N.M., and Beeby, S. https://pubs.rsc.org/en/content/ebook/978-1-78262-323-6. Apr. 13, 2019.

Kauzlarich, S.M., Brown, S.R., and Snyder, G.J. 2007. Zintl phases for thermoelectric devices. Dalton Transactions, (21), pp. 2099-2107. Cambridge, United Kingdom.

Kay, D. 2011. Brazing Questions Part-2: Wide Gap Brazing when Parts don't Fit Together well for Brazing. https://vacaero.com/information-resources/vacuum-brazing-with-dan-kay/1140-brazing-questions-part-2.html. Mar. 18, 2019.

Kishore, R.A., Sanghadasa, and Priya, S. 2017. Optimization of segmented thermoelectric generator using Taguchi and Anova techniques. Scientific Reports, 7(1), pp. 1-15. New York, NY, United States.

Knox, A.R., Buckle, J., Siviter, J., Montecucco, A. and Mcculloch, E., 2013. Megawatt-scale application of thermoelectric devices in thermal power plants. Journal of Electronic Materials, 42(7), pp. 1807-1813. New York, NY, United States.

Kollie, T.G., Carr, K.R., Horton, J.L., Herskovitz, M.B. and Mossman, C.A., 1975. Temperature measurement errors with type K (Chromel vs Alumel) thermocouples due to short-ranged ordering in chromel (No. ORNL-TM-4862). Oak Ridge National Lab.(ORNL), Oak Ridge, TN. United States.

Kraemer, D., Poudel, B., Feng, H.P., Caylor, J.C., Yu, B., Yan, X., Ma, Y., Wang, X., Wang, D., Muto, A. and Mcenaney, K., 2011. High-performance flat-panel solar thermoelectric generators with high thermal concentration. Nature Materials, 10(7), pp. 532-538. New York, NY, United States.

(56) References Cited

OTHER PUBLICATIONS

Laird, I. and Lu, D.D., Nov. 2011. SPICE steady state modelling of thermoelectric generators involving the Thomson effect. In IECON 2011—37th Annual Conference of the IEEE Industrial Electronics Society (pp. 1584-1589). IEEE. Piscataway, NJ, United States.

Lavric, E.D., 2010, Sensitivity analysis of thermoelectric module performance with respect to geometry. Chemical Engineering Transactions, 21, pp. 133-138. Milan, Italy.

Lee, H., ND. Optimal design of thermoelectric devices with dimensional analysis. http://homepages.wmich.edu/~leehs/ME695/Optimum%20Design%20of%20Thermoelectric%20Devices%20for%20class.pdf. Mar. 19, 2020.

Leonard, D., Luebbers, S. and Raag, V., 1970. Characterization of RTG performance in both air and vacuum. https://ntrs.nasa.gov/archive/nasa/casi.ntrs.nasa.gov/19700022634.pdf. Mar. 19, 2020.

Li, W., Paul, M.C., Siviter, J., Montecucco, A., Knox, A.R., Sweet, T., Min, G., Baig, H., Mallick, T.K., Han, G. and Gregory, D.H., 2016. Thermal performance of two heat exchangers for thermoelectric generators. Case Studies in Thermal Engineering, 8, pp. 164-175. Amsterdam, Netherlands.

Leonov, V., 2011. Human machine and thermoelectric energy scavenging for wearable devices. ISRN Renewable Energy, 2011. https://pdfs.semanticscholar.org/d7a3/dd9b3c3e6685f2426c814871c96d047ba444.pdf?_ga=2.38290787.130371488.1600106481-104805357.1600106481. Sep. 14, 2020.

Lobunets, Y. Abdurakhmanov, I. 2020. Results of an Experimental Study of the Thermoelectric Generator Integrated into a Plate Heat Exchanger. Global Journal of Research in Engineering; F Electrical and Electronics Engineering. https://www.researchgate.net/publication/340661514_Results_of_an_Experimental_Study_of_the_Thermoelectric_Generator_Integrated_into_a_Plate_Heat_Exchanger/link/5e9772d14585150839e01e5e/download. Accessed Aug. 19, 2020.

Maddux, J.R. and Taylor, P.J., May 2013. Temperature dependence of the properties of thermoelectric materials measured under steady-state isothermal conditions. In Energy Harvesting and Storage: Materials, Devices, and Applications IV (vol. 8728, p. 87280N). International Society for Optics and Photonics. http://citeseerx.ist.psu.edu/viewdoc/download?doi=10.1.1.819.9160&rep=rep1&type=pdl. Accessed Mar. 18, 2020.

Man, E.A., Schaltz, E., Rosendahl, L., Rezaniakolaei, A. and Platzek, D., 2015. A high temperature experimental characterization procedure for oxide-based thermoelectric generator modules under transient conditions. Energies, 8(11), pp. 12839-12847. Basel, Switzerland.

Mayer, P.M. and Ram, R.J., 2006. Optimization of heat sink-limited thermoelectric generators. Nanoscale and Microscale Thermophysical Engineering, 10(2), pp. 143-155. https://www.tandfonline.com/doi/abs/10.1080/10893950600643063. Jun. 18, 2019.

Mescia, L. ed., 2015. Innovative materials and systems for energy harvesting applications. !G! Global. Hershey, PA, United States.

Misumi. ND. Cam Driven Pick & Place Unit, Side Carry Typehttps://us.misumi-ec.com/vona2/detail/221005081672/?Inch=0. Apr. 18, 2019.

Moffat, R. 1997. Notes on Using Thermocouples. Electronics Cooling, Jan. 1. https://www.electronics-cooling.com/1997/01/notes-on-using-thermocouples/. Oct. 26, 2019.

Möhring, H-C. 2017. Composites in production machines. Procedia CIRP 66 (2017) 2-9. Amsterdam, Netherlands.

Montecucco, A., Buckle, J.R. and Knox, A.R., 2012. Solution to the 1-D unsteady heat conduction equation with internal Joule heat generation for thermoelectric devices. Applied Thermal Engineering, 35, pp. 177-184. https://www.sciencedirect.com/science/article/abs/pii/S1359431111005643?via%3Dihub. Oct. 19, 2019.

Montecucco, A., 2014. Efficiently maximising power generation from thermoelectric generators. Doctoral dissertation, University of Glasgow, Scotland, United Kingdom.

Montecucco, A., Siviter, J. and Knox, A.R., 2015. Constant heat characterisation and geometrical optimisation of thermoelectric generators. Applied Energy, 149, pp. 248-258. Amsterdam, Netherlands.

Montecucco, A., Siviter, J. and Knox, A.R. 2017. Combined heat and power system for stoves with thermoelectric generators. Applled Energy, 185 (Part 2), pp. 1336-1342. http://eprints.gla.ac.uk/143465/. Mar. 20, 2020.

Mori, M., Yamagami, T., Oda, N., Hattori, M. et al. 2009. Current Possibilities of Thermoelectric Technology Relative to Fuel Economy. SAE Technical Paper 2009-01-0170. https://www.sae.org/publications/technical-papers/content/2009-01-0170/. Jun. 18, 2019.

Mori, T. ND. High Temperature Boron-based Thermoelectric Materials. Sigma-Aldrich. https://www.sigmaaldrich.com/technical-documents/articles/material-matters/high-temperature-boron-based.html. Jul. 6, 2019.

Nemir, D. and Beck, J., 2011. Scaling considerations for thermoelectric generators. In DOE Workshop on Thermoelectrics. https://www.energy.gov/sites/prod/files/2014/03/f13/nemir.pdf. Aug. 18, 2020.

Niwa, Y., Todaka, Y., Masuda, T., Kawai, T. and Umemoto, M., 2009. Thermoelectric Properties of Ca—Mg—Si Alloys. Materials Transactions, 50(7), pp. 1725-1729. Sendai, Japan.

Nochetto, H., Taylor, P. and Maddux, J.R., 2013. High temperature thermoelectric materials for waste heat regeneration. Army Research Lab Adelphi MD Sensors and Electron Devices Directorate. https://apps.dtic.mil/sti/pdfs/ADA570989.pdf. Aug. 18, 2020.

Omer S.A., 1997. Solar thermoelectric system for small scale power generation. Doctoral dissertation. Loughborough University, Loughborough, United Kingdom.

Opentrons. ND. http://opentrons.com/?gclid=EAlalQobChMI4djY7ZOH3wlVhQc_Ch11awkaEAEYASAAEgJPDfD_BwE. Dec. 4, 2018.

Park, R. Thermocouple Fundamentals. Marlin Manufacturing Corporation. Cleveland, OH. Unted States. http://www.advindsys.com/ApNotes/tcfundamentals.pdf. Apr. 24, 2019.

Paul, D.J., Samarelli, A., Llin, L.F., Zhang, Y., Weaver, J.M., Dobson, P.S., Cecchi, S., Frigerio, J., Isa, F., Chrastina, D. and Isella, G., 2013. SI/SiGe thermoelectric generators. ECS Transactions, 50(9), p. 959. https://www.researchgate.net/publication/275420362_SiSiGe_Thermoelectric_Generarlors/link/5540e3540cf2b790436b18d6/download. Jul. 10, 2019.

Peng, J., He, J., Alboni, P.N. and Tritt, T.M., 2009. Synthesis and Thermoelectric Properties of the Double-Filled Skutterudite Yb 0.2 In y Co 4 Sb 12. Journal of Electronic Materials, 38(7), pp. 981-984. New York, NY, United States.

Poudel, B., Hao, Q., Ma, Y., Lan, Y., Minnich, A., Yu, B., Yan, X., Wang, D., Muto, A., Vashaee, D. and Chen, X., 2008. High-thermoelectric performance of nanostructured bismuth antimony telluride bulk alloys. Science, 320 (5876), pp. 634-638. Washington, DC, United States.

Pratt, W.M., 1962. Manufacturing research, brazing alloys, high temperature operating, development of. No. MRE-58-2. General Dynamics Corporation, Fort Worth, TX, United States.

Precision Ceramics USA, Inc. ND. Shapal Hi-M Soft. St. Petersburg, FL, United States. https://precision-ceramics.com/wp-content/uploads/2018/07/PC-USA-Shapal-Hi-M-Soft-1b.pdf?508047&508047. Dec. 2, 2019.

Prince & Izant. ND. Brazing and Metal Joining Products. Brochure, Cleveland, OH, United States.

Pubchem. ND. Calcium Magnesium Oxide. https://pubchem.ncbi.nlm.nih.gov/compound/161939#section=Synonyms. Apr. 14, 2019.

Radian. ND. What is a heatsink? https://www.radianheatsinks.com/heatsink/. Feb. 2, 2019.

Radio Corporation of America. 1965. Final Phase I Report for Compact Thermoelectric Project. Prepared for US Atomic Energy Commission. Harrison, NJ, United States.

Ramdass, Y. 2014. Maximizing the Output Power from Thermoelectric Harvesters. https://www.ecnmag.com/article/2014/02/maximizing-output-power-thermoelectric-harvesters Apr. 27, 2019.

Rauscher, J.F., Cox, C.A., Yi, T., Beavers C.M., Klavins, P., Toberer, E.S., Snyder, G.J., and Kauzlarich, S.M. 2010. Synthesis, structure, magnetism, and high temperature thermoelectric properties of Ge doped Yb14MnSb11. Dalton Transactions 010, 39, 1055-1062. Cambridge, United Kingdom.

(56) References Cited

OTHER PUBLICATIONS

Reddy. C.C.S. and Naidu, S.V. 2013. Waste heat recovery methods and technologies. Chemical Engineering. https://www.chemengonline.com/waste-heat-recovery-methods-and-technologies/?printmode=1. Oct. 7, 2019.
Rehman, A.U., Ahmad, A., Ahmad, A., Hayat, A., Khan, A.B. 2016. Future Impact of Thermoelectric Devices for Producing Electricity by Harnessing Waste Heat from IC Engine Exhaust. European Journal of Advances in Engineering and Technology, 2016,3(11):46-51. http://www.ejaet.com/PDF/3-11/EJAET-3-11-46-51.pdf. Aug. 25, 2020.
Ruiz-Ortega, P.E., Olivares-Robles, M.A., and Garcia Ruiz, A.F. 2018. Thermoelectric Cooling: The Thomson Effect in Hybrid Two-Stage Thermoelectric Cooler Systems with Different Leg Geometric Shapes, Bringing Thermoelectricity into Reality, Patricia Aranguren, IntechOpen, https://www.Intechopen.com/books/bringing-thermoelectricity-Into-reality/thermoelectric-cooling-the-thomson-effect-in-hybrid-two-stage-thermoelectric-cooler-systems-with-dif. Aug. 25, 2020.
Schaevitz, S.B. A MEMS Thermoelectric Generator. 2000. Master's thesis, Massachusetts Institute of Technology. Cambridge, MA, United States.
Schierning, G., Chavez, R., Schmechel, R., Balke, B., Rogl, G. and Rogl, P., 2015. Concepts for medium-high to high temperature thermoelectric heat-to-electricity conversion: a review of selected materials and basic considerations of module design. Translational Materials Research, 2(2), p. 025001. Philadelphia, PA, United States.
Self, D. 2019. Thermo-Electric Generators. www.douglas-self.com/MUSEUM/POWER/thermoelectric/thermoelectric.htm. Oct. 26, 2019.
Shuai, J., Wang, Y., Kim, H.S., Liu, Z., Sun, J., Chen, S., Sui, J. and Ren, Z., 2015. Thermoelectric properties of Na-doped Zintl compound: $Mg_3-xNa_xSb_2$. Acta Materialia, 93, pp. 187-193. https://www.sciencedirect.com/science/article/abs/pii/S1359645415002657. Apr. 13, 2019.
Sinha, B., 2017. Study of solar thermoelectric generators coupled with concentrated solar power systems. Doctoral dissertation, San Francisco State University. San Francisco, CA, United States.
Soinski, A.J. and Harville, J. 2015. Guidelines for Certification of Combined Heat and Power Systems Pursuant to the Waste Heat and Carbon Emissions Reduction Act, Public Utilities Code Section 2840 et. seq. California Energy Commission. CEC-200-2015-001-CMF. Sacramento, CA, United States.
Sundqvist, B. 1992. Thermal diffusivity and thermal conductivity of Chromel, Alumel, and Constantan in the range 100-450 K. Journal of Applied Physics 72, 539. https://aip.scitation.org/doi/pdf/10.1063/1.351885?class=pdf. May 12, 2019.
Surplice, N.A. and Jones, R.P., 1964. The thermoelectric power and electrical conductivity of calcium and magnesium oxides. British Journal of Applied Physics, 15(6), p. 639. https://iopscience.iop.org/article/10.1088/0508-3443/15/6/304/meta. Apr. 14, 2019.
Takagiwa, Y., Sato, Y., Zevalkink, A., Kanazawa, I., Kimura, K., Isoda, Y. and Shinohara, Y., 2017. Thermoelectric properties of $EuZn_2Sb_2$ Zintl compounds: zT enhancement through Yb substitution for Eu. Journal of Alloys and Compounds, 703, pp. 73-79. https://www.sciencedirect.com/science/article/abs/pii/S0925838817304048 1/. Apr. 14, 2019.
TE Connectivity. 2018. Thermopile Sensor for Contactless Temperature: Application Note. https://www.te.com/content/dam/te-com/documents/sensors/global/analog-digital-thermopile-application-note.pdf. Sep. 2, 2020.
Tecteg. ND. TEG Cascade 800° C. Hot Side Thermoelectric Power Modules. https://thermoelectric-generator.com/teg-cascade-800c-hot-side-thermoelectric-power-modules/ Jul. 6, 2019.
Tecteg. ND. CMO-32-62S. https://thermoelectric-generator.com/wp-content/uploads/2014/04/CMO-32-62S-OXIDE-ONLY-new.pdf. Mar. 6, 2020.
Thomasnet. ND. Pin Insertion Machinery Suppliers https://www.thomasnet.com/products/pin-insertion-machinery-47943600-1.html. Jan. 20, 2019.
Toenshoff, D.A. and Zysk, E.D., 1975. High Temperature Thermocouple System for Advanced Aircraft Turbine Engines. Prepared by Engelhard Minerals and Chemicals Corporation for the United States Air Force Aero-Propulsion Laboratory, Wright-Patterson AFB, OH, United States.
UMG Technologies. ND. Introducing the Semi-Automatic AE-2001 Bulk Eyelet Bench Top Inserter. Product literature. UMG Technologies, Inc., Danvers, MA, United States.
UMG Technologies, ND. Introducing the Model PLT-902 SXP Inline Servo Driven Pin Inserter. Product literature. UMG Technologies, Inc., Danvers, MA, United States.
University of Mississippi. Seebeck and Peltier Effects. http://www.phy.olemiss.edu/~cremaldi/PHYS417/Seebeck%20and%20Peltier%20Effects.pdf. Oct. 26, 2019.
United States Department of Energy. 2006. National Renewable Energy Laboratory. Ten-Year Site Plan FY2007-FY2018. https://www.energy.gov/sites/prod/files/2014/08/f18/nrel_tysp_1-4-07.pdf. Sep. 2, 2020.
United States Department of Energy. 2017. How Combined Heat and Power Can Support State Energy Planning. Apr. 24. Office of Energy Efficiency & Renewable Energy. https://www.energy.gov/sites/prod/files/2017/04/f34/Pathways-CHP_0417.pdf. Sep. 2, 2020.
United States Department of Energy. ND. Thermoelectric Materials, Devices, and Systems: Technology Assessment (Draft). https://www.energy.gov/sites/prod/files/2015/02/f19/QTR%20Ch8%20-%20Thermoelectic%20Materials%20TA%20Feb-13-2015.pdf. Jan. 16, 2020.
United States Department of Energy. 2015. Quadrennial technology review 2015—Chapter 6: Innovating clean energy technologies in advanced manufacturing: Waste Heat Recovery Systems. https://www.energy.gov/sites/prod/files/2016/02/f30/QTR2015-6M-Waste-Heal-Recovery.pdf. Sep. 4, 2020.
United States Department of Energy. 2015. Quadrennial technology review 2015—Chapter 6: Innovating clean energy technologies in advanced manufacturing: Additive Manufacturing. https://www.energy.gov/sites/prod/files/2015/11/f27/QTR2015-6A-Additive%20Manufacturing.pdf. Sep. 4, 2020.
Virginia Tech. ND. The Thermopile. https://vtechworks.lib.vt.edu/bitstream/handle/10919/37014/chap2.pdf?sequence=3. Sep. 2, 2020.
Wall-Colmonoy. 2014. Niferobraz. Technical data sheet. Wall-Colmonoy Corporation, Madison Heights, MI, United States.
Wereszczak, A.A., Wang, H., Mccarty, R. Thompson, A, and Sharp, J. May 2012. Thermoelectric mechanical reliability. In Vehicle Technologies Annual Merit Review and Peer Evaluation Meeting. https://www.energy.gov/sites/prod/files/2014/03/f11/pm012_wereszczak_2011_o.pdf. Sep. 4, 2020.
Westinghouse Electric Corporation. 1970. Cascaded thermoelectric test generator final report. Astronuclear Laboratory. JPL Contract 952196. Sep. 25. Pittsburgh, PA, United States.
Wikipedia. 2019. Thermal diffusivity. https://en.wikipedia.org/wiki/Thermal_diffusivity. May 12, 2019.
Wikipedia. 2019. Thermal contact conductance. https://en.wikipedia.org/wiki/Thermal_contact_conductance. May 12, 2019.
Yang, Z., Pradogonjal, J., Phillips, M., Lan, S. et al., "Improved Thermoelectric Generator Performance Using High Temperature Thermoelectric Materials," SAE Technical Paper 2017-01-0121, 2017. SAE International. Warrendale, PA, United States.
Yazawa, K. and Shakouri, A., 2012. Cost-effective waste heat recovery using thermoelectric systems. Journal of Materials Research, 27(9), p. 1211. New York, NY, United States.
Zevalkink, A. 2013. Chain-Forming Zintl Antimonides as Novel Thermoelectric Materials. Doctoral Dissertation, California Institute of Technology, Pasadena, CA, United States.
Zhao, D., Qian, X., Gu, X., Jajja, S.A. and Yang, R., 2016. Measurement techniques for thermal conductivity and interfacial thermal conductance of bulk and thin film materials. https://arxiv.org/pdf/1605.08469.pdf. Sep. 14, 2020.
Zircar Zirconia, Inc. ND. "High Temperature Yttria Stablized Zirconia Insulation." Technical Data Sheet. ZZ-5010 Rev.01. Florida, NY, United States.
Champier, D., Bedecarrats, J.P., Rivaletto, M., and Strub, F. 2009. Energy. (In press) doi: 10.1016/j.energy.2009.07.015. Amsterdam, Netherlands.

(56) References Cited

OTHER PUBLICATIONS

Full Spectrum Laser. ND. https://fslaser.com/Product/Pegasus3D. Dec. 4, 2018.
Author Unknown. ND. Agglomerated sintered spray powders of carbide metal systems modified with the high temperature water-soluble flux. ResearchGate. Web page has been removed and cannot be located.
Tethon 3D. ND. Vitrolite® User Guide. https:/tethon3d.com/wp-content/uploads/Vitrolite-User-Guide.pdf. Sep. 14, 2020.
Li, Guodong et al., Structure and Failure Mechanism of the Thermoelectric CoSb/TiCoSb Interface, ACS Appl. Mater. Interfaces, Nov. 1, 216.
Rogl, Gerda, Mechanical Properties of Scutterudites, Science of Advanced Materials, Aug. 2011.

\* cited by examiner

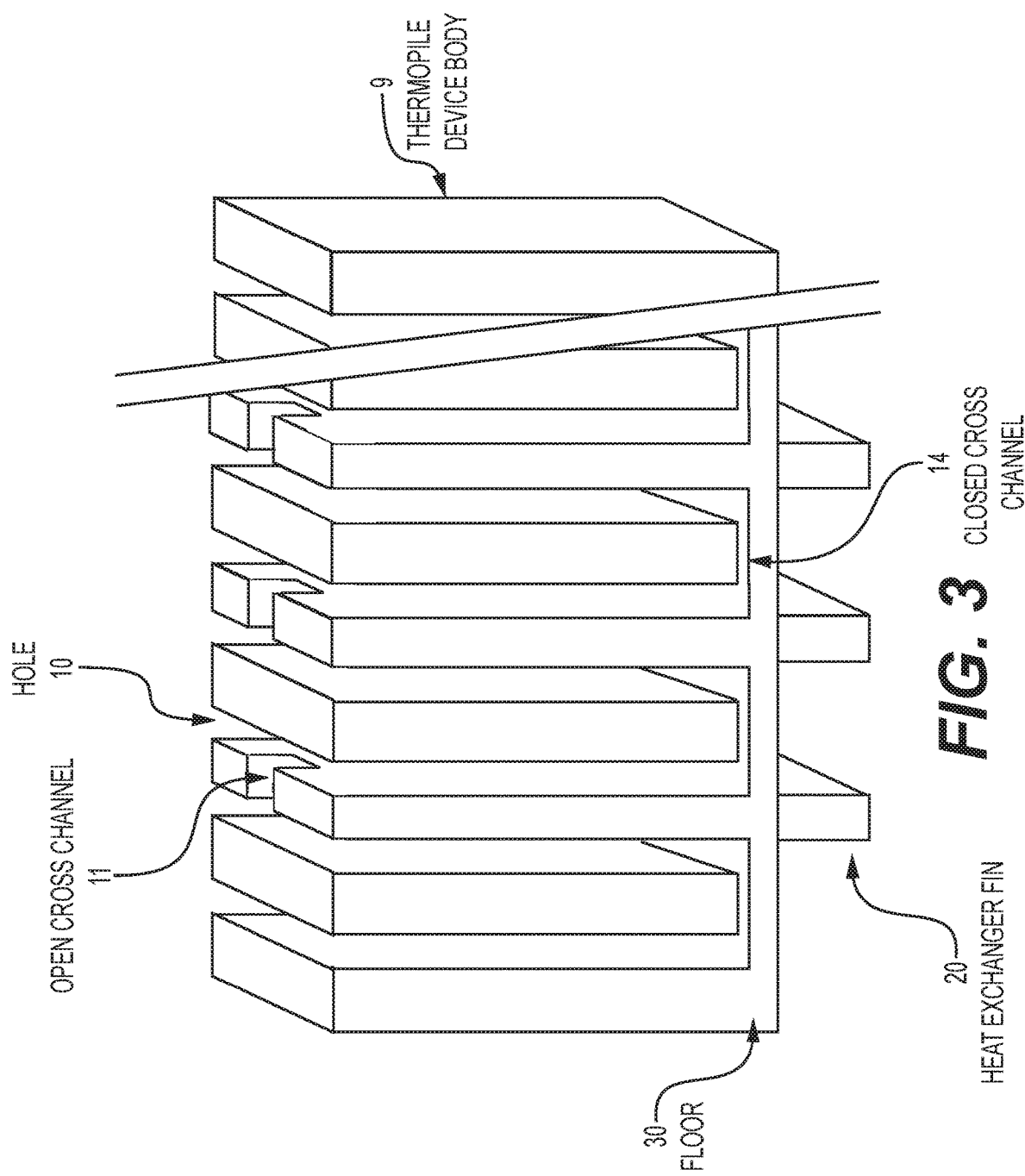

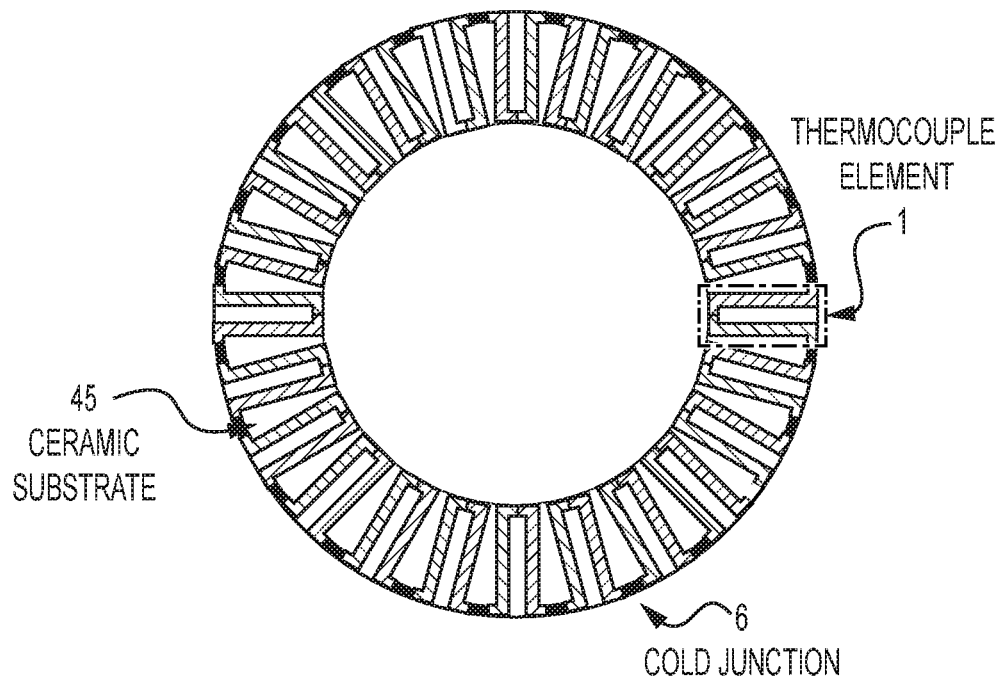
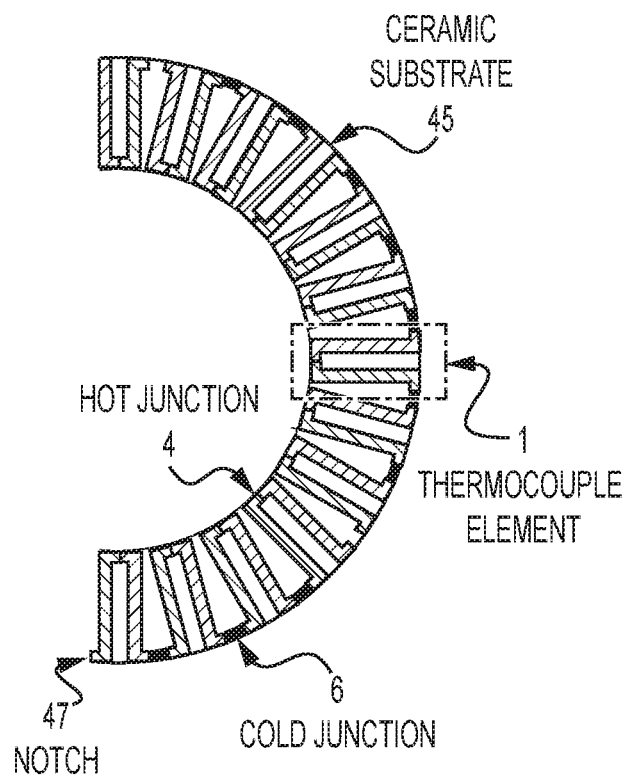
FIG. 12

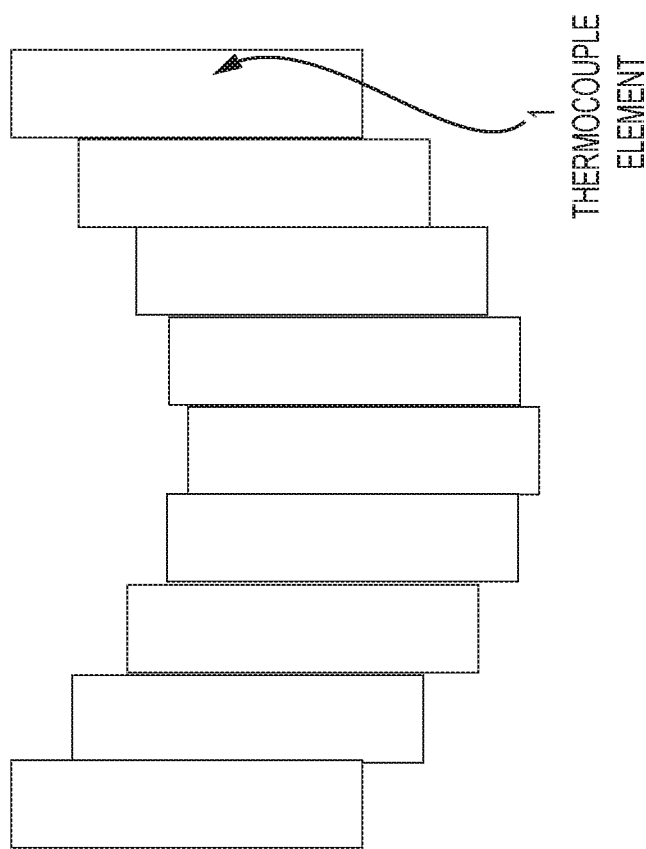
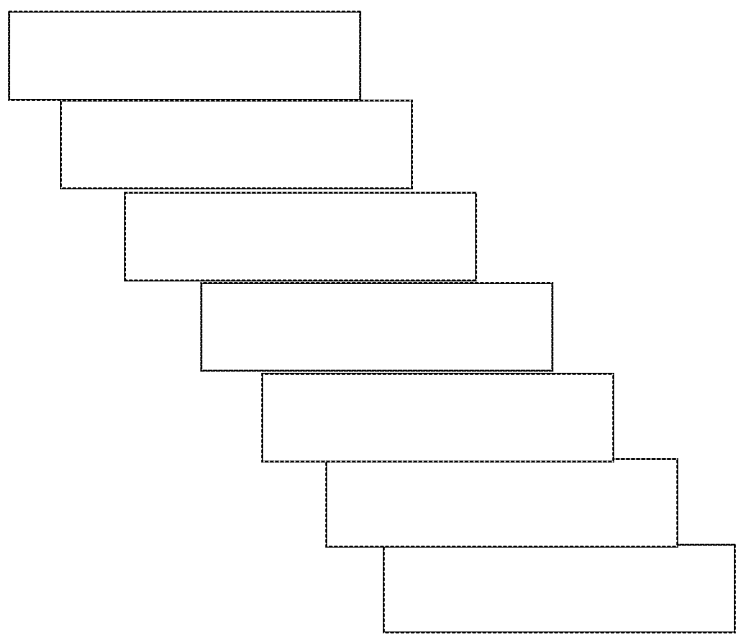
FIG. 13

THERMOPILE ASSEMBLY PROVIDING A MASSIVE ELECTRICAL SERIES OF WIRE THERMOCOUPLE ELEMENTS

RELATED APPLICATIONS

The present application is a Continuation-in-Part of and claims benefit to U.S. patent application Ser. No. 16/288,081 entitled "Thermopile Assembly Providing a Massive Electrical Series of Thermocouple Elements" and filed on Feb. 13, 2019, which is hereby incorporated by reference. The present application also claims benefit to U.S. provisional application Ser. No. 62/636,253 entitled "3D-Printed Stacked Thermopile Providing Massive Electrical Series Assembly of Thermocouple Elements" and filed Feb. 28, 2018, Ser. No. 62/646,582 entitled "Thermopile Assembly Providing a Massive Electrical Series of Thermocouple Elements" and filed Mar. 22, 2018, Ser. No. 62/767,720, entitled "Thermopile Assembly Providing a Massive Electrical Series of Thermocouple Elements" and filed Nov. 15, 2018 and Ser. No. 62/805,285 entitled "Thermopile Assembly Providing a Massive Electrical Series of Wire Thermocouple Element" and filed Feb. 13, 2019, which are all incorporated by reference herein. The present application claims benefit of PCT International Application No. PCT/US19/19919 entitled "Thermopile Assembly Providing a Massive Electrical Series of Thermocouple Elements" and filed on Feb. 28, 2019, which is hereby incorporated by reference.

FIELD OF THE INVENTION

This generally relates to thermopiles which generate electricity from heat. In particular, the present disclosure relates to wires used as thermocouple elements in thermopiles.

BACKGROUND

In thermoelectric power generation, electricity is generated from heat. To do so, a thermocouple produces an electromotive force ("EMF," more commonly called a "voltage") when there is a temperature difference between the (hot) "measuring" junction of the thermocouple and the (cold) "reference" junction of the thermocouple. Thermopiles are arrangements of thermocouples in an electrical series. The series arrangement provides for the voltages generated by each thermocouple to be additive, as a voltage equal to the number of hot junctions multiplied by the EMF of each thermocouple is produced. Accordingly, thermopiles have been used to generate electric power in certain applications, notably in spacecraft. Unfortunately, the power generated by standard thermocouples is generally small and in the low millivolt range.

Numerous conventional designs for thermopiles and thermoelectric power-generation devices are known. Many of these designs employ material formulations that produce a relatively strong thermoelectric effect. The goals in developing many of these designs and materials have often been to optimize and maximize EMF and efficiency in converting heat into electricity by way of the thermoelectric materials themselves. These conventional designs, however, often sacrifice cost effectiveness and practicality in the interest of producing maximum power-generation efficiency by way of the chemical and microstructural properties of the materials used. The materials used in these technologies are, additionally, often scarce, toxic and/or less-robust, stable, and resilient than more commonly used thermocouple materials such as iron, copper, nickel-chromium, nickel-aluminum alloys, and other common materials such as NICHROME, MONEL, and nickel that produce a thermoelectric effect. Additionally, many innovative, high-efficiency materials such as bismuth telluride, lead telluride, and tetrahedrites are not usable at elevated temperatures at which standard thermocouple materials will perform adequately.

Accordingly, it is desirable to have an assembly and process that is cost efficient and avoids these and other related problems.

SUMMARY

In accordance with an embodiment, a thermopile is provided including a series of thermocouples having wires, comprising a heat-resistant, electrically-insulative container, comprising a first hole configured to receive an electrically-positive wire. The container further comprises a second hole configured to receive an electrically-negative wire parallel to the first hole, and a cross-channel configured to receive electrically-conductive material and connecting the first hole and the second hole such that, when the heat-resistant, electrically-insulative container is heated with the electrically-positive wire deposited in the first hole and the electrically-negative wire deposited in the second hole and the electrically conductive material deposited in the cross channel, the cross-channel forms a hot junction in a thermocouple element formed by the electrically-positive wire and the electrically-negative wire.

In accordance with another embodiment, a thermopile for withstanding high heat having wires is provided comprising a heat-resistant, electrically-insulative container comprising a plurality of rows of holes configured to receive electrically-positive wires and electrically-negative wires. Each row of holes comprises a plurality of pairs of holes, and is connected by a cross-channel to one or more other rows of holes, the cross channel configured to receive an electrically-conductive material. Each pair of holes is connected to one or more other pair of holes in the same row by a cross-channel. Each hole in the pair of holes connected to each other with an cross-channel, such that when the electrically-positive wires and the electrically-negative wires are deposited in the holes, the electrically-conductive material is deposited in the cross-channel and the heat-resistant, electrically-insulative container is heated, the electrically-positive wires and the electrically-negative wires form thermocouple elements in the holes, the open cross-channels form hot junctions and cold junctions of the thermocouple elements, and the thermocouple elements are electrically-serially connected throughout the heat-resistant, electrically-insulative container to form the thermopile.

In yet another embodiment, a method of creating a heat-resistant thermopile having wires is provided, comprising depositing electrically-positive wires into a first set of holes in a heat-resistant, electrically-insulative container that contains cross-channels to a second set of holes parallel to the first set of holes, and depositing electrically-negative wires into the second set of holes in the heat-resistant, electrically-insulative container. The method further comprises depositing electrically conductive material in the cross channels, and heating the heat-resistant, electrically-insulative container to sinter or melt the electrically-conductive material, wherein the cross-channels form hot junctions and cold junctions of thermocouple elements created by the electrically-positive wires and the electrically-negative wires.

BRIEF DESCRIPTION OF THE DRAWINGS

FIG. 3 provides a supplemental, oblique cross-sectional view of holes and cross-channels formed in the body of the thermopile device and connection notches in which thermocouple junctions are formed on the top of the device.

FIG. 12 illustrates the arrangement of printed thermocouples into ring form and semicircular form both of which can be used to surround pipes and capture waste heat.

FIG. 13 illustrates how thermocouple elements can be arranged in staggered configurations to conform to curved or angled surfaces.

DETAILED DESCRIPTION

Figure 1:
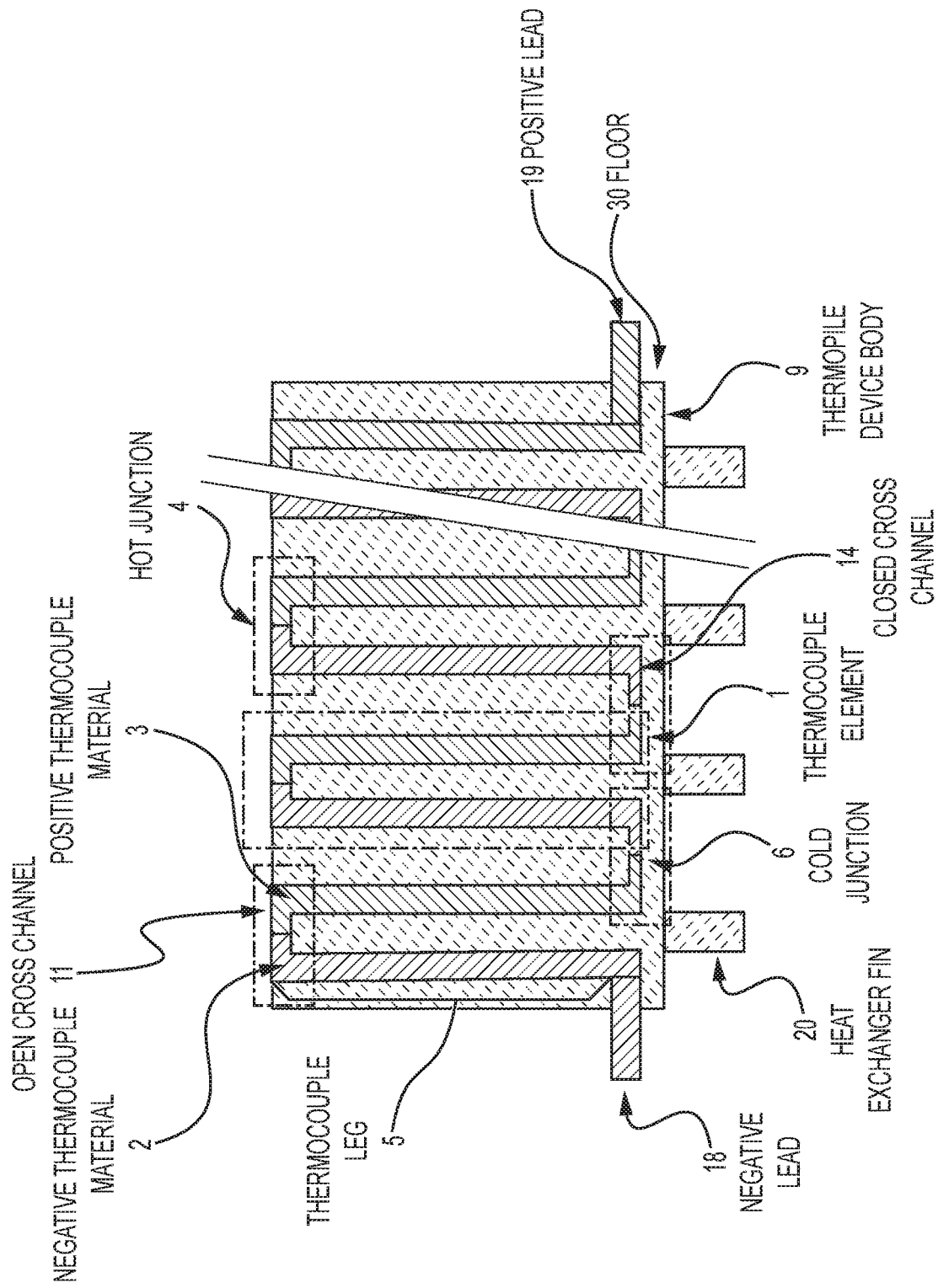
FIG. 1 illustrates a frontal cross-section of an embodiment a thermopile device with thermocouple materials deposited in cavities.

Methods and devices in accordance with the present invention provide for low-cost manufacturing of thermoelectric power-generation devices using stable, common materials that can function at temperatures as high as 1,000° C. (1,832° F.), and beyond. They do so with an improved geometry for thermocouple elements in the assembly. These assemblies provide for incorporating a very large number of thermocouples into a device which can therefore produce power levels usable in practical applications such as lighting, heating, cooling, running equipment, or selling the electricity to an electric utility company, for example. This geometry includes holes and cross-channels in an electrically-insulative ceramic, for example, whereby thermocouple material may be deposited and the device heated to sinter the deposited thermocouple material in place to form a thermopile.

These methods and devices also provide an improved thermopile assembly wherein substrates are stacked to create the thermopile. For example, the thermopile may be formed by 3D printing layers of thermocouple material with electrically-insulative material such as glass or ceramic, with the substrates stacked together to form a thermopile.

These device geometries and manufacturing procedures enable the low-cost production of thermopiles comprised of a massive number of thermocouple elements, from hundreds to hundreds of thousands or more, for electrical power generation using common, standard metallic thermocouple materials and common, widely used electrical insulation materials. The device can additionally employ a wide variety of metals that are not standard thermocouple materials but that nonetheless produce a thermoelectric effect. These thermopile devices can later be assembled into a series of devices further producing a cumulative power-generation effect.

These devices provide an economical and practical means of capturing waste heat thrown off by industrial processes, power generation, and waste disposal, for example, and using that heat to produce electric power by way of thermoelectric effects. The devices additionally provide a reliable primary way of generating electricity from heat produced by solar, nuclear, geothermal, fossil fuel, or biomass sources and a primary way of generating electricity by way of other naturally occurring or intentionally produced processes that produce thermal gradients. The devices are designed to be able to operate durably and reliably at temperatures greater than 300° C./672° F., up to 1000° C./1,832° F., and in some cases, even higher.

Several advantages are provided. First, as noted above, common, low-cost materials can be used which are durable, stable, and relatively low in toxicity, and which can be used at relatively high temperatures and in somewhat hostile environments—unlike many novel thermoelectric material formulations that have conventionally been developed to maximize thermoelectric power-generation efficiency.

Second, the configuration of the device, which can incorporate hundreds, thousands, and potentially hundreds of thousands of thermocouple elements or more into a thermopile configuration, provides thermoelectric power-generation efficiency due to the large number of thermocouples that can be formed within the device. "Additive" manufacturing (3-D printing) methods such as (but not limited to) stereolithography, binder jetting, material jetting, selective laser sintering, and powder-bed fusion, are particularly well-suited to fabricating the electrically-insulative body of the device which provides its overall structure and cavities into which thermocouple materials, in powder or paste form, are deposited and later sintered or melted into place. Additive manufacturing providing for the printing and sintering of multiple materials may additionally be used to print the entire device, including the thermocouple-material components. Other, more conventional methods of forming the electrically-insulative body can, of course be employed, including extrusion, casting, injection molding, machining, or the assembly of multiple electrically insulative components. Additionally, the materials making up the thermocouple elements can be deposited into the device or onto substrates comprising the device using vacuum deposition, sputtering, flame-spraying, and screen printing.

Third, the designs allow for relatively inefficient, but economical and stable materials to be arranged in a manner that provides a practical and economically attractive thermoelectric power-generation solution which is particularly well-suited to waste-heat recovery applications, but which can also be used in primary power generation applications noted above, for example. More thermoelectrically-efficient but often costly and less resilient thermocouple materials such as bismuth telluride, silicon germanium, lead telluride, tetrahedrites, and others can be used, as well as the standard and non-standard thermocouple material combinations noted above. For example, the design allows for many types of materials having thermoelectric effects, including highly efficient but comparatively novel materials that may be costly or fragile, and more common and less thermoelectrically efficient but highly resilient materials such as iron, nickel, copper, NICHROME, MONEL, and standard thermocouple materials such as CHROMEL, ALUMEL, and CONSTANTAN, to be arranged in a manner that provides relatively large aggregate thermoelectric effects when placed in a massive electrical-series arrangement.

Four general embodiments are described below, however, many more are possible. These are listed as Embodiments A-D. FIGS. 1-7 and 19 describe Embodiment A, FIGS. 8-13 and 20 describe Embodiment B, and FIGS. 14-16 describe Embodiment C, and FIGS. 17-18 described Embodiment D.

In Embodiment A, the process involves pre-forming a body of ceramic or other electrically-insulative material within which are preferentially formed cavities and channels into which thermocouple materials in powdered or paste form are deposited and then sintered or melted, forming thermoelements of highly integrated metallic structure. Provision is made in this embodiment for cross-channels in the body of the device that join pairs of thermocouple legs when thermocouple metals are deposited in them. These channels may be rectangular, cylindrical, or any other shape. This embodiment is described with respect to FIGS. 1-7 and 19.

The Embodiment B process is achieved by printing the body of the device, using three-dimensional printing technology or other solid-material printing technologies, while simultaneously printing the thermocouple materials therein. This embodiment is described with respect to FIGS. 8-13 and 20.

In Embodiment C, thermocouple metals are printed or deposited, in powder or paste form, onto or into pre-formed electrically-insulative substrates that are either flat or that have channels formed in them for receiving the metallic thermocouple materials, which are later sintered or melted. The metals are deposited in a manner that produces a large number of thermocouples in electrical series on each substrate, each of which comprises a subassembly of the device. These substrates are then inserted into a prefabricated terminal that connects the subassemblies in electrical series. This embodiment is described with respect to FIGS. 14-16.

Embodiment D is achieved by depositing thermocouple metals, in powder or paste form, into an electrically-insulative body having preformed through-holes, producing legs of individual thermocouples, and then forming thermocouple junctions on the top and bottom of the electrically-insulative body by depositing thermocouple metal in paste form in a manner that joins the thermocouple legs at the openings of the through-holes, thus forming thermocouple junctions, without the use of cross-channels, formed in the device body, described in the descriptions of the first embodiment. The powder or paste-form metals are later sintered in a controlled atmosphere to form highly integrated metallic components. Additionally, the through-holes in the device body in this embodiment may be rectangular, cylindrical, or any other shape. This embodiment is described with respect to FIGS. 17-18.

Embodiment A

FIG. 1 illustrates a frontal cross-section of Embodiment A of the thermopile device 7 with thermocouple materials deposited in cavities. It illustrates the basic scheme of construction and the manner in which the thermocouple materials are deposited into holes and cross-channels of the body of the thermopile device 7 which is made of an electrically-insulative material such as a ceramic or glass. The thermopile device 7 includes an individual thermocouple element 1 (shown circled on the figure) made of materials, in powder, paste, wire, or metal fragment form, comprising an electrically-negative leg of the element comprising a negative thermocouple material 2 and an electrically-positive leg of the element comprising a positive thermocouple material 3. In one embodiment, these positive and negative elements are repeatedly snaked throughout the thermopile device in a repeating elongated U-shaped and snaking fashion shown on FIG. 1. A thermocouple leg 5 is one length of the area of one type of thermocouple material, either positive or negative. The electrically-positive and electrically-negative thermocouple materials 2, 3 may be selected by the types of materials selected, whereas some materials will function as more electrically positive or electrically negative than others.

These thermocouple element materials are later sintered or melted into place at high temperatures in the device in controlled heating conditions such as a vacuum, inert, or reducing atmosphere. Each thermocouple element 1 additionally comprises a hot junction 4, to be situated closest to the heat source, which is formed by sintering, welding, brazing, soldering or otherwise bonding the ends of positive and negative thermocouple legs 5. Each thermocouple element 1 additionally comprises a cold junction 6 situated at a sufficient distance from the heat source to produce a substantial thermal gradient between the hot and cold junctions 4, 6, which is formed by sintering, welding, brazing, soldering or otherwise bonding positive and negative thermocouple legs 5 at the end of each thermocouple element 1 opposite the hot junction.

These cold junctions 6 also provide for electrical series connections of multiple thermocouple elements 1, forming a thermopile. That is, the cold junctions form electrical series connections that electrically connect the thermocouple elements with each other, and as described further below, electrically connect the rows of thermocouple elements with each other.

The hot and cold junctions 4, 6 may be made of the same material as the electrically-positive leg of the thermocouple element 1, or of the same material as the electrically-negative element of the thermocouple element, or of a third electrically conductive material in powder, paste, wire, or metal fragment form.

The pre-formed thermopile device body 9 of Embodiment A is made of electrically-insulative material, such as a ceramic or glass which may be fabricated by way of additive manufacturing (e.g., 3D-printing, which may include such methods as stereolithography, binder jetting, material jetting, selective laser sintering, and powder bed fusion). The thermopile device body 9 may also be fabricated by casting, molding, injection molding, machining, or the assembly of multiple electrically-insulative components. This thermopile device body 9 is further shown on FIGS. 2A-2B discussed below.

Outgoing negative lead 18 and positive lead 19 are provided, one at the beginning of the electrical series of thermocouple elements 1 in the thermopile, and one at the end. These negative and positive leads 18 and 19 may be formed by melting or sintering a powder or paste made of a thermocouple material (e.g., positive thermocouple material 2 or negative thermocouple material 3) or a third electrically conductive material in the open cross-channel 11 and closed cross-channel 14 formed in the thermocouple device 7, or by inserting fully-formed wires, rods, or connectors made of a thermocouple material 2, 3 or a third material at the extremities of the electrical series of thermocouple elements.

The open cross-channel 11 is the open area in the thermocouple device body 9 where positive and negative thermocouple materials 2, 3 meet. It is also the location of the hot junction 4 on FIG. 1. It is a cross-channel because it is a bridge between the legs 5 of the positive and negative thermocouple materials 2, 3 in a given thermocouple element 1, and it is open in this case because there is nothing above it, i.e., there is no ceramic or glass material of the thermocouple body enclosing it on the top. The open cross-channel is also shown on FIG. 2 described below.

Also shown is a closed cross-channel 14. On FIG. 1, this is the open space in the thermopile device body 9 where the positive and negative thermocouple materials meet on the bottom of the thermopile device 7. It is also the location of the cold junction 6 on FIG. 1. It is closed because the thermocouple device body 9 encloses it (and lies below it), and it is not open to the air. The floor 30 of the ceramic or other electrically-insulative material of the thermopile device body 7 seals the closed cross-channels.

External heat exchanger fins 20 providing a heat exchanger function may be formed on the exterior of the thermopile device body 9. These protrusions extend out from the surface of the body 9 of the device, adding surface area, and providing greater exposure of portions of the device on the cold junction side of the device body where all of the cold junctions 6 are located, to air or other heat removal media, for the purpose of enhancing the thermal gradient between the hot and cold thermocouple junctions 4, 6. These heat exchanger fins 20 can also function as protective stand-offs when located on the opposite hot junction side of the device body where the hot junctions are located.

Figure 2A:
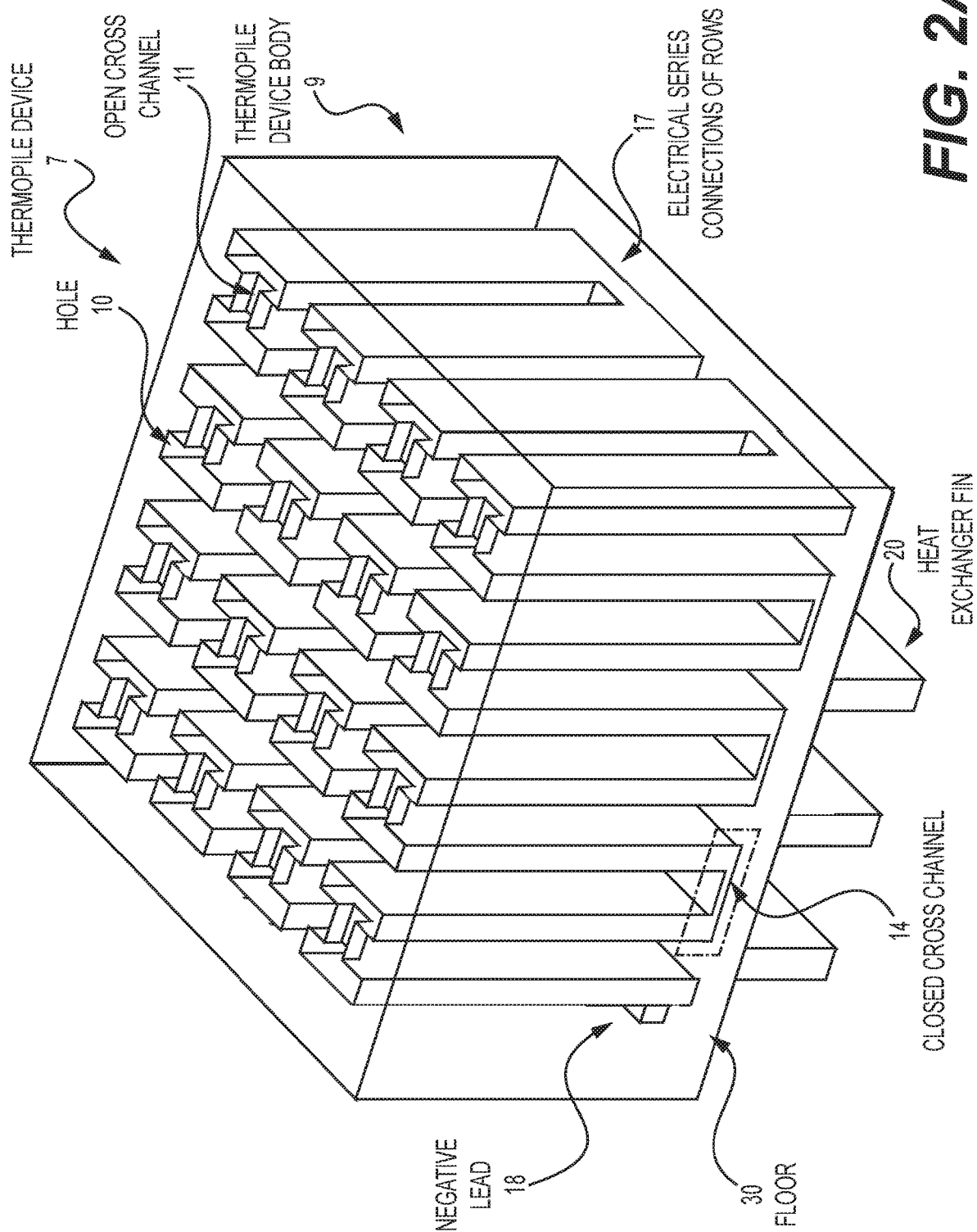
FIG. 2A illustrates a three-dimensional view of the thermopile device shown in FIG. 1.

FIG. 2A illustrates a three-dimensional view of the thermopile device 7 of Embodiment A shown in FIG. 1. FIG. 2A shows the arrangement of holes 10 and open and closed cross-channels 11, 14 in the body of the Embodiment A thermopile device 7 into which thermocouple materials will be deposited and fixed into place. As mentioned previously, these cross-channel cavities provide for the formation of hot and cold junctions 4, 6, as well as electrical series connections between thermocouple elements 1 and rows of thermocouple elements, and outgoing leads. These holes 10 are where the positive and negative thermocouple materials 2, 3 are deposited. Holes 10 and open cross-channels 11 are pre-formed in this thermopile device body 9.

These holes 10 may be blind holes (enclosed on one end) or through-holes (open on both ends). In the embodiment in FIG. 2A, the holes 10 are blind holes, whereas they are closed on the bottom. These blind holes 10 are formed and connected by a closed cross-channel 14. One set of blind holes is reserved for negative thermocouple materials while another set of blind holes is reserved for positive thermocouple materials.

The negative and positive thermocouple materials 2, 3 are deposited into the holes 10 to form the legs 5 of the thermocouple elements 1. The negative and positive thermocouple materials 2, 3, or a third electrically conductive material, is deposited in the cross-channels 11, 14 to form the hot and cold thermocouple junctions 4, 6. The formation of the thermocouple cold junctions 6 additionally forms an electrical series of thermocouple elements, also known as a thermopile. Some of these closed cross-channels 14 and cold junctions 6 therein formed also provide electrical series connections of rows of thermocouple elements 17 shown on FIGS. 2A and 2B.

The electrical connection series in a row of thermopile elements 1 is formed by the electrical connection in the closed cross-channels 14 and cold junction 6 between each thermopile in the row (see, for example, the top row of elements on FIG. 2A) Each of the elements is connected in a series.

The rows of thermopile elements 1 are connected in the closed cross-channel, e.g., electrical row connection 17. For example, the top row of elements is connected to the row below it by the closed cross-channel 17 (and cold junction 6) shown on the figure. That is, the far right thermocouple leg of the top row and the far right thermocouple leg of the row beneath it are connected by the closed cross-channel of the electrical row connection 17. This arrangement is repeated to produce a massive electrical series of thermocouples. As such, in one embodiment, all thermopile elements 1 are electrically connected in series.

The deposition of thermocouple materials specified in FIG. 1, is in a length, width, and depth that provides for relatively low electrical resistance, allowing for a relatively high current flow and, accordingly, a high wattage output when the thermocouples in the device are arranged in a massive series. This relatively heavy deposition of thermocouple materials contributes to its efficiency in power generation. Heavier thermocouple-material deposition reduces the electrical resistance of the thermocouple elements 1 and will in turn reduce the overall electrical resistance of the device. 3-D printing (additive manufacturing) is particularly suitable to this operation as it can form channels which are difficult to produce using more conventional methods.

Figure 2B:
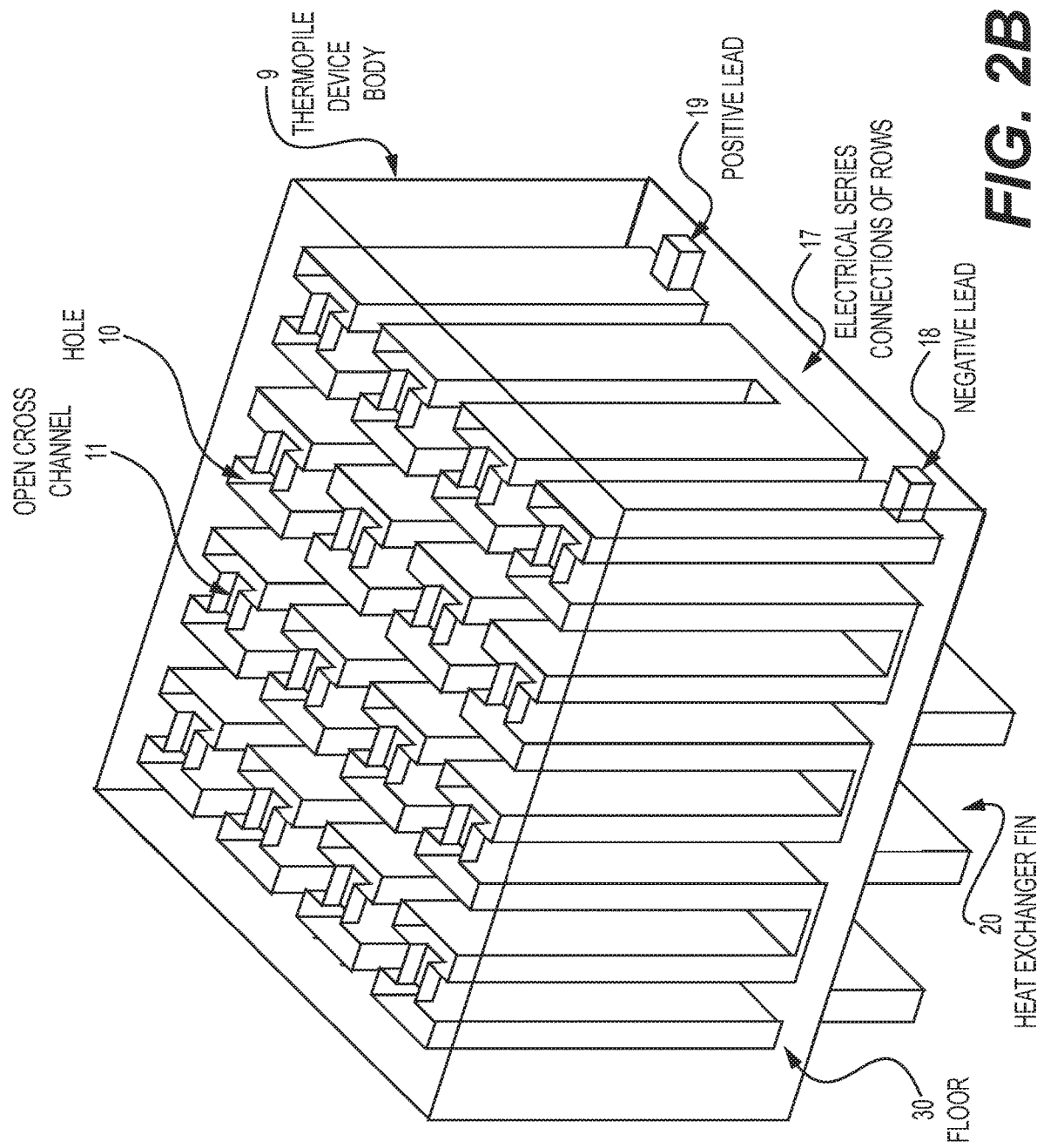
FIG. 2B illustrates a reverse angle of the three-dimensional view of the thermopile device shown in FIG. 2A.

FIG. 2B shows a reverse angle of the three-dimensional image of the thermopile device shown in FIG. 2A. Positive lead 19 is visible in FIG. 2B.

FIG. 3 provides a supplemental, oblique cross-sectional view of holes 10 and cross-channels 11 formed in the body 9 of the Embodiment A of the thermopile device 7. Hot thermocouple junctions 4 are formed on the top of the thermocouple device 7.

Figure 4:
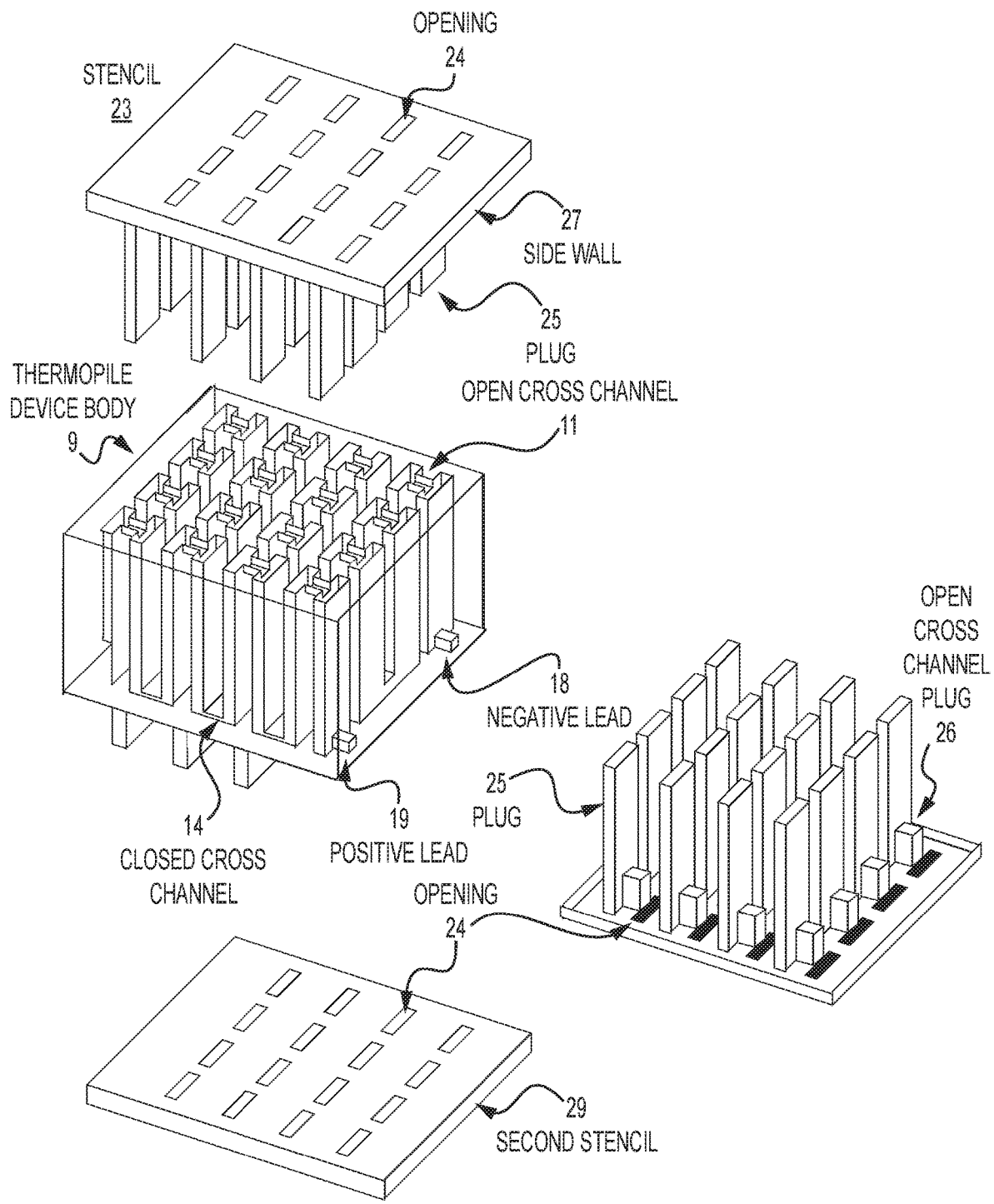
FIG. 4 shows a stencil used in fabrication of the thermopile device.

FIG. 4 shows a stencil 23 for fabricating the device 7 which provides for the deposition of powdered or paste-form thermocouple materials into the appropriate holes 10 and open cross-channels 11 in the electrically-insulative body of the Embodiment A. FIG. 4 shows the stencil 23 as it would be inserted into the thermocouple device 7. This stencil 23 also provides plugs 25 that prevent the introduction of the positive and negative thermocouple materials 2, 3 into incorrect holes 10 and cross-channels 11 in the thermopile device body 9. The stencil 23 guides the deposition of thermocouple materials 2, 3 into the correct holes 10 and open cross-channels 11 that have been pre-formed in the device body 9 while simultaneously blocking deposition of these materials into incorrect cavities. Openings 24 are provided in the stencil 23 for preferential deposition of thermocouple materials into the pre-formed cavities in the thermopile device body 9. The stencil 23 is also provided with side walls 27 that align the stencil 23 and its openings with the through-holes 10 and cross-channels 11 pre-formed in the body of the device.

On the right side, FIG. 4 also shows the underside of the stencil 23. This figure shows that open cross-channel plugs 26 integral to the stencil 23 are provided for preventing the deposition of thermocouple materials into incorrect cavities in the body 9 of the device which may otherwise enter the cavities by way of open cross-channels 11 formed in the body of the device.

A second stencil 29 is shown at the bottom left of FIG. 4. This stencil 29 without plugs may be employed to guide the deposition of thermocouple material of one polarity into a set of holes 10 when the other set of holes 10 have already been filled with thermocouple material of another polarity.

A third stencil (not shown) without plugs may be employed to guide the deposition of thermocouple materials 2, 3, or a third electrically-conductive material, into an open cross-channel 11 when the two holes 10 have been filled with thermocouple materials. Any of these stencils may be made of any thin and resilient material, preferably plastic or other electrically non-conductive material.

Three exemplary methods of fabricating the thermopile device body 9 for this embodiment are presented as follows and are described with respect to FIGS. 5 and 6. The first provides for the fabrication of a one-piece, pre-formed thermopile device body 9 made of electrically-insulative material, such as a ceramic or glass. In this embodiment, on the cold junction side of the device body 9 where the cold junctions 6 are located, a floor 30 made of ceramic or other electrically-insulative material is provided that forms blind holes 10 and closed cross-channels 14 at the bottoms of the blind holes into which the thermocouple materials are deposited.

Figure 5:
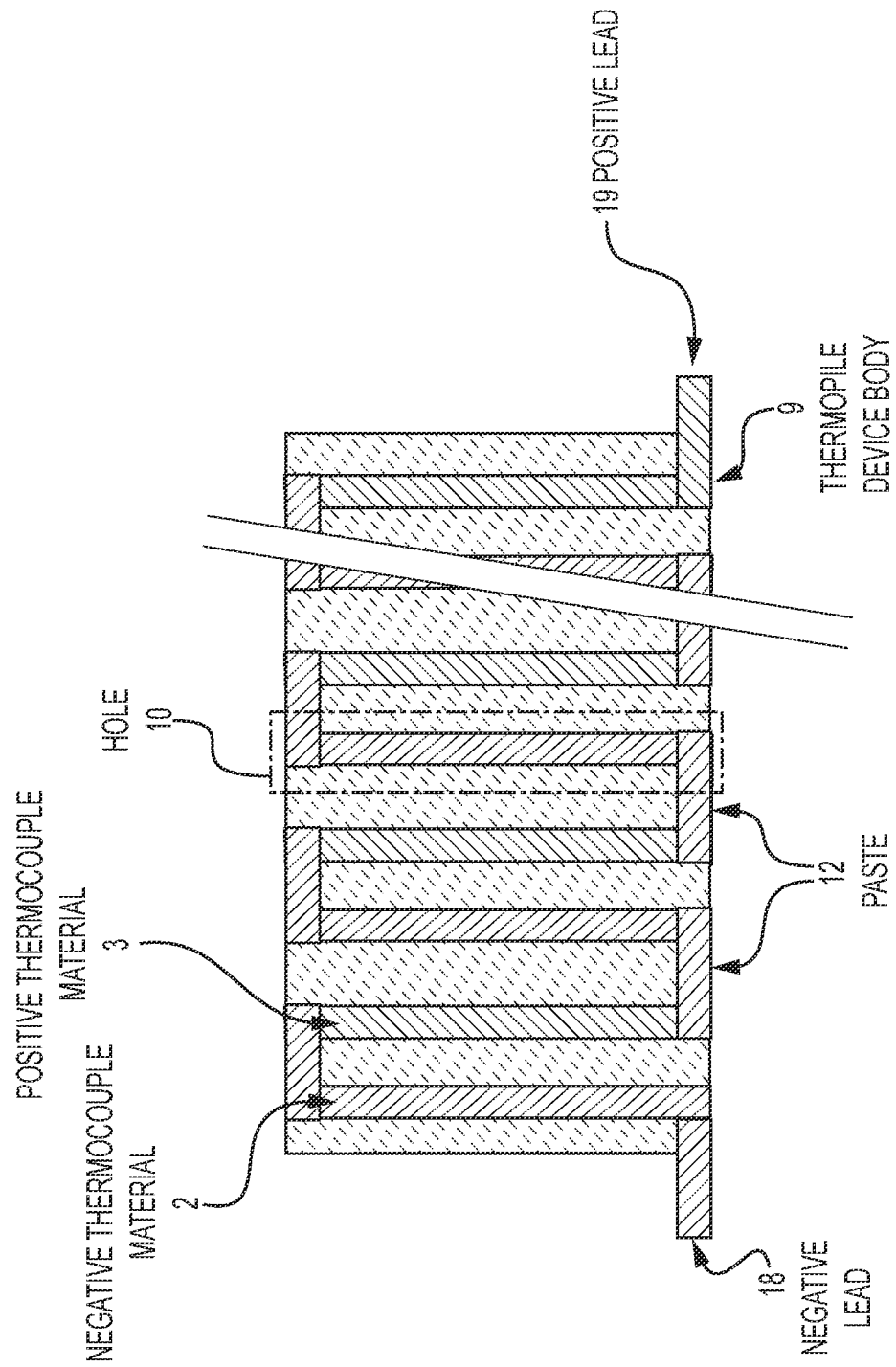
FIG. 5 shows a fabrication method of the device body using pastes comprised of thermocouple materials to seal through-hole openings on the bottom.

FIG. 5 shows a second fabrication method of the thermopile device body 9 wherein pastes 12 comprised of thermocouple materials, or other electrically conductive material, are used to seal through-hole openings on the bottom of the device allowing deposition of powdered thermocouple materials while avoiding leakage of the powders. This second method provides for the fabrication of a one-piece pre-formed thermopile device body 9 made of electrically-insulative material containing through-holes 10 and open cross-channels 11. In this approach, thermocouple material or other electrically conductive material in paste-form 12 is deposited into the open cross-channels 11 on one side of the thermopile device body 9, sealing the cavities so powdered or paste-form thermocouple materials 2, 3 can be deposited in the open ends of the through-holes 10, on the opposite side of the thermopile device body 9 without leakage. A paste 12, such as a metallic brazing compound or a paste made of powdered thermocouple material of a third electrically conductive material may additionally be used to seal the opposite ends of the holes once the thermocouple materials have been deposited. Other sealants may be used as well, such as those which will burn off during the process of sintering or welding the thermocouple materials that have been deposited in the device body.

Figure 6:
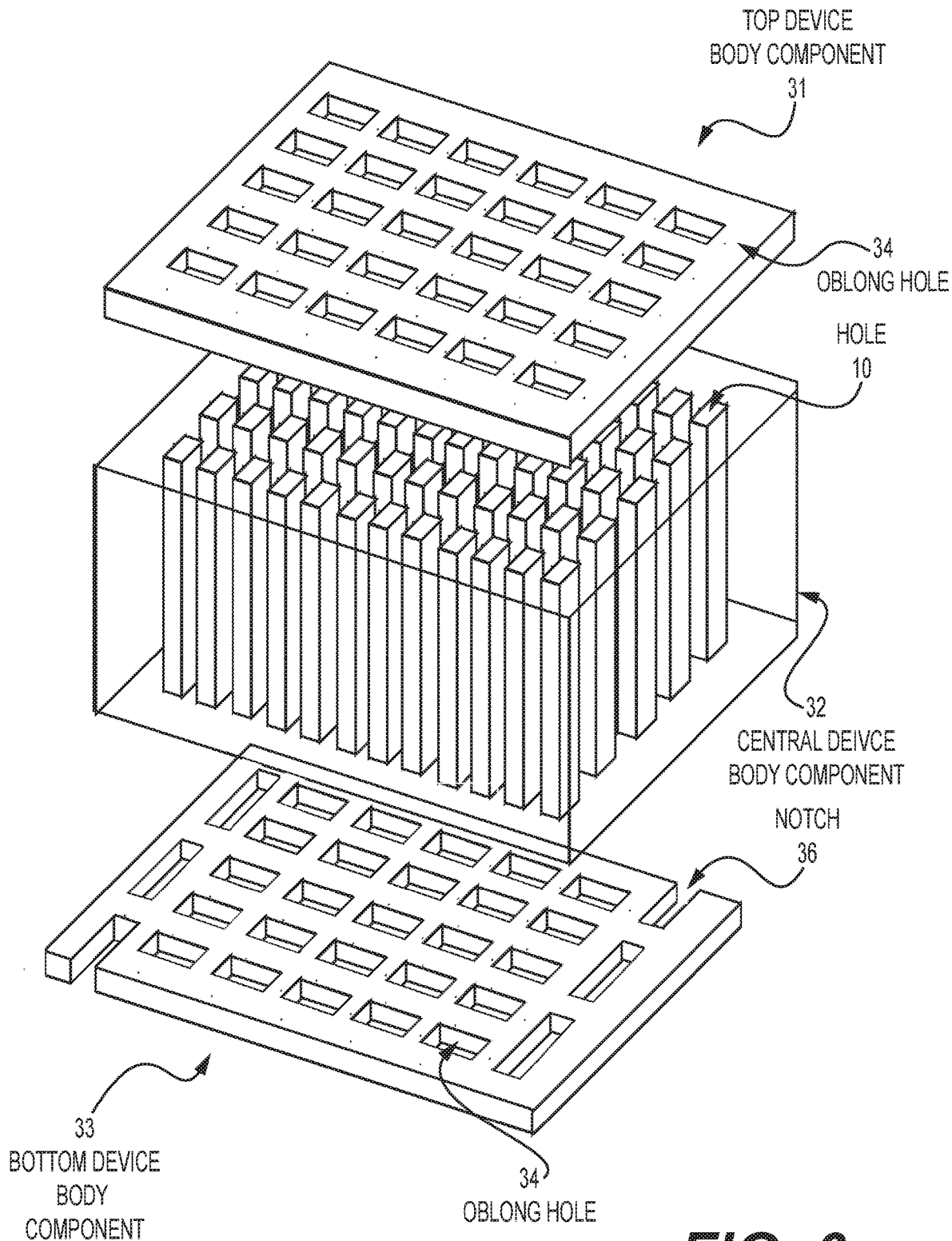
FIG. 6 shows another fabrication method wherein three separate electrically-insulative components are combined to form the device body.

FIG. 6 shows as third fabrication method wherein three separate electrically-insulative components are combined to form the thermopile device body 9. These components comprise a prefabricated main component 32 shown in the middle having a multiplicity of vertical through holes 10, and two flat components 31,33 used to form cross-channels connecting the holes within the thermopile device body 9 on the top and bottom of the device body (the locations of the hot and cold junctions 4, 6 into which thermocouple materials in powder or paste form will be deposited to form thermocouple junctions. In this third method, the top device body component 31, a central device body component 32 and a bottom device body component 33 may be made by way of 3D-printing, casting, molding, or machining. In this approach, the three components contain through-holes 10. The central component 32 contains through-holes 10 that will contain the thermocouple materials making up the legs 5 of the thermocouple elements 1 while the thinner top and bottom device body components 31, 33 contain oblong through-holes 34 that are fabricated to align with the through-holes 10 in the central component 32 in a manner that joins pairs of through-holes in the central component that contain electrically positive and negative thermocouple materials.

When thermocouple materials, or a third electrically conductive material in powder, paste, wire, or fragment form are deposited into the oblong through-holes 34, 35 in the top electrically-insulative device body component 31 or the bottom electrically-insulative device body component 33, electrical and mechanical connections are produced in the form of thermocouple junctions 4, 6. Deposition of thermocouple materials 2, 3 or a third electrically conductive material in the through-holes of the top device body component 31 forms the hot junctions 4 of the thermopile while deposition of thermocouple material 2, 3 or a third electrically conductive material in the through-holes 34 of the bottom device body component 33 forms the cold junctions 6, the electrical series connections of the device and electrical series connections of rows of thermocouple elements 17 in the device. The deposition of thermocouple material 2, 3 or a third electrically conductive material into the oblong through-holes 34 in the top and bottom device body components 31, 33 additionally bonds the top and bottom device body components mechanically to the middle component 32. Notches 36 in the bottom component provide for the deposition of thermocouple materials or a third electrically conductive material for the formation of outgoing negative and positive leads 18, 19.

Electrically-insulative coatings may be used to enhance device safety and avoid malfunctions. A ceramic, or other electrically-insulative coating, may be deposited over the thermocouple junctions formed on the top and bottom of the device where openings into which the thermocouple materials are deposited are located, to prevent inadvertent short circuits should the junctions come in contact with a conductive material or fluids, and to prevent risk of electric shock to anyone handling the device, or risk of electric shock or electrical interaction with other devices in proximity to the thermopile. However, some configurations of the device may not incorporate this coating. The thicknesses of this coating, as well as the materials used, may be preferentially varied to enhance heat transfer to and from the device and the temperature gradient between the hot and cold junctions 4, 6. Additionally, a material having a high level of thermal conductivity, such as silver or copper, may be used as a coating on this part of the device in a manner that excludes the coating from the thermocouple and thermopile circuits.

The thermopile device 7 allows the use of materials having different thermal conductivities to enhance thermal gradients across the device. Materials having low levels of thermal conductivity may be used in the hot junction area of the thermopile device 7 to retain heat and insulate the rest of the device from the heat source, while materials having a comparatively high level of thermal conductivity in the cold junction area of the device are used to remove heat and keep the cold junctions 6 cool. Higher temperature gradients between the hot and cold thermocouple junctions 4, 6 in a thermopile create higher voltages, and this provision maximizes the temperature differences within these gradients. Additionally, the thermopile device body 9 may be composed of materials that structurally incorporate gradations of thermal conductivity to preferentially direct the flow of heat through the device and enhance the temperature difference between the hot and cold junctions 4, 6 thereby increasing power output.

Figure 7:
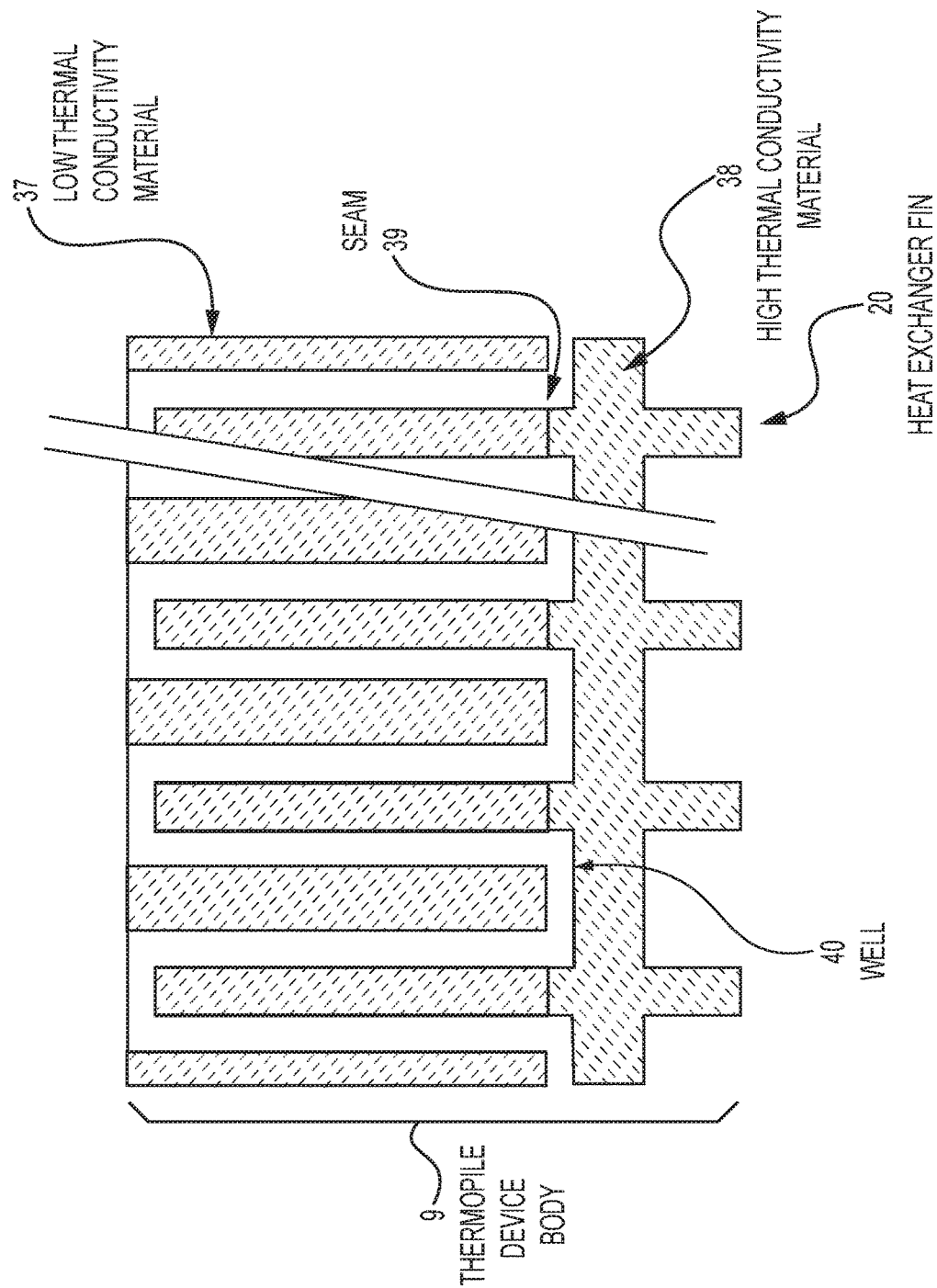
FIG. 7 shows the use of electrically-insulative materials of differing thermal conductivities to fabricate the device body to enhance the thermal gradient between the hot and cold junctions of the device.

FIG. 7 shows the use of electrically-insulative materials of differing thermal conductivities to fabricate the device body for the purpose of enhancing the thermal gradient between the hot and cold junctions 4, 6 of the device, thereby enhancing voltage output. To achieve the thermal gradient, the thermopile device body 9 may be constructed of two sections, one on the cold junction side of the device body where the cold junctions 6 are located, and one on the opposite hot junction side of the device body where the hot junctions 4 are located. The section located at the hot side of the thermopile device 7 is composed of a material low in thermal conductivity 37 such as zirconium oxide, mullite, silicon dioxide, or borosilicate glass. This material both retains heat and insulates the rest of the thermopile device body 9 from the heat source. The section located at the cold side of the device is composed of a material high in thermal conductivity 38 such as aluminum oxide or aluminum nitride which more readily dissipates heat. The high and low thermal conductivity electrically-insulative components are durably joined at a seam 39 either by fusing the two components via sintering, by the use of a cement, or by mechanical means.

An optional way of forming thermocouple cold junctions 6 is provided for this embodiment in FIG. 7. Here, wells 40 are formed in the high thermal conductivity electrically-insulative component 38 that serves as the base of the thermopile device body 9. These wells 40 function in the same manner as the closed cross-channels 14 described above and are filled with thermocouple materials 2, 3 to form cold junctions 6, electrical series connections of thermocouple elements, and electrical series connections of rows of thermocouple elements 17.

Additionally, the thermopile device body 9 may be constructed in layers producing a gradation of thermal conductivity, with the lower conductivity layers being located at the hot extremity of the thermopile device 7 and with the higher conductivity layers being located at the cold extremity of the device.

Alternatively, the thermopile may be constructed of a material that has been preferentially formed with a gradation of material density such that the denser material is located at the hot extremity of the thermopile device 7 and the less dense material is located at the cold extremity of the device. This material may be of a high or low thermal conductivity.

Another option is that the thermopile may be constructed of a material that has been preferentially formed with a smoothly gradated combination of materials such that there is a high proportion of low conductivity material located at the hot extremity of the thermopile device 7 and a high proportion of high conductivity material located at the cold extremity of the thermopile device.

The thermopile device body 9 also may simply have sections or coatings of metal, ceramic or composite materials with differing thermal conductivities located at the hot and cold extremities of the thermopile device 7 which enhance the thermal gradient in the device.

This embodiment also provides for the formation of heat-exchanger fins 20 on the external surface of the device where the cold junctions 6 are located as shown in FIGS. 1-4. These heat exchanger fins 20 are made of an electrically-insulative material (e.g., ceramic) used in the main body of the device. The strips of electrically-insulative material are located between rows of thermocouple elements 1. The heat exchanger fins 20 add surface area to the cold junction side of the device to enhance thermal exchange, and the geometry of these fins may be preferentially varied to produce optimal heat transfer effects. In particular, the heat exchanger fins 20 may be made of a material with a much higher heat transfer coefficient than the rest of the device, promoting heat rejection in the area of the cold junction 6.

Another method of achieving the heat-transfer enhancement in this embodiment is to form the body of the device in three parts 31, 32, 33 as described previously with respect to FIG. 6. In this embodiment, each of the three parts is made of an electrically-insulative material having differing heat transfer coefficients 37, 38. This multiple layer arrangement may provide preferential gradients of heat transfer properties.

Embodiment A: Manufacturing Process

Figure 19:
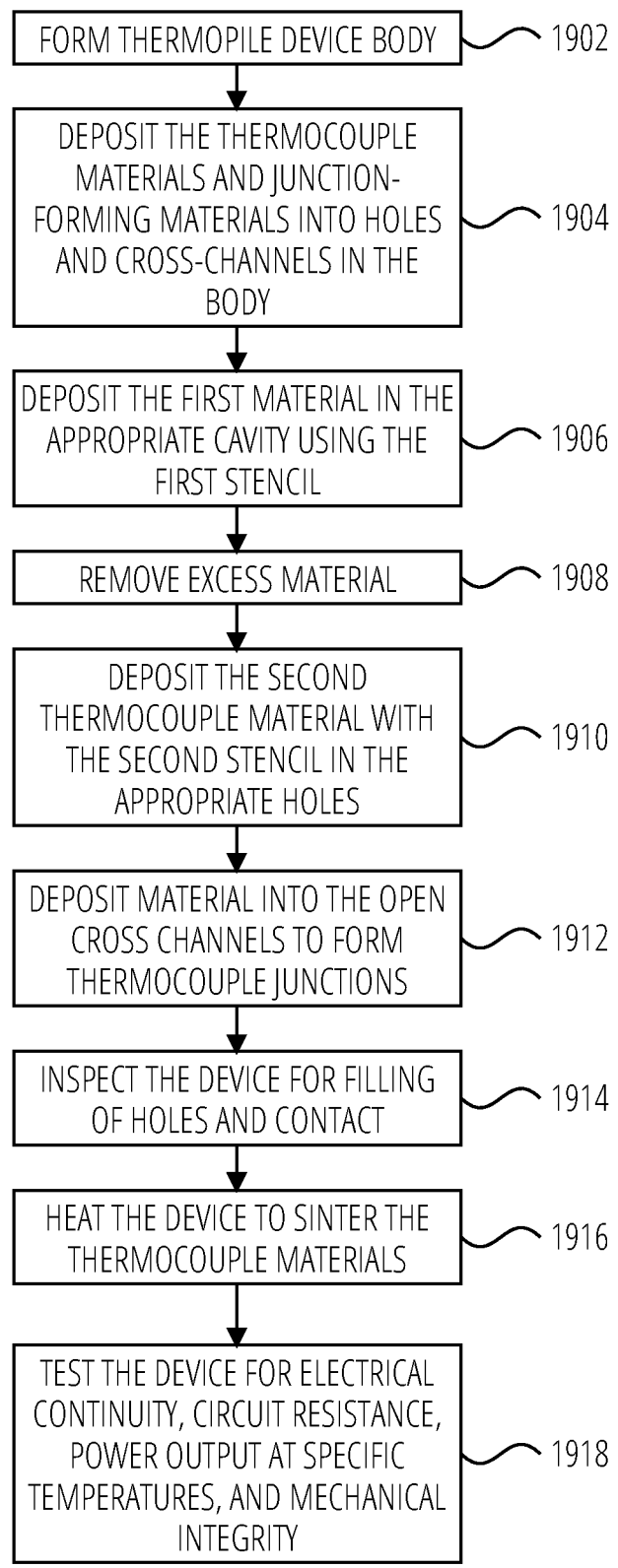
FIG. 19 illustrates a flowchart of a method for creating a thermopile.

FIG. 19 illustrates a flowchart for a process of manufacturing the thermopile device 7 in one embodiment. The first step in the manufacturing procedure is to fabricate the thermopile device body 9 which is a block such as the one shown in FIG. 2 that is made of ceramic or other electrically-insulative material (step 1902). Next, the thermocouple materials and junction-forming materials are firmly deposited into the appropriate holes 10, and cross-channels 11, 14 in the electrically-insulative (e.g., ceramic) body of the device 9 (step 1904). Each material is deposited independently of the other. These materials are swept into the holes 10 and cross-channels 11, 14 using the stencil 23 or stencils shown in FIG. 4, and may also be tamped into place using the plugs 25 provided in one of the stencils 23.

In the thermocouple-material deposition procedure, the first material 2 or 3 is deposited in the appropriate cavity using the first stencil 23 and a squeegee or similar tool and tamped into place (step 1906). Excess material is brushed away or otherwise removed (step 1908). Next, the second stencil is moved to the appropriate position for deposition of the second material, and the second material is deposited into the appropriate thermocouple leg channels and cross-channels 11, 14 which form the hot and cold thermocouple junctions 4, 6, as shown in FIG. 4 (step 1910). Either the positive or negative thermocouple materials 2, 3 may be deposited into these open cross-channels 11 to form thermocouple junctions 4, 6 (step 1912). Alternatively, a third material which may be one with high thermal conductivity such as copper or silver, may be deposited in the cross-channels while maintaining, in accordance with the Law of Intermediate Materials, the thermoelectric effect. This is described, for example, in Robert P. Benedict, *Fundamentals of Temperature, Pressure, and Flow Measurements* (New York: John Wiley & Sons, 1984), p. 89, which is incorporated by reference herein. Such a third material may be included in the formation of either the hot or cold thermocouple junctions 4, 6 or both. The open ends of the cavities may be sealed with paste 12 comprised of thermocouple materials or a third electrically conductive material, or a sealer that will burn off.

An alternative approach to the use of an additional stencil (or potentially two additional stencils) is to simply sift or squeegee the second thermocouple material across the top of the device after the first thermocouple material has been tamped into place. In this case, the second material fills the empty cavities but will not enter the cavities that have already been filled. This second thermocouple material will additionally fill the open cross-channels 11, forming thermocouple junctions.

Next, the device is inspected to assure that the thermocouple materials fill the cavities completely, in one embodiment, with the appropriate volume and density, and that the positive and negative thermocouple materials come into contact in the appropriate places, and that electrical series connections are made in the appropriate places (step 1914).

Then, the device is in place into a controlled atmosphere furnace at a temperature appropriate to sintering (or melting, as required) the powdered or paste-form thermocouple materials 2, 3 (step 1916). This heating procedure may need to be repeated when powdered or paste-form thermocouple materials shrink in volume during the heating process, necessitating the addition of more material into the cavities in the body of the device and additional heating to sinter or melt the added thermocouple materials. This process can also be done in stages, with sintering or melting of high melting-point materials done first and sintering or melting of lower temperature materials done second.

The next step in the manufacturing procedure is a series of acceptance tests to assure electrical continuity throughout the device, proper circuit resistance, proper power output at specific temperatures, and overall mechanical integrity (step 1918).

Provisions should also be made in the geometry of the device to allow for the thermal expansion or contraction of the materials used which may occur both during fabrication of the device and its use. The thermocouple materials, initially provided in powder or paste form, will have microscopic empty spaces between granules, and the powder or paste will shrink somewhat in the heating process used to sinter or melt the thermocouple materials into place. As noted above, steps 1904-1916 may be repeated when necessary to fill the channels completely due to thermocouple material volume shrinkage. Generally, the thermocouple materials will have a greater coefficient of thermal expansion than the electrically-insulative materials. Accordingly, the present device-body design also provides space for additional expansion of the thermocouple-material elements 1 at the top of the thermopile device body 9 where the thermocouple materials are deposited into the body while the initial granular form of the materials, and remaining spaces between particles subsequent to sintering or melting also provides space for thermal expansion.

Another feature of the design is that the hot and cold thermocouple junctions 4, 6 formed at both the top and bottom of the device body (see FIG. 1) have the mechanical effect of holding the thermocouple-material elements into place within the hollow cavities provided, and in the case of the embodiment of FIG. 6, holding the three disparate electrically-insulative parts together mechanically.

Embodiment B

FIGS. 8-13 and 20 illustrate Embodiment B. Embodiment B is a design wherein both the thermocouple elements 1 and the electrically-insulative thermopile device body 9 are 3D-printed simultaneously using any of a variety of additive manufacturing (3D printing) processes such as stereolithography and potentially, other additive manufacturing methods such as selective laser sintering, binder jetting, and powder bed fusion.

Figure 8A:
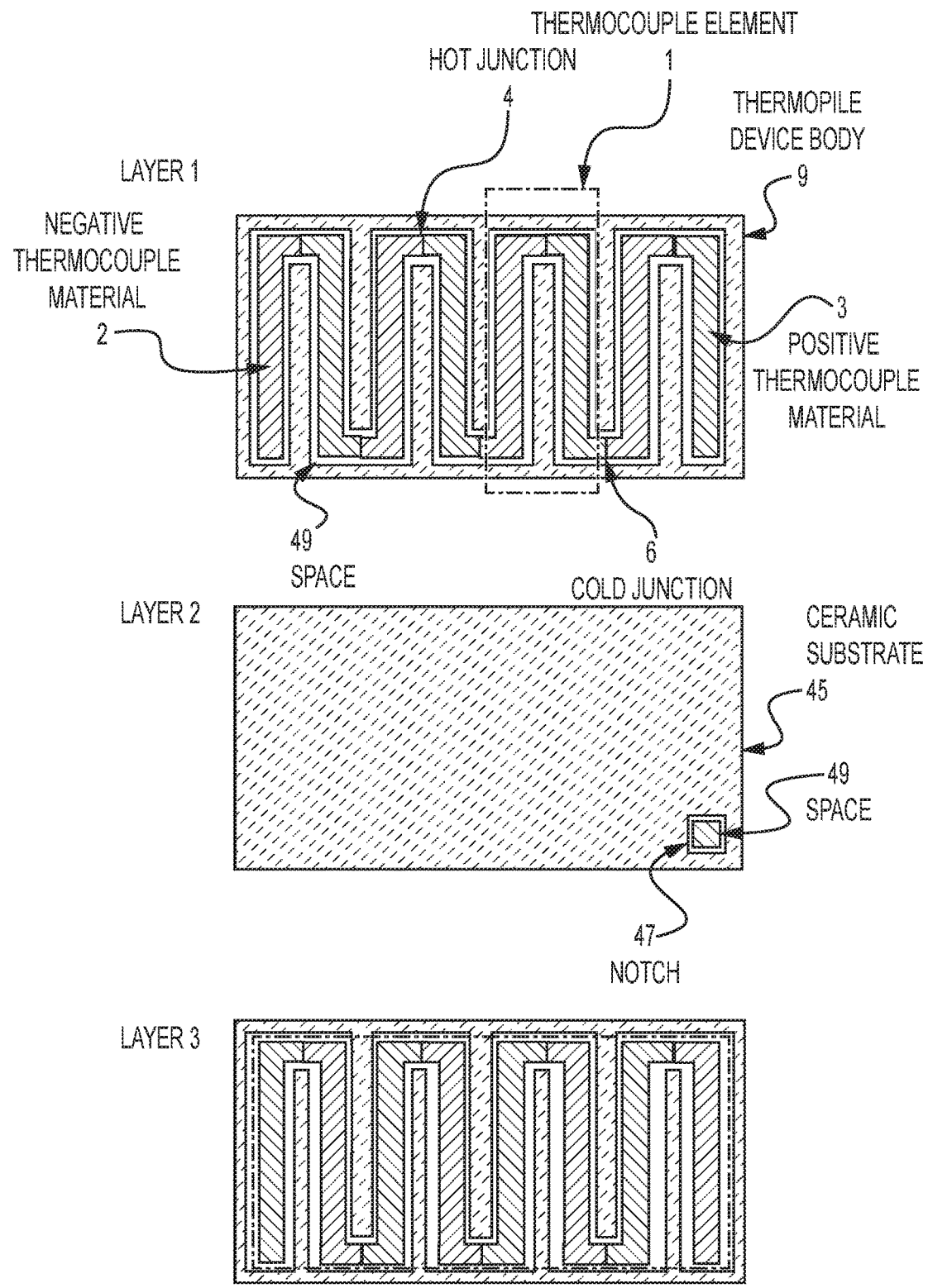
FIG. 8A illustrates 3 intermediary layers of the thermocouple elements and the electrically-insulative device body 3D-printed simultaneously.
Figure 8B:
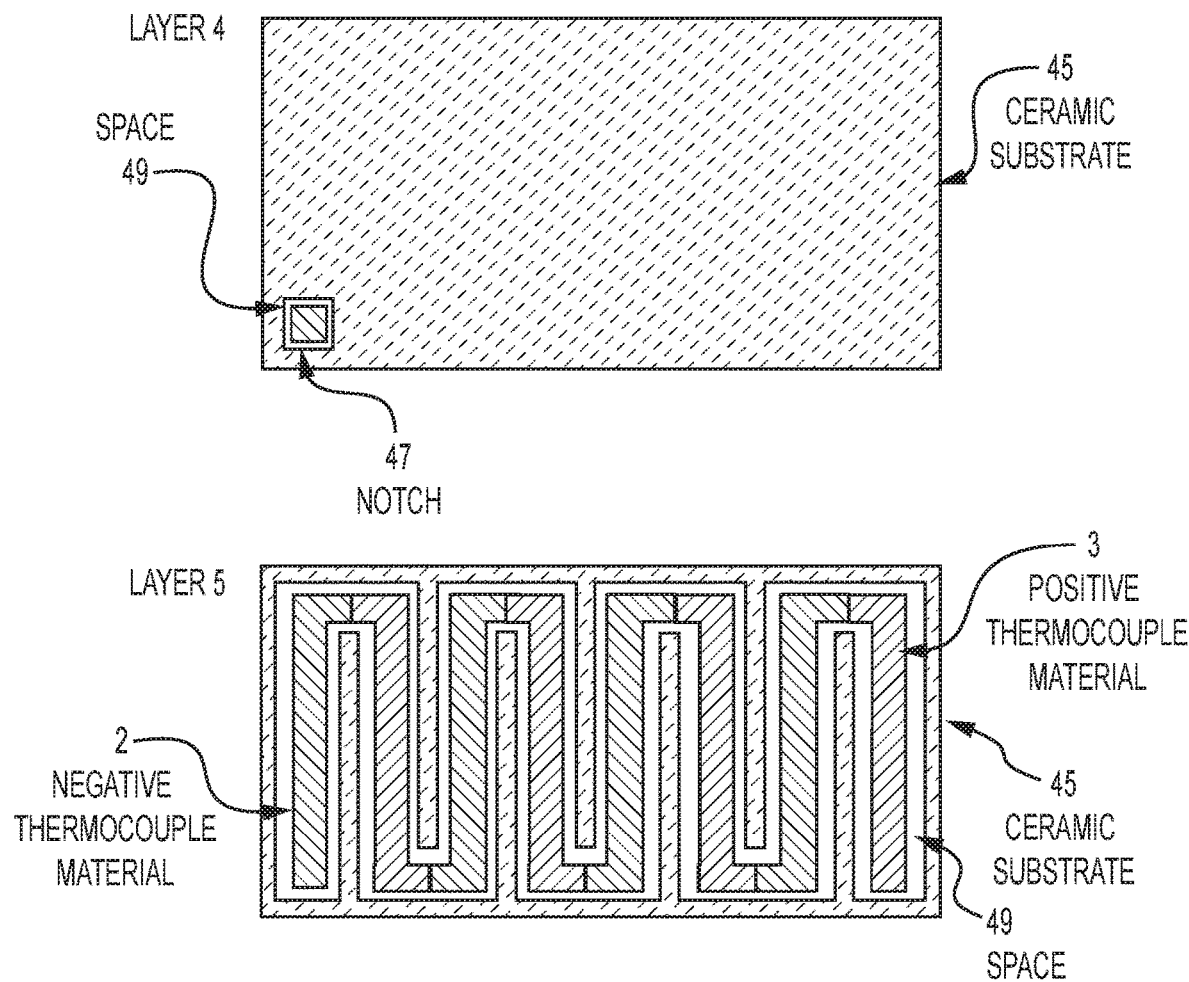
FIG. 8B illustrates 2 additional layers of the thermocouple elements and the electrically-insulative device body 3D-printed simultaneously.
Figure 8C:
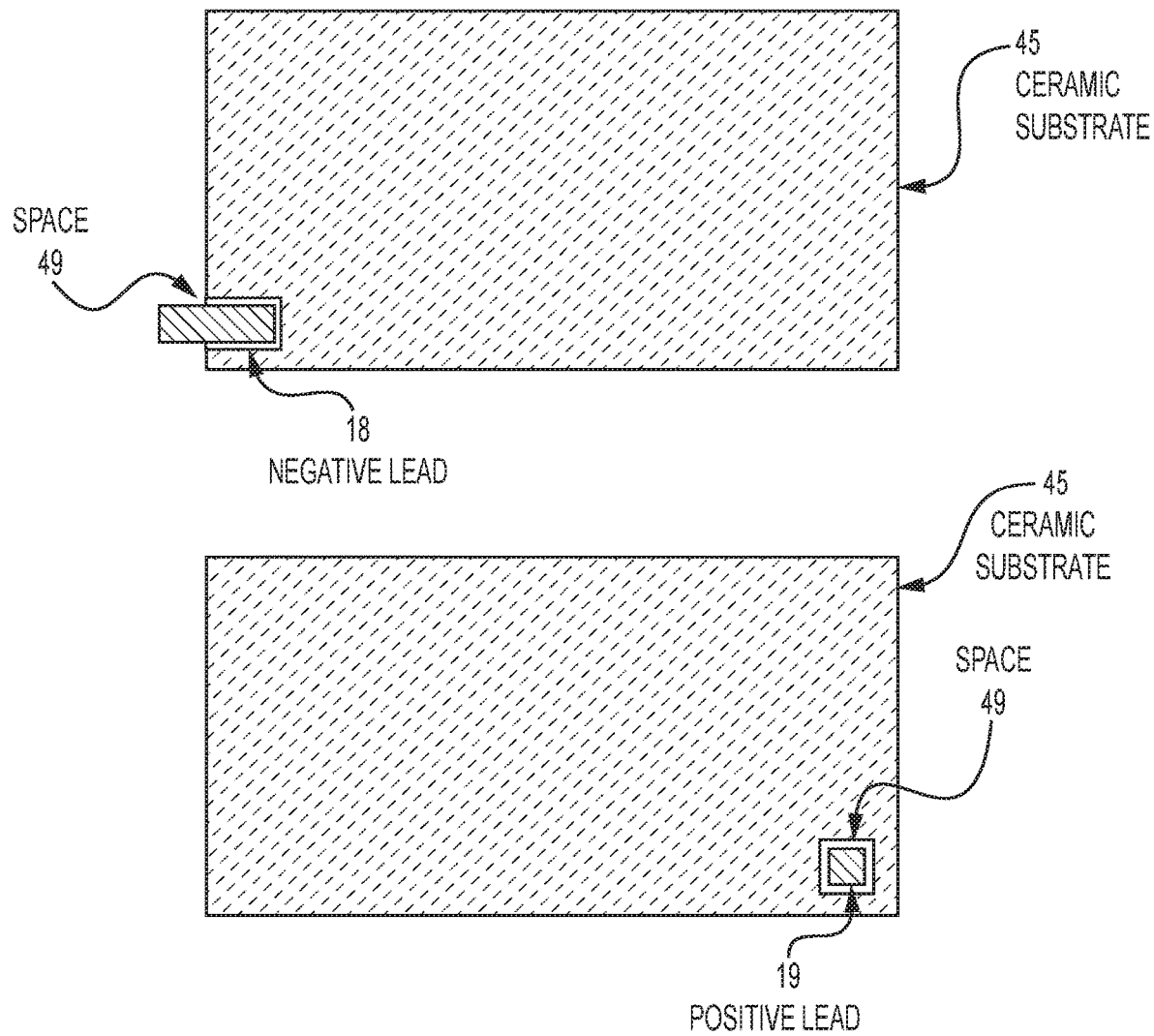
FIG. 8C illustrates the top and bottom layers of the thermocouple elements and the electrically-insulative device body 3D-printed simultaneously.

FIGS. 8A-8C illustrate the construction of the thermocouple elements 1 and the electrically-insulative (e.g., ceramic) substrate, and the provision for thermal expansion of the materials during production and use of the device. FIGS. 8A and 8B show 5 intermediate layers, although there are more layers, as these layers are repeated. FIG. 8C shows the bottom and top layer.

In this embodiment, each thermocouple element 1 comprises three areas of sintered or melted material: an electrically negative thermocouple material 2 in powder, paste, or ink form; an electrically positive thermocouple material 3 in powder, paste, or ink form, and an electrically-insulative material 9 such as aluminum oxide, mullite, or silica glass. These thermocouple material powders or pastes 2, 3 are deposited on substrates of electrically-insulative material such as a ceramic or glass 9, that electrically insulates each layer of deposited thermocouple material 2, 3, comprising a row of thermocouple elements 1 in electrical series, from the other.

Figure 9:
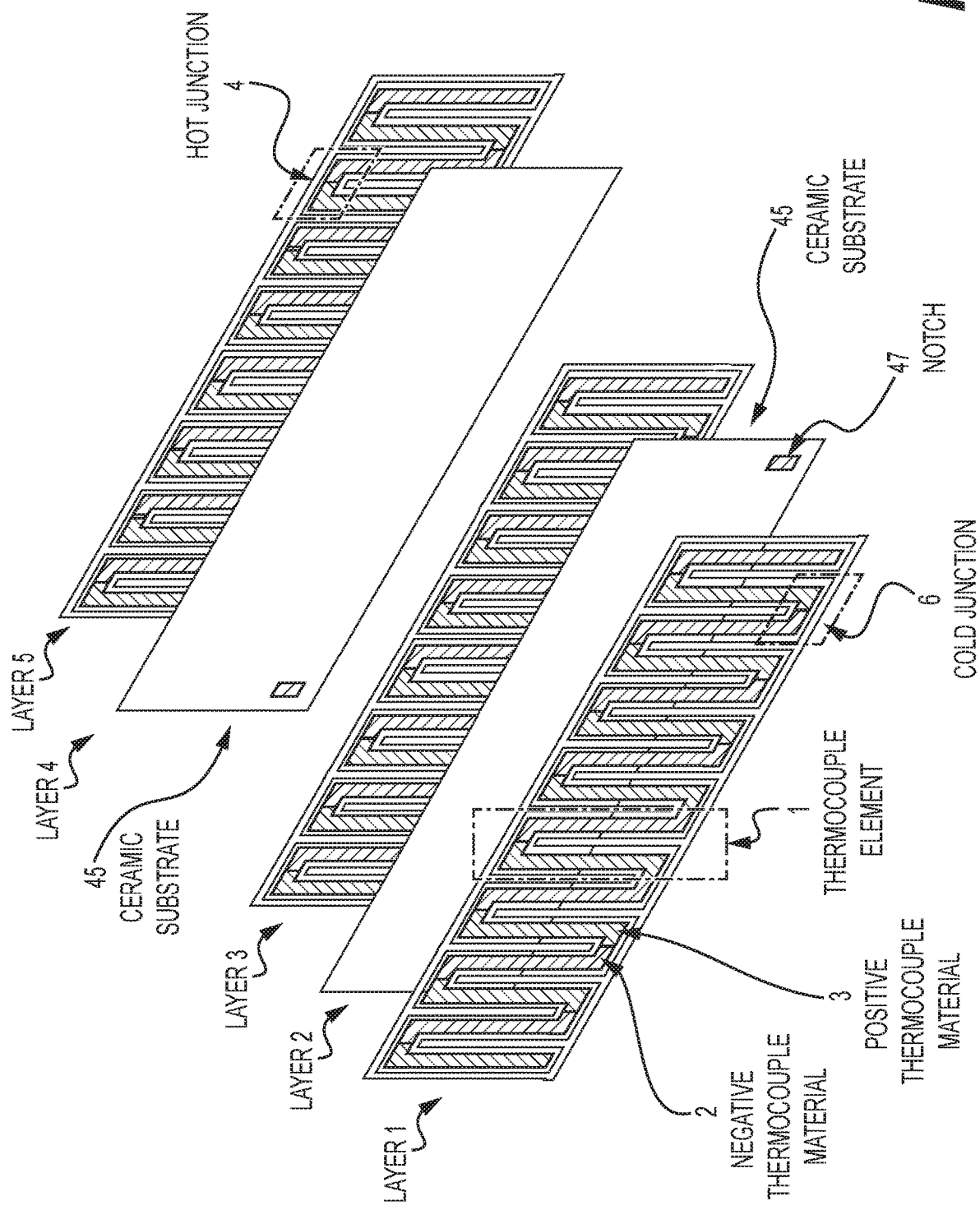
FIG. 9 illustrates the arrangement of the thermocouple elements shown in FIG. 8 into a stacked form.
Figure 10A:
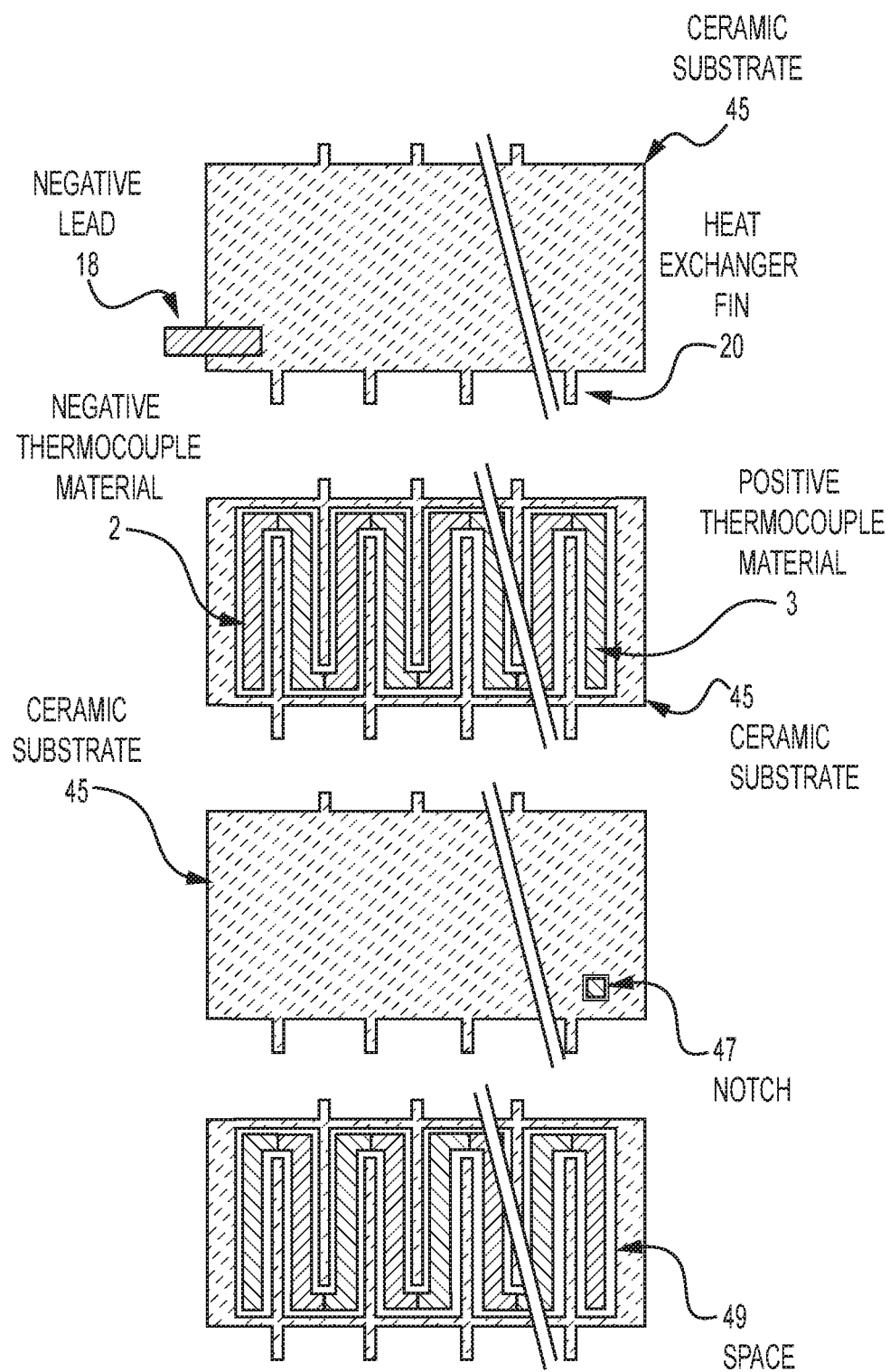
FIGS. 10A and 10B illustrate the printing process indicating the arrangement of thermocouple materials and substrate materials on each printed layer, including heat exchanger fins.
Figure 10B:
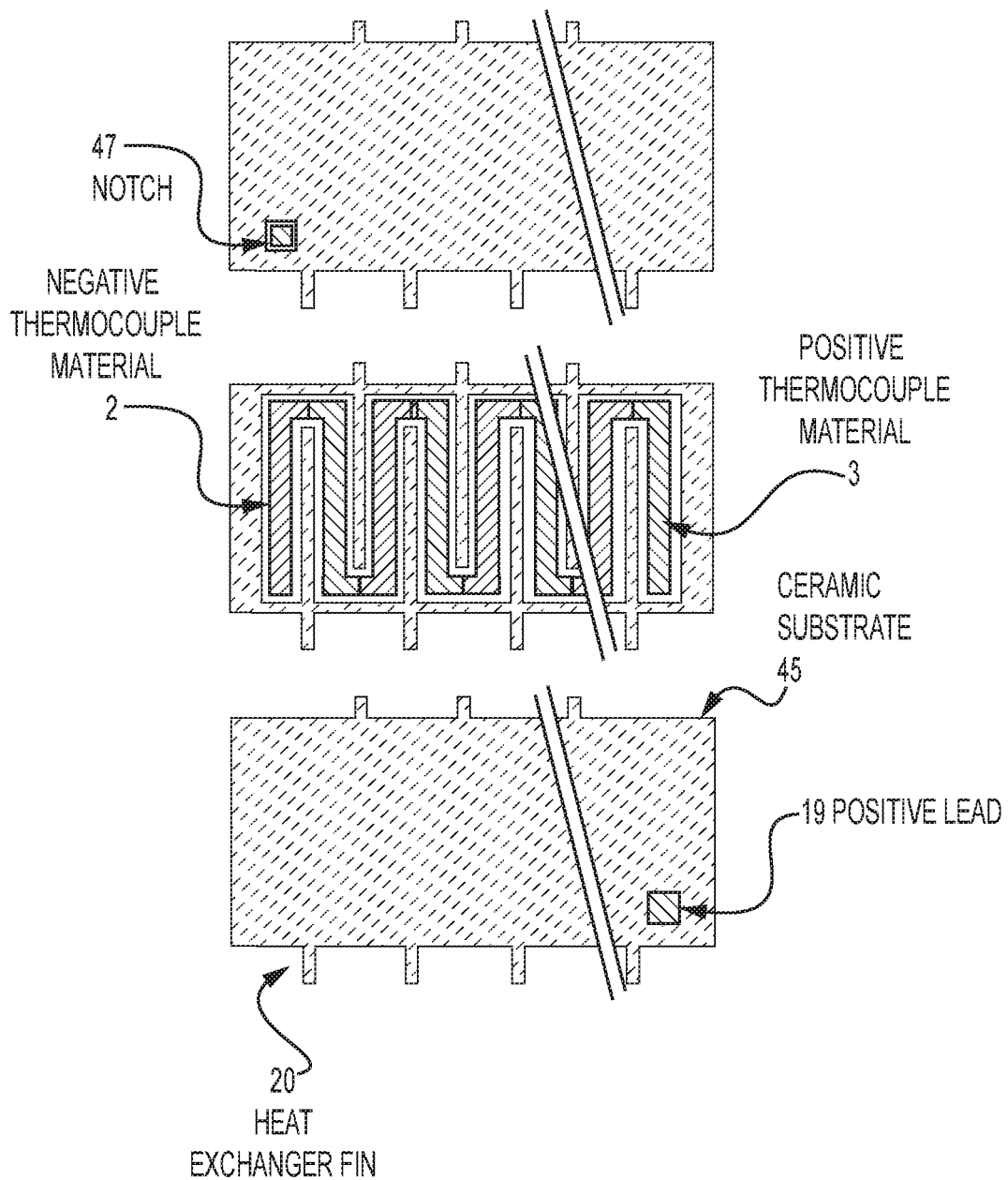

Within these substrates 45, a deposition of thermocouple material 2, 3 is provided for electrical series connection of layers of thermocouple elements comprising one row of thermocouple elements 1 as illustrated in FIGS. 8-10. Electrical series connections of rows of thermocouple elements 17 are produced by way of notches 47 on alternating sides (on the horizontal axis of the electrically-insulative substrates 45, on which the positive and negative thermocouple materials 2, 3, forming rows of thermocouple elements 1, have been deposited. Each notch 47 is a cavity formed in the electrically-insulative substrates which is filled with a positive and negative thermocouple material 2, 3 in powder, paste, or ink form and provides a connection to a thermocouple material having the opposite electrical polarity that has been printed on a substrate layer above this electrically-insulative substrate. This connection provides an electrical series arrangement of thermocouples. These notches 47 are also used to form outgoing positive and negative leads 18, 19 as is illustrated in FIGS. 8C and 10A.

On the face of each layer, the areas of deposited positive thermocouple materials 3 are separated and insulated from the areas of deposited negative thermocouple materials 2, except where they form hot and cold thermocouple junctions 4, 6, by areas of ceramic or other electrically-insulative material 45 that has been deposited on the same plane as the positive and negative thermocouple materials 2, 3. Alternatively, the positive thermocouple materials are separated and insulated from the areas of deposited negative thermocouple materials 42, except where they form thermocouple junctions 4, 6, by a space between or around deposited thermocouple materials 49.

As shown in FIG. 8A, going from left to right, the last thermocouple leg 2, 3 in the row of these thermocouple elements 1 (in this case, on Layer 1, a positive leg), is joined to the first thermocouple leg going from right to left, of the next layer (on Layer 3; in this case, a negative leg). As noted above, these legs are joined to form electrical series connections of rows of thermocouple elements 17 by way of notches 47 on alternating sides (on the horizontal axis) of the electrically-insulative substrate, Layer 2, providing electrical-series connections on the electrically-insulative substrate on which the thermocouple materials 2, 3 forming thermocouple elements 1 have been deposited. Thermocouple materials 2, 3 are printed in an order of positive and negative electrical polarities opposite to those in previously printed layers in the construction of the device as is shown in the printing sequence shown in Layer 3. This arrangement of substrates, printed thermocouple materials, and connections of layers and rows of thermocouple elements 1 is repeated to produce an electrical series of thermocouples that can be any number of thermocouples.

The positive and negative thermocouple materials 2, 3 in this embodiment are deposited in a thickness that provides for relatively low sheet resistance, allowing for a relatively high current flow and, accordingly, a high wattage output. This relatively thick layering contributes to its efficiency in power generation. Thicker thermocouple material deposition reduces the sheet resistance of the thermocouple elements 1 and in turn reduces the overall electrical resistance of the device and accordingly, increases the current level and wattage output of the device. Thinner deposition reduces the sheet resistance.

In one embodiment, 3-D printing is used to fabricate a plurality of thermocouple elements 1 in the thermopile device 7 as one unit with each cross-sectional layer of all of the linear units being printed at one time (as shown in FIG. 3). For a 25,000-element thermopile, each layer might include 50 thermocouples, and 500 such layers would be printed in order to produce a 25,000-element thermopile unit. Printing processes other than 3-D ("additive manufacturing") systems may, however, be used to achieve the layered configuration of the device, such as is described in Embodiment C below.

Additionally, as noted in Embodiment A, above, a ceramic, teflon, silicone, or other electrically-insulative coating may be provided over either the hot and cold junctions 4, 6 to prevent inadvertent short circuits should the junctions come in contact with a conductive material or fluids, and to prevent risk of electric shock to anyone handling the device, or risk of electric shock or interaction with other devices in proximity to the thermopile. This exterior coating may be provided on all sides of the device shown in FIGS. 8, 10, and 11 with the exception of the outgoing positive and negative leads 18, 19. Some configurations of the device may not incorporate this coating. The thicknesses of this coating, as well as the materials used, may be preferentially varied to enhance heat transfer to and from the device and the temperature gradient between the hot and cold junctions 4, 6.

Figure 11:
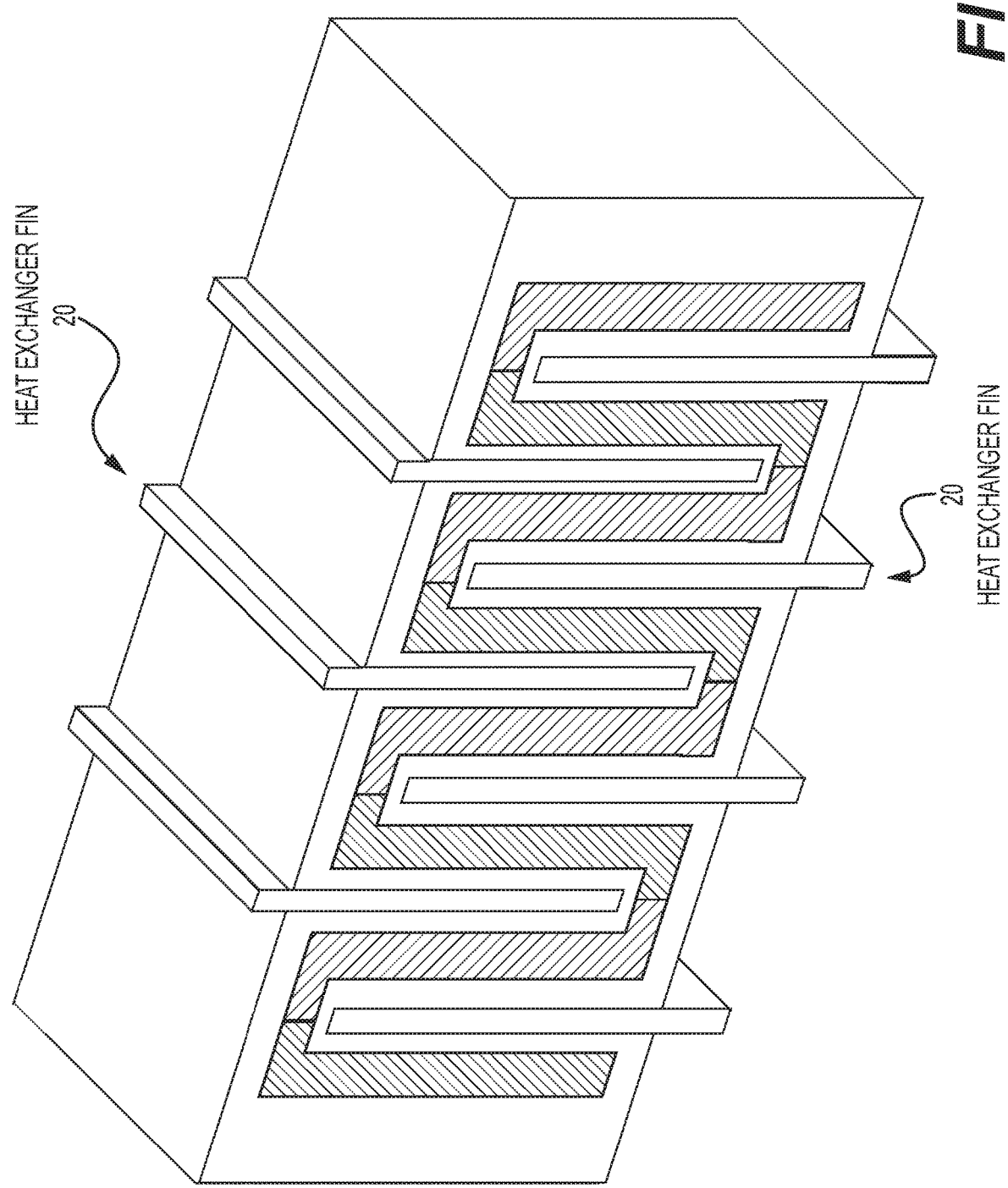
FIG. 11 illustrates the arrangement of electrically-insulative material between thermocouple elements (as also shown in FIG. 3) to form external fins providing a heat exchanger function and enabling handling of the device without touching the thermocouple elements.

As noted in Embodiment A, the design also provides for the formation of external heat-exchanger fins 20 on the sides of the thermopile device 7 where the cold junctions 6 are located as shown in FIGS. 10 and 11. These fins are made of the same electrically-insulative (e.g., ceramic) material as the electrically-insulative substrates 45. The areas of electrically-insulative material separating the thermocouple elements 1 on each layer are formed to extend beyond the thermocouple materials and the walls of the device on the top and bottom (hot and cold sides) to form heat exchanger fins 20. The heat exchanger fins 20 add surface area to the cold junction side of the device body 9 to enhance thermal exchange in that area, and the geometry of these fins may be preferentially varied to produce optimal heat transfer effects. The heat exchanger fins 20 also help to keep the thermocouple elements 1 from coming into direct contact with other objects if a ceramic coating is not used over the hot and cold junctions 4, 6.

FIG. 9 illustrates the arrangement of the thermocouple elements shown in FIGS. 8A-C into a stacked form; this stack can be extended in depth and width to the extent permissible by 3-D printing machinery, and can subsequently be extended by combining 3-D-printed units in electrical series.

FIG. 10 illustrates the printing process indicating the arrangement of thermocouple materials and substrate materials on each printed layer. As shown on FIG. 10, fins are added to the substrate 45.

FIG. 11 illustrates the arrangement of electrically-insulative material (e.g., ceramic) between thermocouple elements (as also shown in FIG. 3) to form external fins providing a heat exchanger function and that allow handling and situating of the device without touching the thermocouple elements.

FIG. 12 illustrates the arrangement of printed thermocouples into ring form and semicircular form both of which can be used to surround pipes and capture waste heat. The stacking method used in constructing the thermopiles can be used to produce a variety of shapes such as these.

FIG. 13 shows how thermocouple elements can be arranged in staggered configurations 53 to conform to curved, angled, or irregularly shaped surfaces.

As noted above, any materials having a thermoelectric effect, including but not limited to, copper, CONSTANTAN, ALUMEL, CHROMEL, MONEL, NICHROME, iron, platinum and platinum alloys, tungsten and tungsten alloys, bismuth telluride, silicon germanium, lead telluride, tetrahedrites, and other novel and non-standard thermoelectric materials may be used to fabricate the device.

As noted above, any materials having a thermoelectric effect, including but not limited to, copper, Constantan, Alumel, Chromel, Monel, Nichrome, iron, platinum and platinum alloys, tungsten and tungsten alloys, bismuth telluride, silicon germanium, lead telluride, tetrahedrites, and other novel and non-standard thermoelectric materials may be used to fabricate the device.

Provisions may be made in the geometry of the device to allow for the thermal expansion of the materials used. Generally, metallic materials that may be used have a greater coefficient of thermal expansion than the electrically-insulative materials (e.g., ceramics). Accordingly, the present design provides for expansion of metallic elements. This is done by providing a space 49 between or around deposited thermocouple materials comprising the thermocouple elements 1 deposited on each printed layer into which the heated thermocouple materials 2, 3 may expand both during the operation of the device and during any heat-treating processes that may be necessary in manufacturing to effect melting or sintering of the powered materials.

Embodiment B: Manufacturing Process

Figure 20:
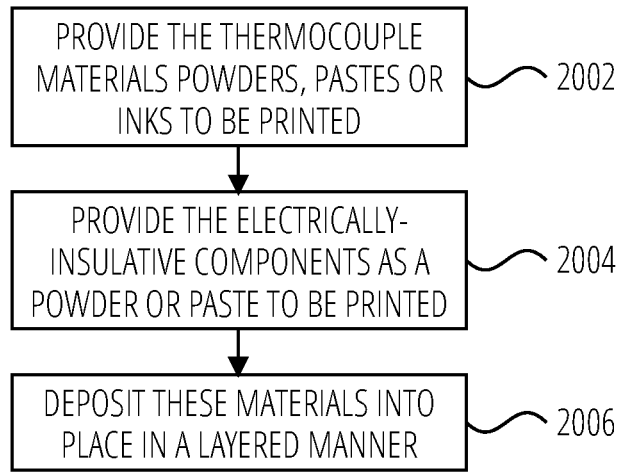
FIG. 20 is a flowchart of a method for simultaneously printing the thermocouple and ceramic materials.

FIG. 20 illustrates a flowchart of steps for simultaneously printing the materials. This embodiment is achieved by 3D printing the materials simultaneously in the manner shown in FIGS. 8 to 13. Laser sintering and other high-energy, high-speed fusion methods may be used to sinter or melt materials as deposited. Alternatively, stereolithography and other 3D printing methods may be used in a manner that yields a green-state part that is thermally processed in a reducing, oxidizing, inert, or vacuum atmosphere or combinations thereof, after printing is completed. In this process, the shape and volume of components made of thermocouple materials is engineered to allow thermal expansion and shrinkage at various stages of fabrication and device use.

The thermocouple materials 2, 3 to be used in the device are provided as powders, pastes, inks or in other forms that allow them to be printed as required by the design of the device (step 2002). The electrically-insulative (e.g., ceramic) components 44, 45 are also provided as a powder or paste or in other forms that allow it to be printed as required by various embodiments of the device (step 2004). These materials are deposited into place (and may be sintered or melted or otherwise fixed in place) in a layered manner (as shown in FIGS. 8-10) using a 3-D printing process or other printing processes that allow layering and fixing in place of printed thermocouple elements 1) (step 2006). Powdered materials may be delivered for use in printing in the form of inks or pastes containing binder materials that are burned off in the fabrication process.

Embodiment C: Description and Manufacturing Process

Figure 14:
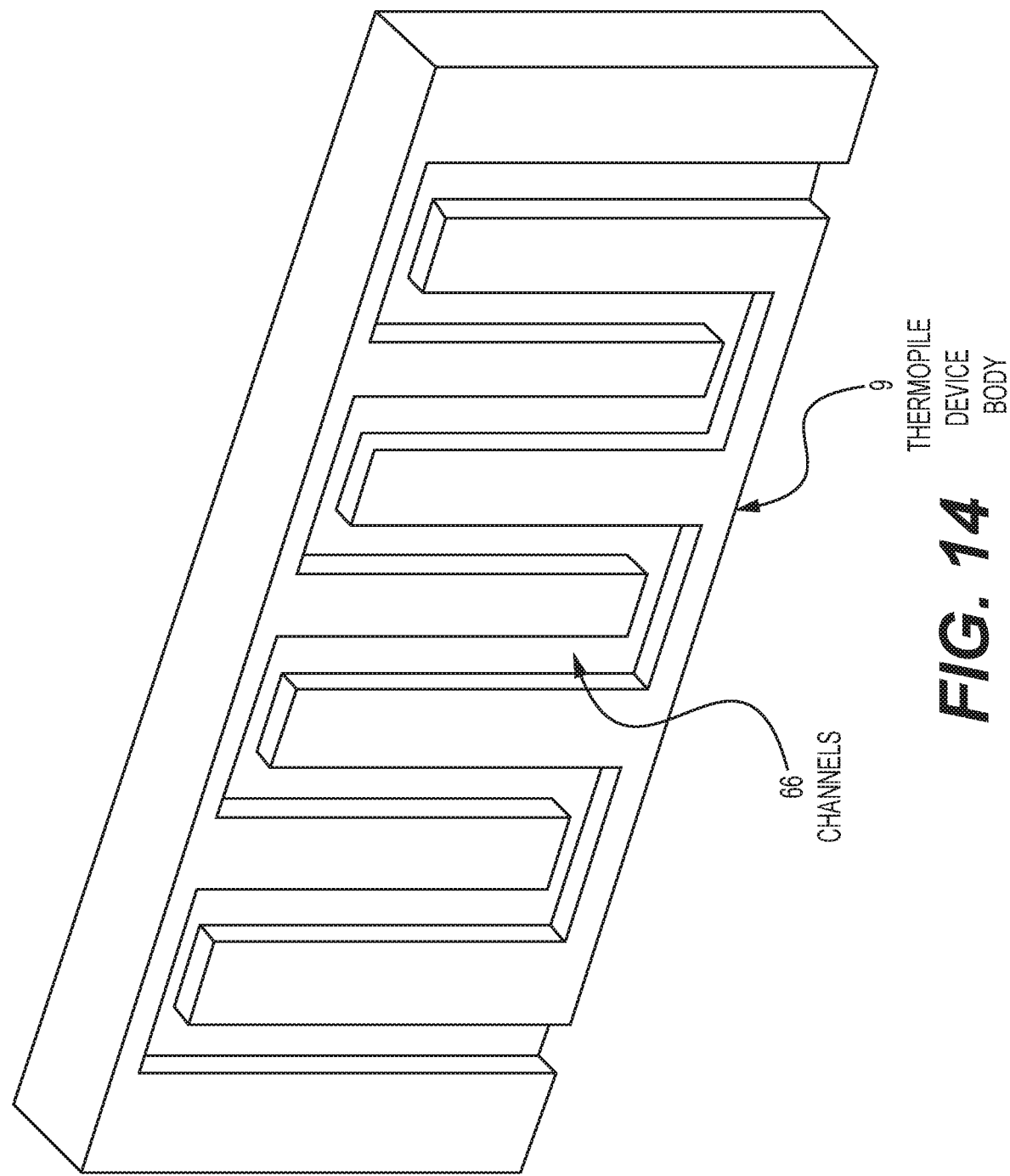
FIG. 14 shows a pre-formed electrically-insulative substrate having pre-formed channels designed to accept thermocouple materials in powder or paste form which will form an array of thermocouples.
Figure 15:
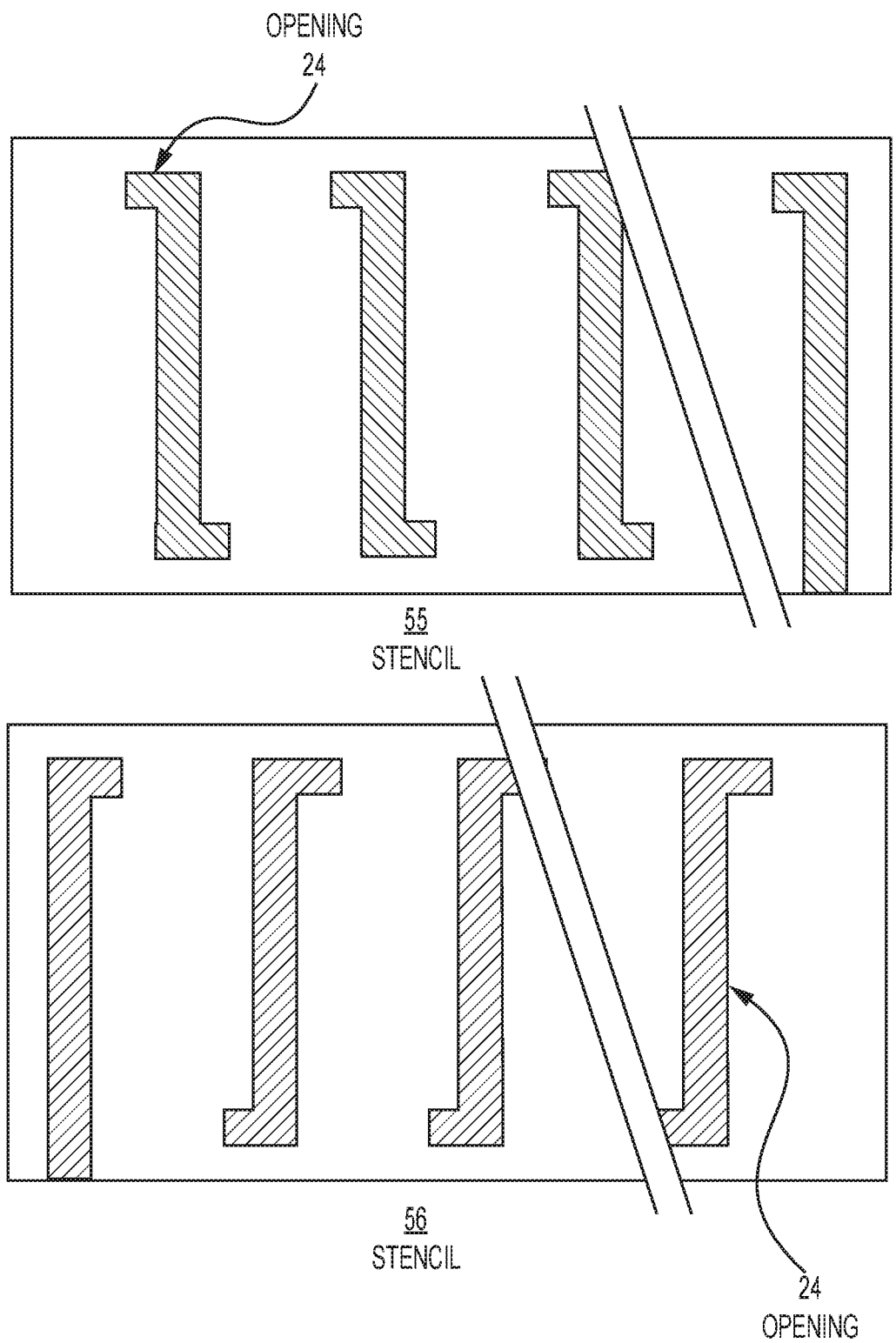
FIG. 15 illustrates stencils used to deposit thermocouple materials on the pre-formed electrically-insulative substrates or in the pre-formed channels depicted in FIG. 14.
Figure 16:
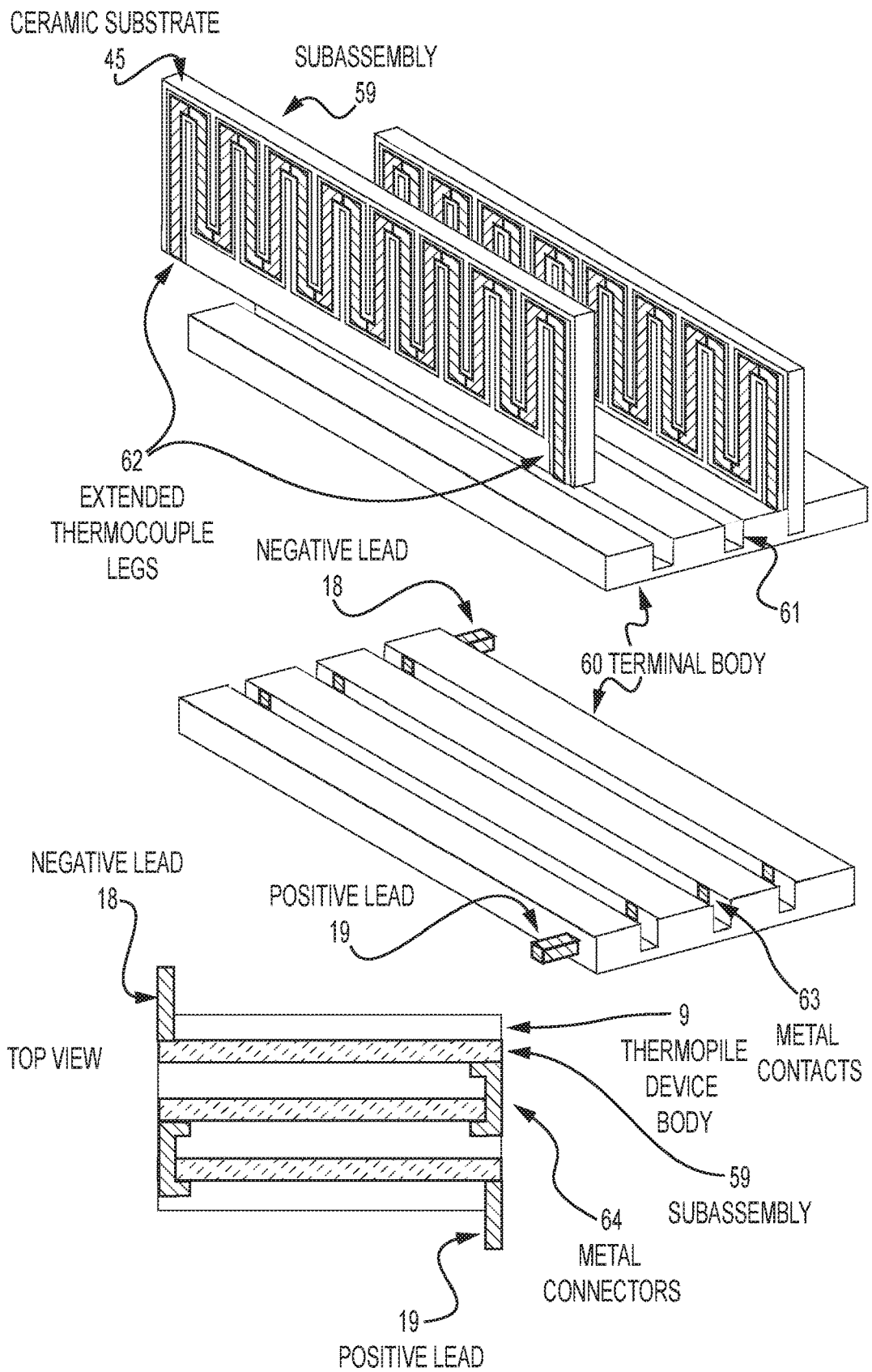
FIG. 16 depicts a terminal into which subassemblies, also depicted in FIG. 16, containing thermocouples in electrical series, are assembled into a larger electrical series.

FIGS. 14, 15, and 16 illustrate Embodiment C which achieves a result similar to Embodiment B by way of depositing each layer of thermocouple elements separately on a pre-formed electrically-insulative substrate 9 using stencils 55, 56 (see FIG. 15) having openings 24 for the deposition of positive and negative thermocouple materials 2, 3. Then the process assembles the layers, manually or mechanically, into a terminal, shown in FIG. 16, that connects the layers in electrical series.

FIG. 14 shows a pre-formed electrically-insulative substrate having pre-formed channels 66 designed to accept positive and negative thermocouple materials 2, 3 in powder or paste form which will form an array of thermocouples in electrical series. In this embodiment, the electrically-insulative substrate 9 is pre-formed and fired, in the case of ceramics, to achieve the required shape, density, and hardness. The positive and negative thermocouple materials 2,3 in powder or paste form are deposited in the appropriate shapes or in the appropriate pre-formed channels 66 in a second operation, and then the entire assembly is heated in a controlled atmosphere to sinter or preferentially melt the deposited thermocouple materials. The scheme of arrangement of metals exhibiting positive and negative polarities is the same as that shown in FIGS. 8-10. Silkscreening methods, or other conventional electronic printing processes, may alternatively be used to deposit the positive and negative thermocouple materials 2, 3 on the substrates 9.

FIG. 15 illustrates stencil designs used to deposit thermocouple materials on the pre-formed electrically-insulative substrates or in the pre-formed channels 66 depicted in FIG. 14. Stencil 55 has openings 24 to accept one type (e.g., positive) thermocouple material, and stencil 56 has openings 24 to accept the opposite type of thermocouple material (e.g., negative 2).

FIG. 16 depicts a terminal into which the subassemblies, also depicted in FIG. 16, above, containing thermocouples in electrical series, are assembled into a larger electrical series. Deposition of thermocouple materials onto electrically-insulative substrates, as shown in FIGS. 14 and 15, produces completed subassembly 59 layers that are then assembled manually or mechanically, into a terminal 60 that connects the subassembly layers in electrical series.

Each subassembly is inserted into a groove 61 formed in the terminal 60. Thermocouple elements 1 at the ends of each subassembly have extended thermocouple legs 62 to reach and be placed in firm connection with metal contacts 63 that are part of metal connectors 64 embedded in the terminal 60 that join the subassemblies 59 in electrical series. A construction similar to that of the connectors provides for outgoing leads 18, 19.

In this embodiment, the electrically-insulative substrate 45 used in each subassembly layer 59 is pre-formed and fired to achieve the required density and hardness. The thermocouple-material powders or pastes 2, 3 are printed or deposited in a second operation, and then the substrate containing the thermocouple materials is heated in a controlled atmosphere to sinter or preferentially melt the deposited thermocouple materials 2, 3. In this embodiment, the thermocouple materials may be printed on a flat substrate. The scheme of arrangement of positively and negatively charged thermocouple materials 2, 3 is the same as that shown in FIGS. 8 to 13. FIG. 14, however, shows how the electrically-insulative substrate can have pre-formed channels 66 in it to accept thermocouple materials in powdered or paste form 2, 3. This embodiment may also incorporate arrangements of multiple electrically-insulative materials to enhance heat transfer as in the description of Embodiment A, and heat-exchanger fins described in the description of Embodiment B.

Embodiment D: Description and Manufacturing Process

Figure 17:
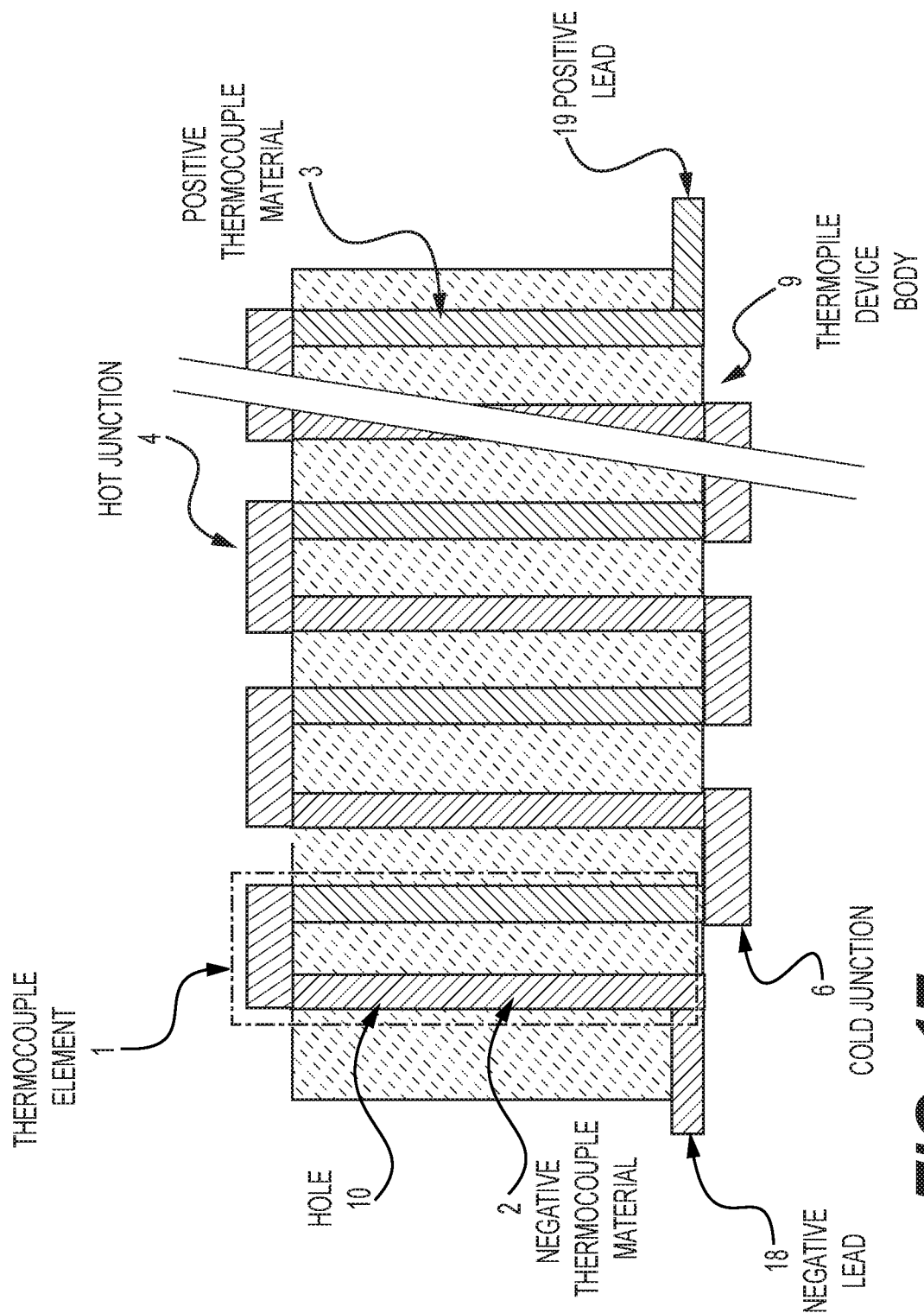
FIG. 17 depicts an electrically-insulative body having preformed through-holes, into which thermocouple materials, in powder or paste form, are deposited, producing the positive and negative legs of individual thermocouple elements.
Figure 18:
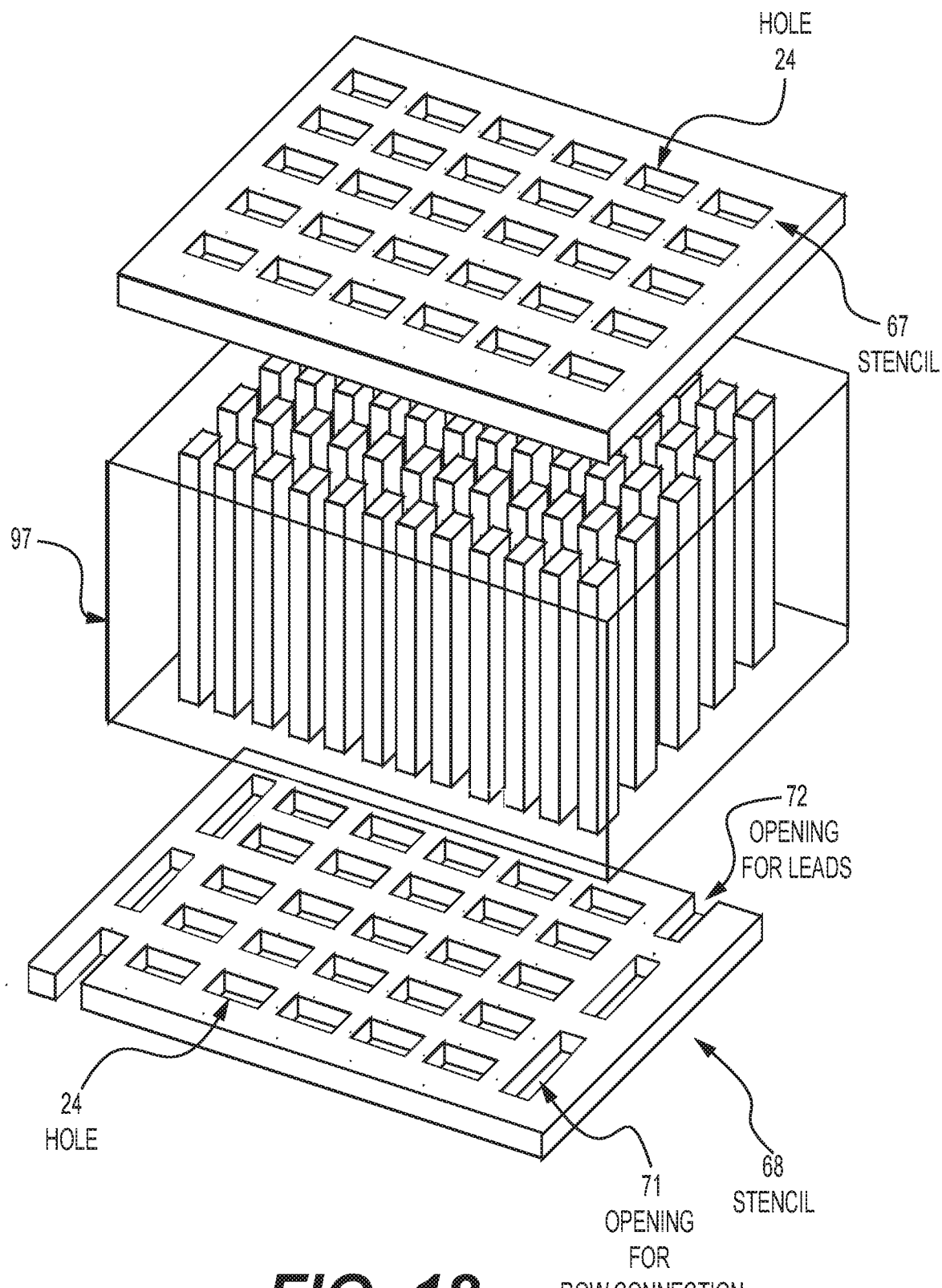
FIG. 18 depicts stencils which guide the junction-forming pastes into the proper places in the embodiment depicted in FIG. 17.

FIGS. 17 and 18 illustrate Embodiment D. FIG. 17 depicts an electrically-insulative body having preformed through-holes, into which thermocouple materials, in powder or paste form, are deposited, producing the positive and negative legs of individual thermocouple elements 1. Thermocouple junctions are then formed on the top and bottom of the electrically-insulative body by depositing thermocouple materials in paste form in a manner that joins the thermocouple legs at the openings of the through-holes, on the surface of the device body, without the use of cross-channels described in the first embodiment.

Embodiment D is achieved by depositing thermocouple metals, in powder or paste form 2, 3, into preformed through-holes 10 in an electrically-insulative thermopile device body 9, producing the positive and negative legs 2, 3 of individual thermocouple elements 1, and then forming thermocouple junctions 4, 6 on the top and bottom of the electrically-insulative body by depositing thermocouple material in paste form in a manner that joins the thermocouple legs at the openings of the through-holes, thus forming thermocouple junctions on the surface of the thermopile device body 9, without the use of cross-channels described in the first embodiment. Either the hot junction 4 or cold junction 6 may be made of electrically-negative thermocouple material 2 or electrically positive thermocouple material 3, or a third material.

As in the other embodiments, the powder or paste-form thermocouple materials are later sintered in a controlled atmosphere to form highly integrated material form.

FIG. 18 depicts stencils which guide the junction-forming pastes into the proper places in the embodiment depicted in FIG. 17. As shown, stencils 67, 68 may be used to guide the junction-forming thermocouple materials in paste form into the proper place. These stencils contain holes 24 to guide the deposition of thermocouple materials or other electrically conductive materials 2, 3 to the correct areas on the thermopile device body 9 for forming thermocouple junctions 4, 6. The stencils 67, 68 also contain openings 71 for depositing thermocouple materials, or other electrically conductive materials, onto the device body 9 to produce connections of rows of thermocouple elements, thus forming an electrical series between rows of thermocouple elements, and openings 72 to for depositing thermocouple materials, or other electrically conductive materials, onto the device body to produce outgoing thermopile leads 72. Alternatively, other mechanical or automated methods of depositing pastes comprised of thermocouple materials in the proper locations, such as those used to fill drug capsules, may be used.

In general, many materials possessing thermoelectric effects may be used in this many of the embodiments described herein. For the purposes of illustration, a thermoelectric analysis using Type K (Chromel vs. Alumel) is provided. Type K thermocouples produce approximately 8.14 mV when a temperature difference of 200° C. (392° F.) occurs between the hot and cold junctions 4, 6. A thermopile, which is an assembly of multiple thermocouples connected in an electrical series, produces an additive voltage effect when the hot junctions 4 are at one temperature and the cold junctions 6 are at another temperature. Additive voltage levels for type K thermopiles wherein there is a 200° C. temperature gradient from the hot junctions 4 to the cold junctions 6 are as follows:

8.14 mV=1 junction
81.4 mV=10 junctions
814 mV=100 junctions
8.14 V=1,000 junctions
81.4 V=10,000 junctions
814 V=100,000 junctions
8,140 V=1,000,000 junctions Higher temperature gradients between the hot and cold thermocouple junctions in the device will create higher voltages. As noted above, the dimensions of the thermocouple elements (1) can be preferentially varied to produce an electrical circuit resistance that will provide an appropriate current level for various power-generation applications.

Many materials having thermoelectric effects, including but not limited to, copper, CONSTANTAN, ALUMEL, CHROMEL, NICHROME, MONTEL, iron, platinum and platinum alloys, tungsten and tungsten alloys, bismuth telluride, silicon germanium, lead telluride, tetrahedrites, and other novel and non-standard materials exhibiting thermoelectric effects may be used in this design. As noted above, these materials need not be standard, commonly used thermocouple materials.

A wide variety of electrically-insulative materials can also be used where required in the design, in particular, in the body of the device. These materials include, but are not limited to, aluminum oxide, aluminum nitride, silicon dioxide, calcium oxide, zirconia, mullite, magnesium oxide, boron nitride, and combinations thereof. These materials should be able to withstand high temperatures in order to allow sintering or melting of the thermocouple materials into place within the device body in the manufacturing processes described herein. Additionally, the materials used in the design can withstand elevated temperatures for extended periods of time, a capability that is important in applications such as ceramics and metals processing where temperatures can reach 1649° C./3000° F.); natural gas, petroleum, and coal combustion for power generation where temperatures can reach 1,427° C./2,600° F.; solid waste disposal where temperatures can reach 760° C./1,400° F., wood, paper, and pulp processing where temperatures can reach 1,038° C./1, 900° F., and automotive engine operation where temperatures can reach 700° C./1292° F. The device can additionally be incorporated into primary power-generation system using solar, biomass, nuclear, and geothermal heat sources wherein temperatures can range from 150° C./302° F. to 1,649° C./3,000° F.

Wires as Thermocouple Elements

In other embodiments, wires are inserted into the holes 10 of the device body in place of the thermocouple materials 2, 3 described above. The wires are thermocouple materials but they are not powder or paste as described above. These wires may be homogenous thermocouple-wire segments or rods of thermocouple metal that are deposited manually or mechanically. The device is fabricated by pre-forming a body of ceramic or other electrically insulative material within which are preferentially formed cavities and channels into which the wires are inserted. Hot and cold thermocouple junctions are formed similarly as described above.

The use of wire provides several advantages. The wire is solid, homogenous material manufactured in a consistent manner and having consistent electrical and thermal properties. Additionally, wires made of standard thermocouple materials as well as other metals with a substantial thermoelectric effect can be obtained readily. The wire can also be handled and sized easily and can be efficiently inserted into the device to assemble the thermopile. Additionally, wire is often offered in large quantities and can be obtained for a relatively low price.

The inserted wires and electrical connections are of dimensions providing for relatively low electrical resistance, allowing for a relatively high current flow and, accordingly, a high wattage output when the thermocouples in the device are arranged in a massive series. The relatively large size of the thermocouple elements contributes the efficiency of the device in generating electric power. Larger wires reduce the electrical resistance of the thermocouple elements and in turn reduce the overall electrical resistance of the device and accordingly, increase the current level and wattage output of the device. Thinner wires, on the other hand, are of increased electrical resistance and increase the overall electrical resistance of device. Wires may be of varying length too.

The device may also be fabricated in a "functionally graded material" configuration, incorporating gradations of material composition or structure which can thus provide a gradation of thermal conductivity across the device that can preferentially enhance heat transfer and the thermal gradient between the hot and cold junctions. Functionally graded materials are materials that, for example, are made of layers of different material—they might conduct heat better on one side than the other or be stiffer on one side than the other, etc. The material might also be made in a manner where one side has a higher proportion of a certain material than the other side (e.g., 50% aluminum oxide on one side, and the manufacturing of the material gradually reduces this content to 10% on the other side), or there might be a gradation of density of the material.

Embodiment E

Figure 21:
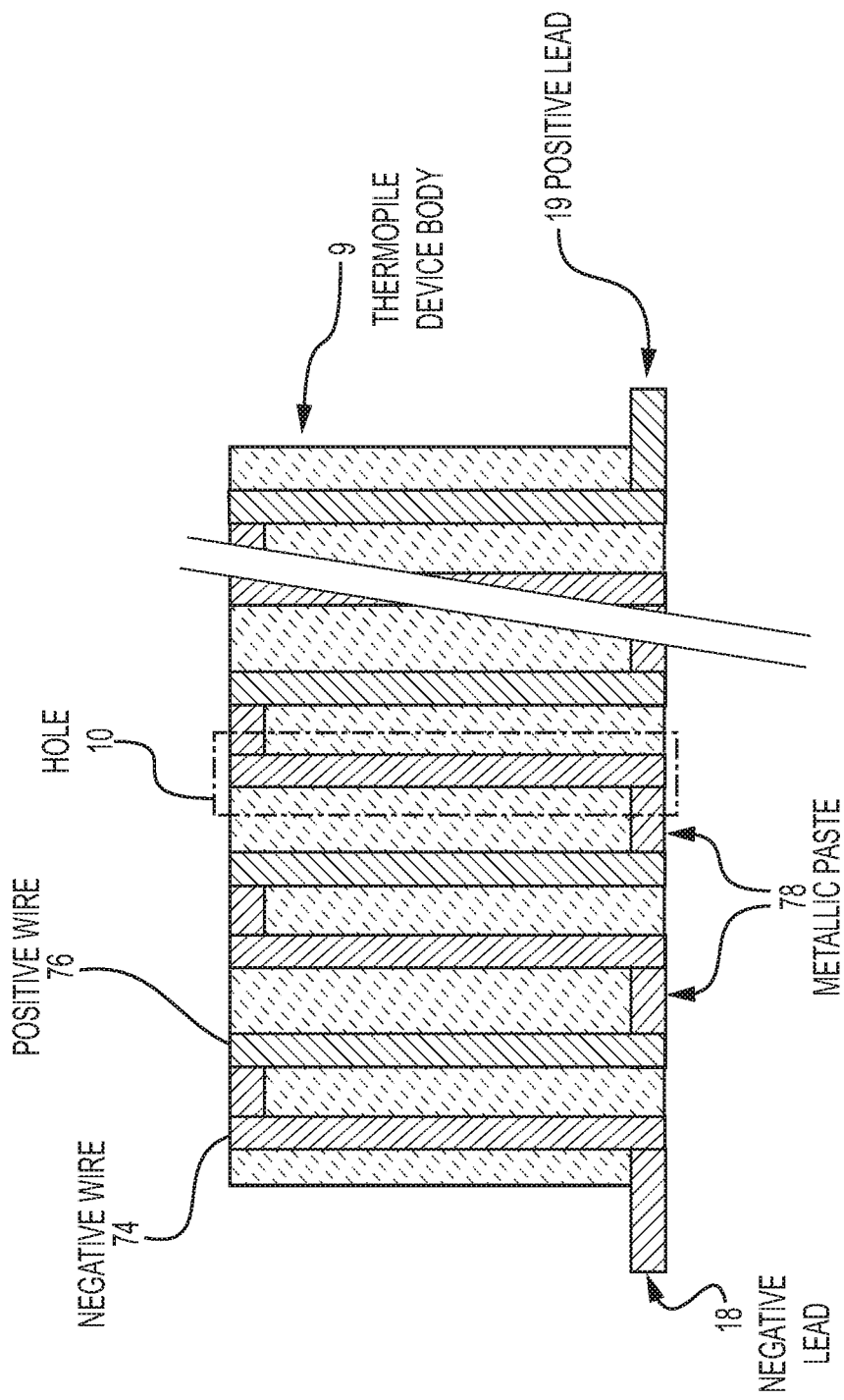
FIG. 21 shows an example of a thermocouple device, similar to FIG. 5, except that wires run through the holes in the device body instead of the powder or paste thermocouple materials.

FIG. 21 shows an example of a thermocouple device 7, similar to FIG. 5, except that wires (negative wires 74 and positive wires 76) run through the holes 10 in the middle of the device body instead of the powder or paste thermocouple materials 2, 3.

In this embodiment, segments of thermocouple wire are inserted into the cavities formed in the electrically insulative device body of the device either manually, by an automated process such as mechanical pin insertion or using a stencil such as is shown in FIG. 12. Machinery for mechanical pin insertion generally is currently by manufacturers such as Autosplice, TE Connectivity, and UMG Technologies, Inc.

The thermocouple junctions are then formed using a deposition of metal powder or metal powder, combined with a binder, in paste form (shown as metallic paste 78), such as is common in brazing processes, metal fragments, sections of wire or metal rod, into the open cross-channels (e.g., connection notches) shown in FIG. 21. These metallic powders, pastes, or metal fragments are later sintered or melted in a controlled atmosphere furnace in a vacuum, inert, or reducing atmosphere to form metallic thermocouple junctions. The thermocouple junctions connect the electrically positive and negative wires 74, 76 of the thermocouples in the cross channels. As shown on FIG. 21, metallic paste 78 or sintered metal powder may be used to seal the through-holes terminating in open cross-channels in the electrically insulative device body prior to the deposition of the wire segments. Other brazing or soldering methods not requiring controlled (e.g., vacuum, inert, or reducing) atmospheres, may also be used provided the joints these methods produce are of a sufficient electrical conductivity.

Melting, sintering, or welding of metals to form thermocouple junctions may be accomplished by use of a torch, furnace, laser, microwave system, electron beam, electric arc, or spark plasma, and may be accomplished depositing powdered metal, brazing paste (powdered metal in a binder suspension), metal fragments, or sections of wire or rod in the spaces between the ends of the legs of the thermocouple elements. As noted above, in most cases, a controlled atmosphere (reducing, inert, or vacuum) may be used to for forming thermocouple junctions.

Embodiment F

Figure 22:
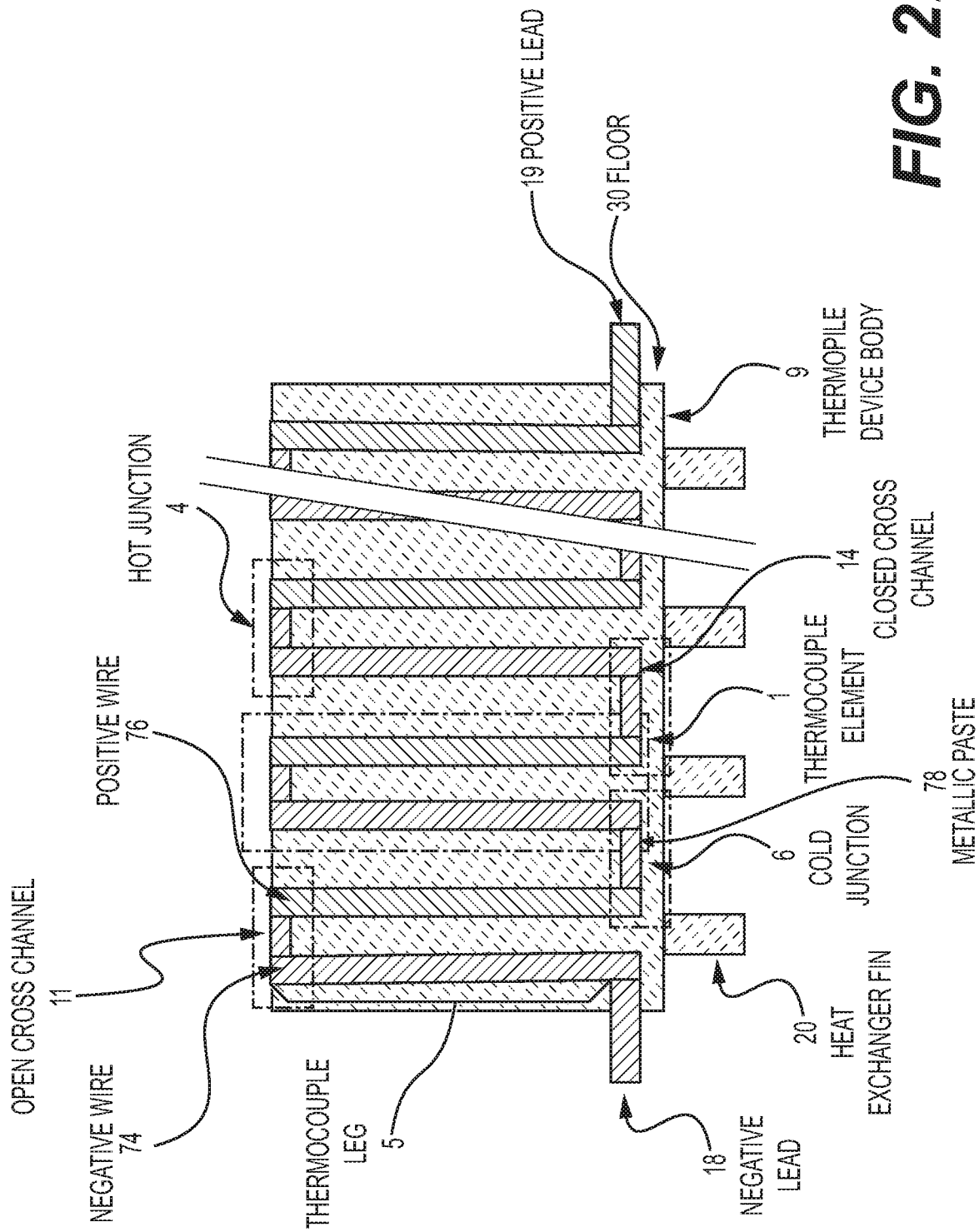
FIG. 22 shows the use of blind holes with thermocouple positive and negative wires as opposed to through-holes, similar to FIG. 1.

FIG. 22 shows the use of blind holes with thermocouple positive and negative wires 74, 76 as opposed to through holes. This Figure is similar to FIG. 1, but uses wires in the middle of the thermocouple materials.

As shown, blind holes and closed cross-channels connecting the blind holes are provided in the device body. Prior to the insertion of wires 74, 76 or rods made of thermocouple materials, a small amount of powdered metal (either the positive or negative thermocouple material or a third electrically conductive material) may be deposited in the holes in a quantity that suffices to form thermocouple junctions between the positive and negative wires 74, 76 of the thermocouples when this powdered material is later sintered or melted in a controlled atmosphere furnace (using a vacuum, inert, or reducing atmosphere). The quantity of these powder or paste deposits fill the closed cross-channels should be of a sufficient volume to avoid producing spikes in electrical resistance in the thermopile circuit. Other brazing or soldering methods not requiring controlled atmosphere may also be used, provided the joints these methods produce are electrically conductive.

Embodiment G

Figure 23:
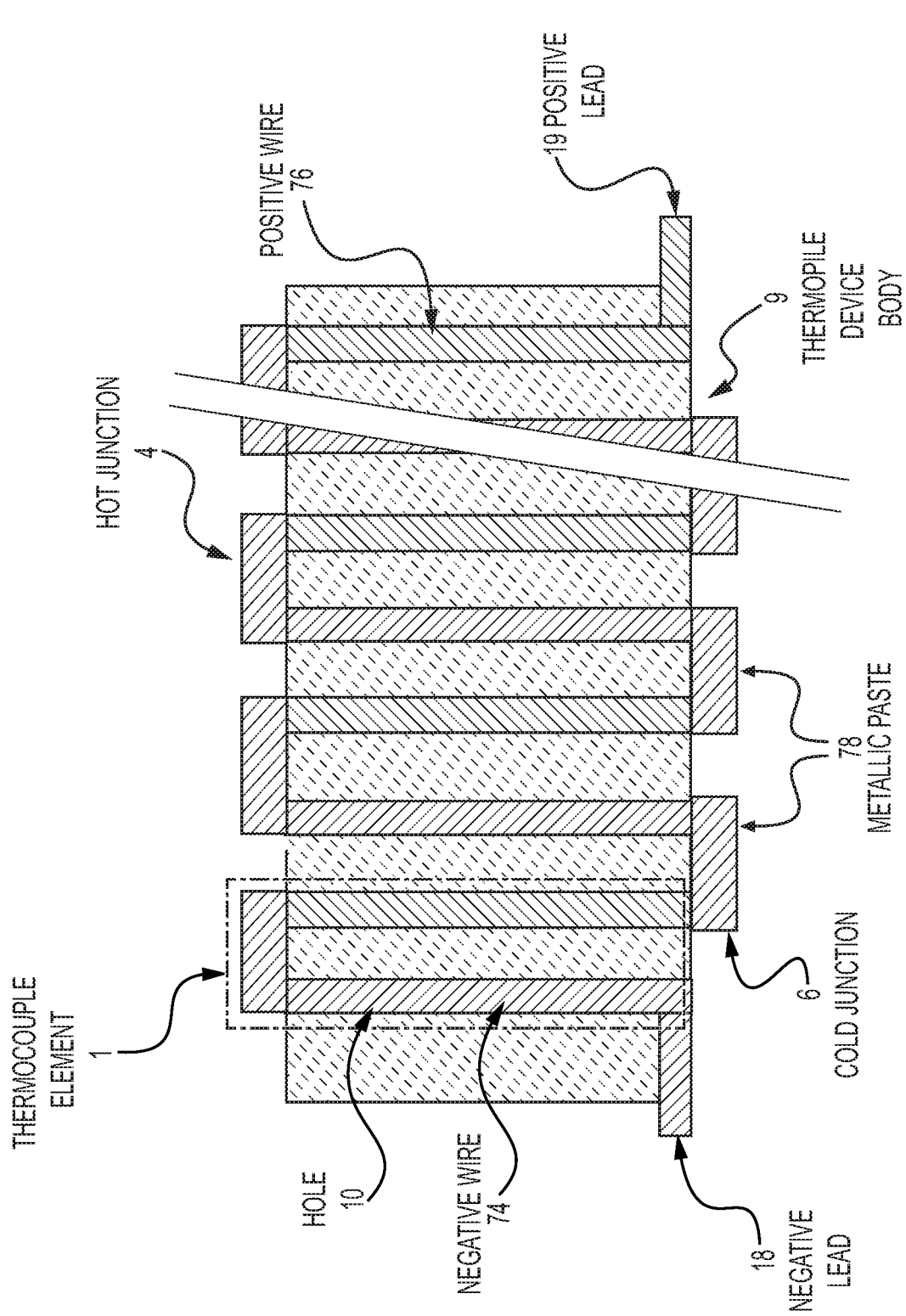
FIG. 23 shows the use of cross-channel paste raised on the outside of the device, with wires replacing thermocouple materials.

FIG. 23 shows the use of cross channel paste raised on the outside of the device, with wires 74, 76 replacing thermocouple materials 2, 3. This FIG. 23 is similar to FIG. 17, except that it uses wires 74, 76 in the place of the thermocouple materials 2,3.

In this embodiment, through-holes are formed in the device body, with no cross-channels. This embodiment provides for the deposition of brazing paste across the entire top and bottom surfaces of the electrically insulative body of the device. This brazing material is preferentially removed from these surfaces by way of machining (or, potentially, chemically, or using directed energy systems) so that, in one implementation, only the areas where the paste connects to the wires 74, 76 remain, thus electrically isolating each junction from the others on the surface of the thermopile device body 9 which is made of electrically insulative materials. This preferential removal of the brazing paste may be done before the paste is heated to form a hard metal, or after heat treatment. Alternatively, the brazing material may be stenciled onto the areas on the top and bottom surfaces of the device body and the ends of the deposited wires 74, 76 where this material will form thermocouple junctions as shown in FIG. 23.

Embodiment H

Figure 24:
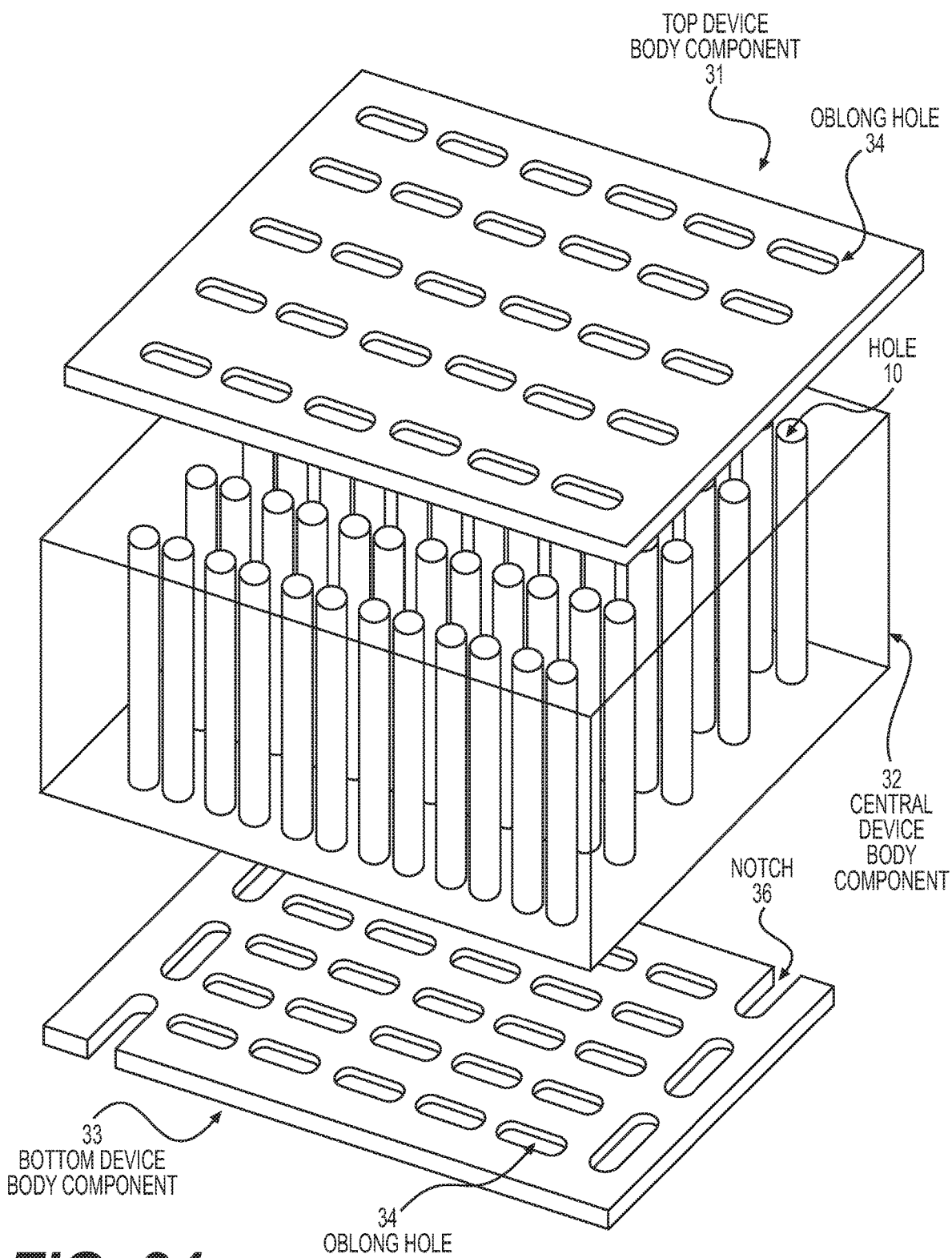
FIG. 24 shows a device body constructed having three electrically insulative components and configured to accept wires.

FIG. 24 shows a device body 9 constructed having 3 components, a top device body component 31, a central device body component 32 and a bottom device body component 33. This device body is like the device body 9 shown on FIG. 6, except the holes 10 in the central device body component 32 are round to accept wires, which are typically round, instead of rectangular as shown on FIG. 6.

Another exception is that the oblong holes 34 may be oval-shaped or rounded as opposed to rectangles as shown on FIG. 6.

Through-holes are formed in the central device body component 32 of the device body with no cross-channels. The through-holes of the top device body component 31 and the bottom device component 33 preferentially align with sets of positive and negative wire 74, 76 that have been deposited into the device body, and into which brazing paste—powdered metal in a binder suspension—is deposited and later sintered or melted. This sintered or melted metallic paste serves to both join the top device body component 31 and the bottom device body 33 component to the central device body component 32 and form both hot and cold thermocouple junctions. Oxidation-resistant materials may, alternatively, be deposited into places where they will form hot and cold thermocouple junctions, and be melted or sintered without a controlled atmosphere, provided the result is an electrically conductive bonding of the two thermocouple materials in wire form. Alternatively, the top device body component 31 and the bottom device body 33 component may be fused together with the central device body component 32 during the ceramic fabrication process.

This assembly method also allows for the preferential use of electrically insulative materials of differing thermal conductivities in different components of the assembly to enhance the thermal gradient between the hot and cold junctions which will in turn result in increased electric power output.

Embodiment I

This embodiment provides for the use of electrically insulative materials of differing thermal conductivities to enhance the thermal gradient between the hot and cold junctions which will in turn result in increased electric power output, and the use of heat exchanger fins formed in, or attached to, the electrically insulative device body which also provide an enhancement to the thermal gradient between the hot and cold junctions in the device. This is similar to as shown on FIG. 7, but the difference is wires are used instead of powder or paste thermocouple material.

Embodiment J

Figure 25:
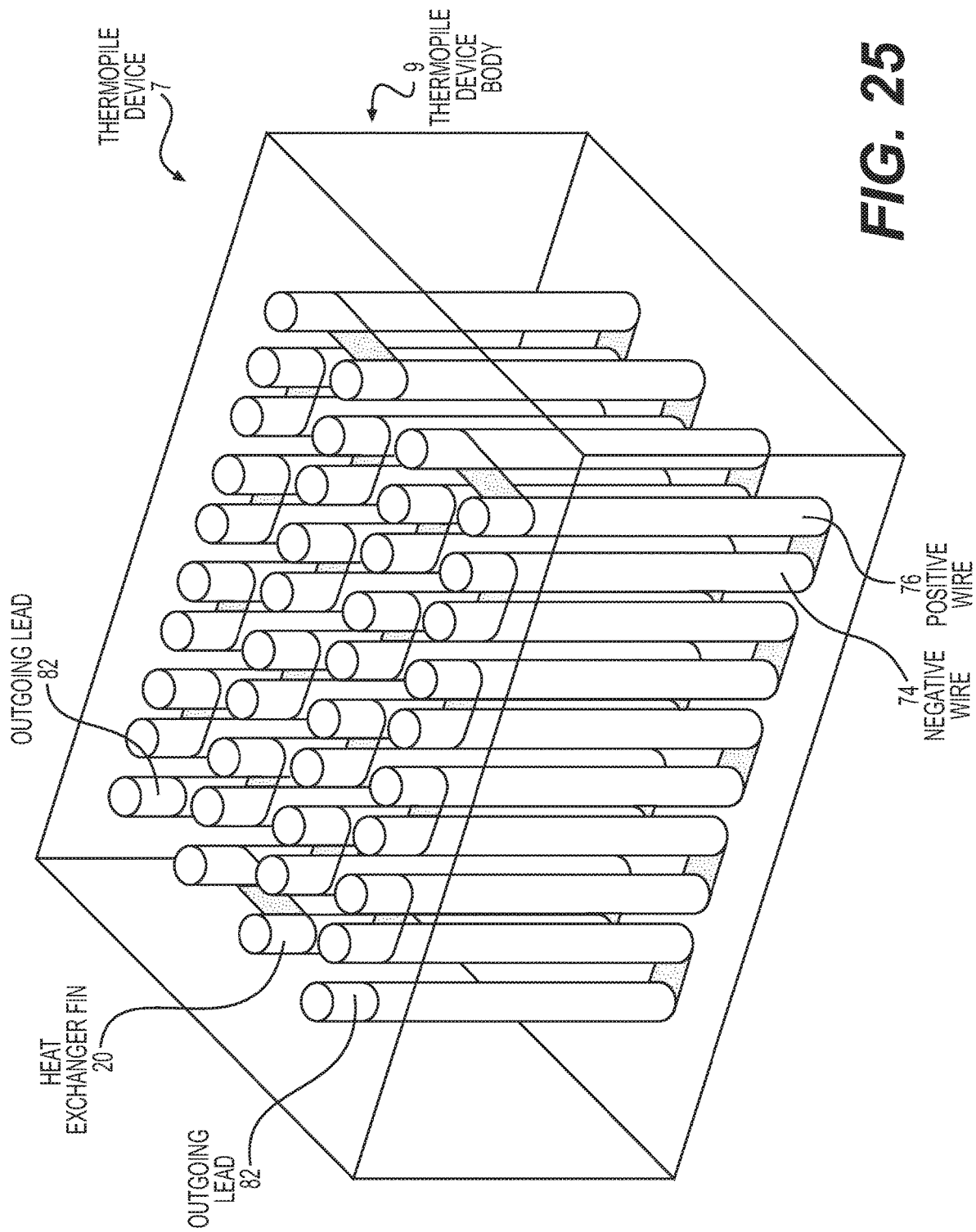
FIG. 25 discloses an embodiment that provides heat-exchanger fins in which the wires of the thermocouple elements protrude beyond the surface of the thermopile device body.

FIG. 25 discloses an embodiment that provides heat-exchanger fins 20 in which the wires of the thermocouple elements protrude beyond the surface of the thermopile device body 9 in the cold junction area of the thermopile device 7. These wires are joined near the surface of the device 7 in the open cross-channels formed in the device body 9, or on the surface of the device body, in the cold junction area of the device by brazing, welding, melting, or sintering, to form cold thermocouple junctions. The wires of the thermocouple elements, however, extend beyond these junctions, into the air or another convective heat-transfer medium, to act as heat exchanger fins 20 which transfer heat away from the thermopile device 7 in the area of the cold junctions. This enhances the thermal gradient between the hot and cold junctions, and in turn, enhances the thermoelectric output of the device. The Figure also shows outgoing leads 82.

Figure 26:
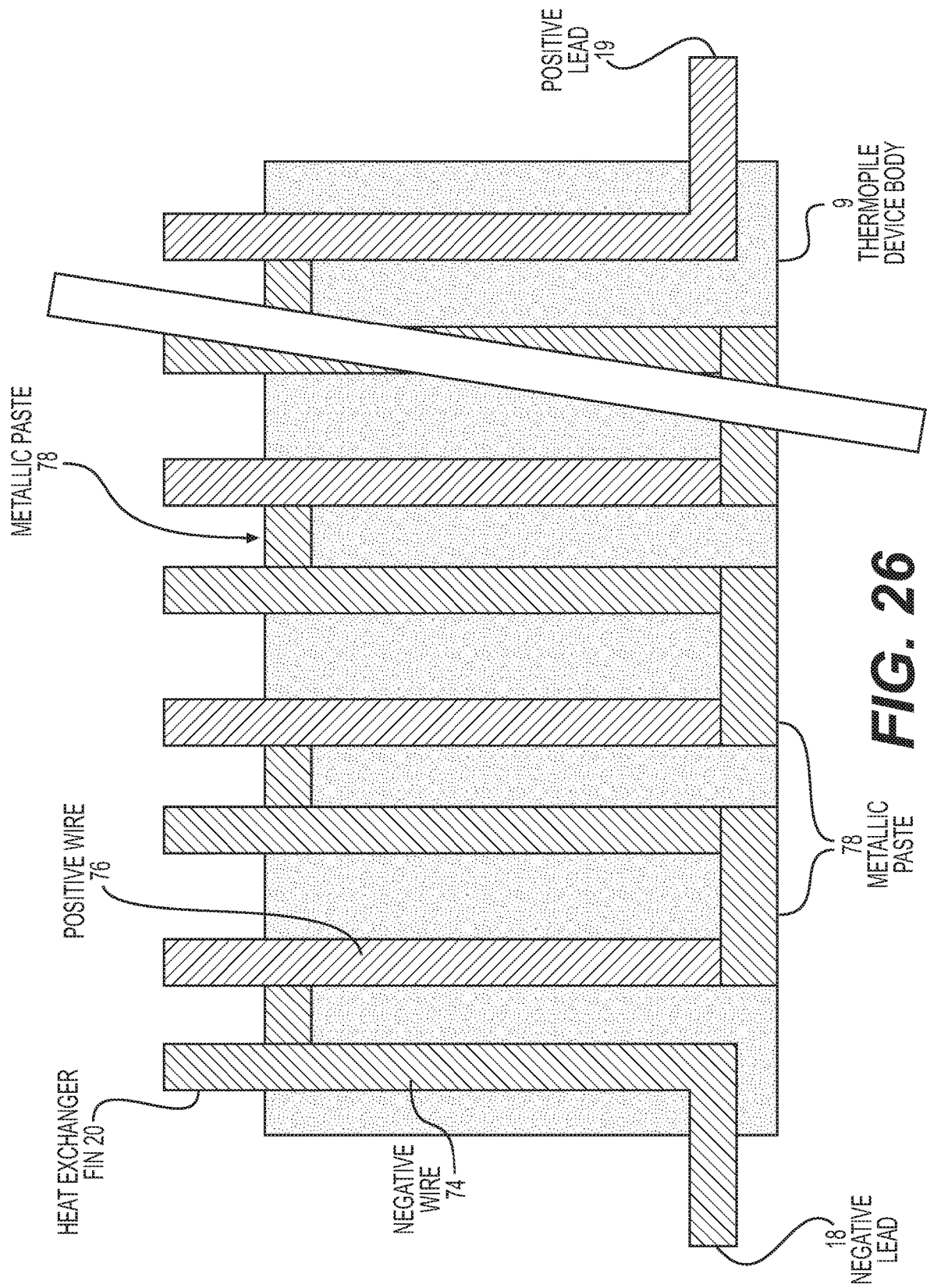
FIG. 26 shows a cross-section of the heat exchanger fin embodiment shown in FIG. 24.

FIG. 26 shows a cross section of the heat exchanger fin embodiment of Embodiment J. As shown, heat exchanger fin 20 protrudes from the top.

Embodiment K

Figure 27:
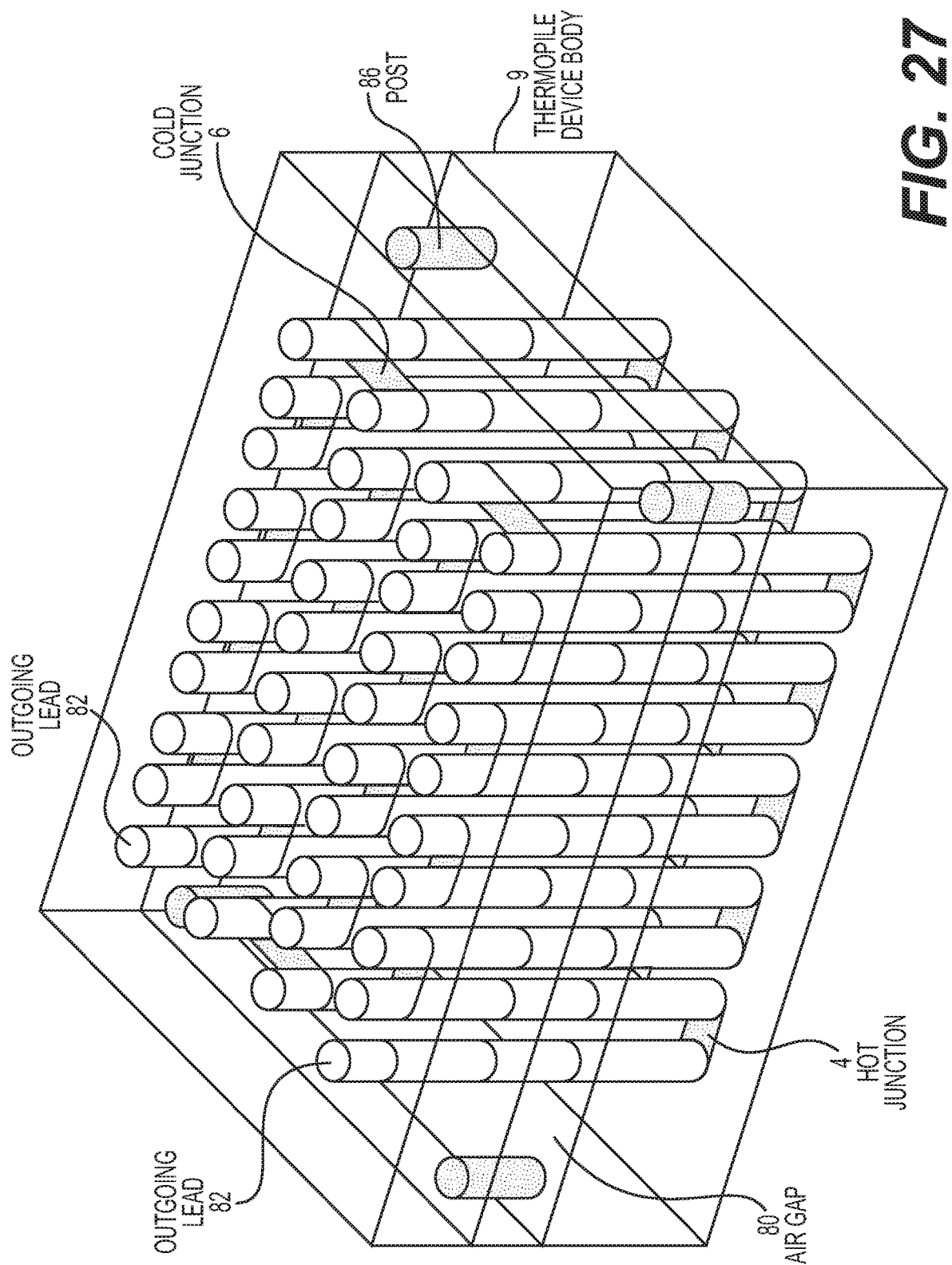
FIG. 27 discloses thermopile device body with an air gap in the middle.

FIG. 27 discloses an embodiment wherein the electrically-insulative device body 9 has an open air gap 80 in the middle of the device body, allowing convective heat transfer and promoting a cooling of the thermocouple legs between the hot and cold junctions 4, 6 thereby enhancing the thermal gradient between the hot and cold junctions, in turn enhancing the electrical output of the device.

Additionally, in this embodiment, the two electrically insulative sections of the device body may be made of materials of differing thermal conductivities to enhance the thermal gradient between the hot and cold junctions which will in turn result in increased thermoelectric power output.

In producing the electrically insulative body of the thermopile device, "additive" manufacturing (3-D printing) methods such as stereolithography, and potentially other 3-D printing methods such as binder jetting, material jetting, selective laser sintering, and powder-bed fusion, as well as other fabrication methods, can provide interior connective posts 86, as shown in FIG. 27, or stand-offs that maintain the air gap 80 in the device 7, while also holding the two sections of the device body 9 together.

It is noted that the embodiment of FIG. 27 has the extended wire heat exchanger fins, but those fins are optional. Also, this air gap embodiment does not necessarily need not be produced using 3D printing. Other methods of producing the components can be used.

Figure 28:
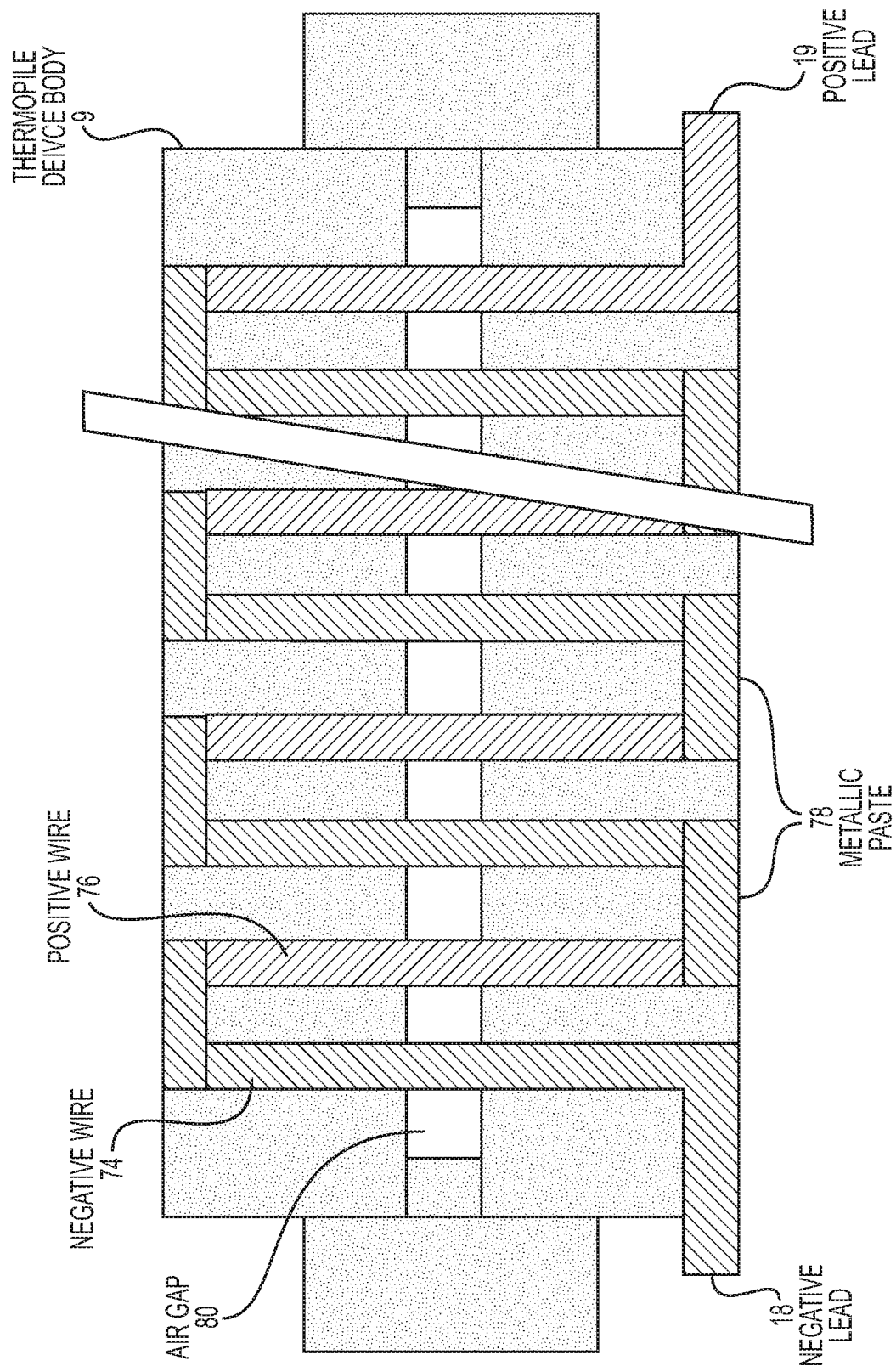
FIG. 28 shows a cross-section of the air gap embodiment shown on FIG. 26.

FIG. 28 shows a cross section of the air gap embodiment K shown on FIG. 27. Heat exchanger fins 20 on the exterior of the electrically insulative device body 9 can be formed or attached, providing a heat-exchanger function, and a mechanical connection the sections of the device on either side of the air gap 80. Mechanical provisions such as bolts or metal belts can alternatively or additionally be provided to maintain the air-gap dimensions and hold the disparate sections of the device body together.

Figure 29:
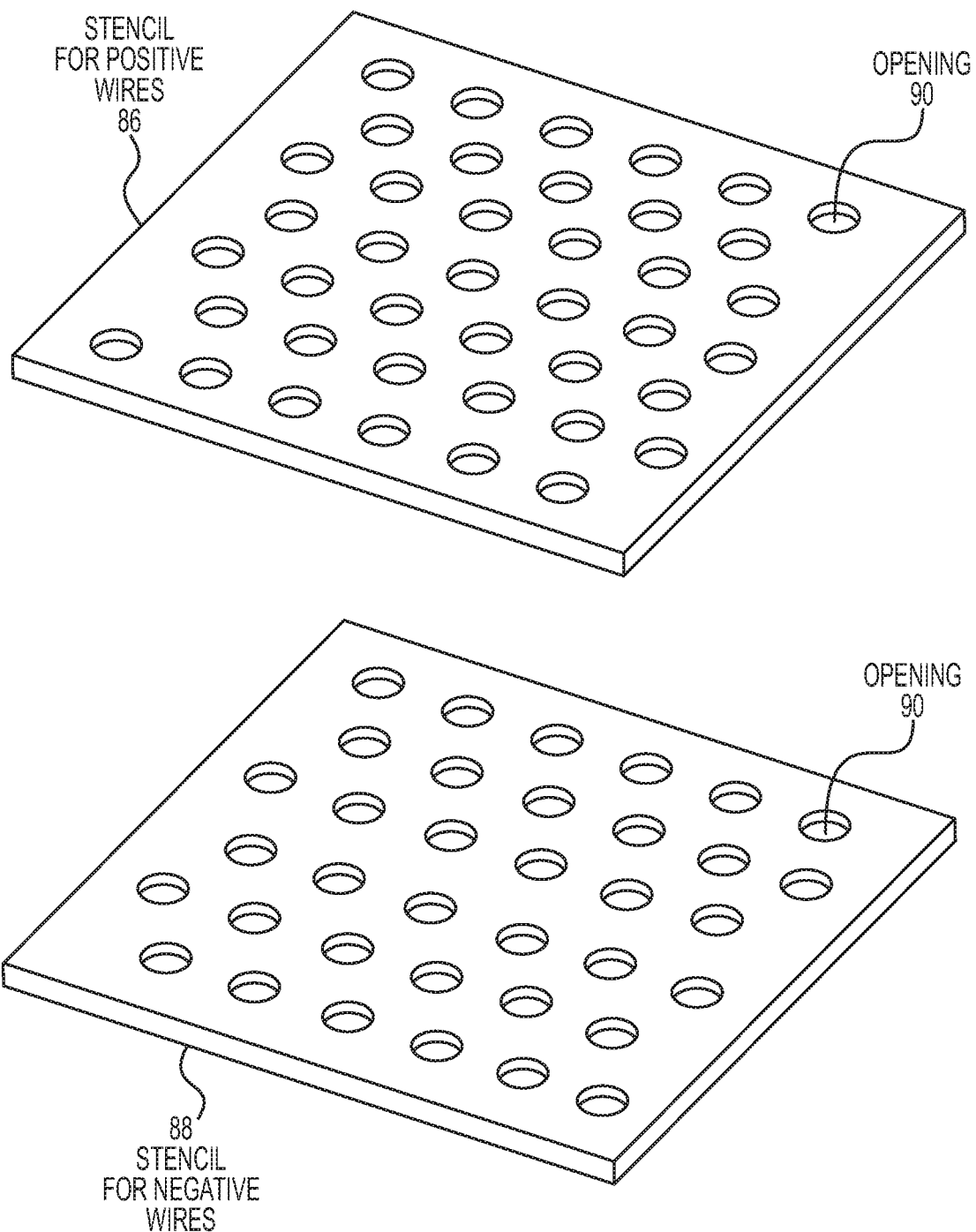
FIG. 29 discloses stencils which are used to guide insertion of the positive and negative wires into the proper holes of the thermocouple device body.

FIG. 29 discloses stencils, analogous to the stencils in FIG. 15, which are used to guide insertion of the positive and negative wires 74, 76 into the proper holes of the thermocouple device body 9 by either manually or mechanically. The figure shows a stencil 86 for positive wires, and a stencil 88 for negative wires. The stencils 86, 88 have openings 90. These stencils 86, 88 may be an alternative to an automated or manual thermocouple wire "pin insertion" process referenced above.

Figure 30:
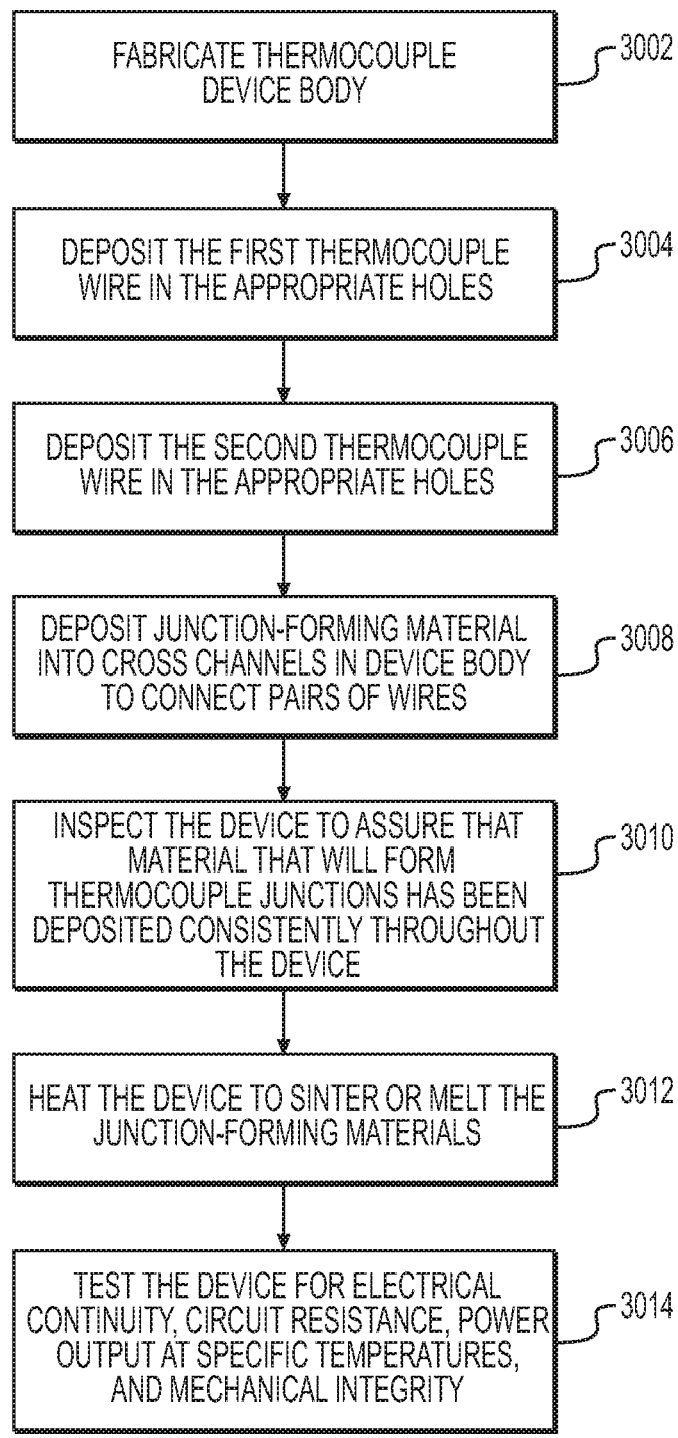
FIG. 30 shows a flowchart for a process of manufacturing the thermopile device with positive and negative wires in one embodiment.

FIG. 30 shows a flowchart for a process of manufacturing the thermopile device 7 with positive and negative wires 74, 76 in one embodiment. The first step in the manufacturing procedure is to fabricate the thermopile device body 9 which is a block such as the one shown in FIG. 21 that is made of ceramic or other electrically-insulative material (step 3002).

In the thermocouple-material deposition procedure, the first negative or positive wires 74, 76 are deposited in the appropriate holes 10 (step 3004). Next, the second negative or positive wires 74, 76 are deposited into the appropriate thermocouple leg channels (step 3006). Junction-forming electrically conductive material may be deposited in the cross-channels of the device body to connect pairs of wires to form thermocouple elements (step 3008). Alternatively, a third material, such as standard brazing materials, or materials which may be high in thermal conductivity such as copper or silver, may be deposited in the cross-channels while maintaining, in accordance with the Law of Intermediate Materials, the thermoelectric effect. Such a third material may be included in the formation of either the hot or cold thermocouple junctions 4, 6 or both. The open ends of the cavities may be sealed with metallic paste 78 comprised of thermocouple materials or a third electrically conductive material, or a sealer that will burn off.

Next, the device is inspected to assure that material that will form the thermocouple junctions has been deposited consistently throughout the device (step 3010).

Then, the device is place into a controlled atmosphere furnace at a temperature appropriate to sintering (or melting, as required) the junction-forming materials (step 3012).

The next step in the manufacturing procedure is a series of acceptance tests to assure electrical continuity throughout the device, proper circuit resistance, proper power output at specific temperatures, and overall mechanical integrity (step 3014).

The foregoing description of various embodiments provides illustration and description, but is not intended to be exhaustive or to limit the invention to the precise form disclosed. Modifications and variations are possible in light of the above teachings or may be acquired from practice. It is to be understood that the invention is intended to cover various modifications and equivalent arrangements included within the spirit and scope of the appended claims.

What is claimed is:

1. A thermopile including a series of thermocouples having wires, comprising:
    an electrically positive pre-formed metallic wire;
    an electrically negative pre-formed metallic wire;
    a heat-resistant, electrically-insulative container, comprising:
        a first hole configured to receive the electrically-positive pre-formed metallic wire;
        a second hole configured to receive the electrically-negative pre-formed metallic wire that connects to the electrically-positive wire in the first hole; and
        a cross-channel that connects the first hole to the second hole and includes a hot junction between the electrically-positive pre-formed metallic wire in the first hole and the electrically-negative pre-formed metallic wire in the second hole, wherein the cross-channel is configured to receive an electrically-conductive material in order to form the hot junction.

2. The thermopile of claim 1, wherein the heat-resistant, electrically-insulative container is made of ceramic or glass.

3. The thermopile of claim 1, wherein the heat-resistant, electrically-insulative container is heat resistant above 500 degrees C. for melting or sintering the electrically-conductive material.

4. The thermopile of claim 1, wherein the cross-channel is an open cross-channel.

5. The thermopile of claim 4, wherein the second hole is connected by a closed cross-channel to:
    a third hole configured to receive a second electrically-positive wire, which is connected by a second closed cross-channel to:
    a fourth hole configured to receive a second electrically-negative wire parallel to the third hole, thereby creating two thermocouple elements when electrically-positive and electrically-negative wire is deposited and heated in the first, second, third and fourth holes.

6. The thermopile of claim 1, wherein the electrically-conductive material is one of: iron, copper, nickel-chromium alloys, nickel-aluminum alloys, CONSTANTAN alloys, NICHROME alloys, MONEL alloys, and nickel.

7. A thermopile for withstanding high heat having wires, comprising:
    an electrically positive pre-formed metallic wire;
    an electrically negative pre-formed metallic wire;
    a heat-resistant, electrically-insulative container comprising:
        a plurality of rows of holes configured to receive the electrically-positive pre-formed metallic wires and electrically-negative pre-formed metallic wires;
        each row of holes comprising a plurality of pairs of holes, and connected by a cross-channel to one or more other rows of holes, the cross channel configured to receive an electrically-conductive material;
        each pair of holes connected to one or more other pair of holes in the same row by a cross-channel; and
        each hole in the pair of holes connected to each other with a cross-channel, wherein the electrically-positive pre-formed metallic wires and electrically-negative pre-formed metallic wires form thermocouple elements in the holes, the cross channels form hot junctions and cold junctions of the thermocouple elements, the cross channels are configured to receive the electrically-conductive material to form the hot junctions and cold junctions, and the thermocouple elements are electrically-serially connected throughout the heat-resistant, electrically-insulative container to form the thermopile.

8. The thermopile of claim 7, wherein the heat-resistant, electrically-insulative container is made of ceramic or glass.

9. The thermopile of claim 7, wherein the heat-resistant, electrically-insulative container has external fins configured to reduce heat.

10. The thermopile of claim 7, wherein the electrically-conductive material is one of: iron, copper, nickel-chromium alloys, nickel-aluminum alloys, NICHROME alloys, MONEL alloys, and nickel.

11. The thermopile of claim 7, wherein the heat-resistant, electrically-insulative container is heated above 500 degrees C. to sinter or melt the electrically-conductive material in the cross-channel.

12. The thermopile of claim 11, wherein the heat-resistant, electrically-insulative container is configured to be heated up to 1500 degrees C. to sinter or melt the electrically-conductive material in the cross-channel.

13. The thermopile of claim 7, wherein the electrically-positive wires and the electrically-negative wires are deposited with the assistance of a stencil.

14. The thermopile of claim 7, further comprising a negative lead and a positive lead each at an end of the electrically-serially connected thermocouple elements.

15. A method of creating a heat-resistant thermopile having wires, comprising:
    inserting electrically-positive pre-formed metallic wires into a first set of holes in a heat-resistant, electrically-insulative container that contains cross-channels to a second set of holes parallel to the first set of holes, with the assistance of a stencil or pin assertion device;
    inserting electrically-negative pre-formed metallic wires into the second set of holes in the heat resistant, electrically-insulative container, with the assistance of a stencil or pin assertion device;
    depositing an electrically-conductive material in the cross channels; and
    heating the heat-resistant, electrically-insulative container to sinter or melt the electrically-conductive material, wherein the cross-channels form hot junctions and cold junctions of thermocouple elements created by the electrically-positive pre-formed wires and the electrically-negative pre-formed wires.

16. The method of claim 15, wherein the electrically conductive material is powder or paste when deposited in the cross channels.

17. The method of claim 15, further comprising heating the heat-resistant, electrically-insulative container and the electrically-conductive material to over 500 degrees C. to create the heat-resistant thermopile.

18. The method of claim 15 further comprising heating the electrically-insulated container up to 1500 degrees C. to sinter or melt the electrically-conductive material in the cross-channel.

19. The method of claim 15 further comprising placing external fins on the electrically-insulative container to reduce heat.

20. The method of claim 15 further comprising placing a negative lead and a positive lead each at an end of the electrically-serially connected thermocouple elements.

* * * * *